(12) United States Patent
Huang et al.

(10) Patent No.: US 11,329,007 B2
(45) Date of Patent: May 10, 2022

(54) WIRING STRUCTURE AND METHOD FOR MANUFACTURING THE SAME

(71) Applicant: Advanced Semiconductor Engineering, Inc., Kaohsiung (TW)

(72) Inventors: Wen Hung Huang, Kaohsiung (TW); Yan Wen Chung, Kaohsiung (TW); Huei-Shyong Cho, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/996,872

(22) Filed: Aug. 18, 2020

(65) Prior Publication Data

US 2020/0381369 A1 Dec. 3, 2020

Related U.S. Application Data

(63) Continuation of application No. 16/289,072, filed on Feb. 28, 2019, now Pat. No. 10,790,241.

(51) Int. Cl.
*H05K 1/11* (2006.01)
*H05K 3/42* (2006.01)
(Continued)

(52) U.S. Cl.
CPC .......... *H01L 23/562* (2013.01); *H01L 21/486* (2013.01); *H01L 21/4857* (2013.01); *H01L 21/6835* (2013.01); *H01L 22/14* (2013.01); *H01L 23/49822* (2013.01); *H01L 23/49827* (2013.01); *H01L 23/49838* (2013.01); *H01L 23/552* (2013.01); *H01L 23/66* (2013.01); *H01L 24/16* (2013.01); *H01L 25/16* (2013.01);
(Continued)

(58) Field of Classification Search
CPC ............ H01L 23/562; H01L 23/49822; H01L 23/49827; H01L 23/49838; H01L 23/552; H01L 23/66; H01L 21/4857; H01L 21/486; H01L 21/6835; H01L 22/14; H01L 24/16; H01L 25/16; H01L 2221/68345; H01L 2221/68359; H01L 2223/6616; H01L 2224/16227; H01L 2924/19105; H01L 2924/3511; H05K 3/42–429; H05K 1/112–115; H05K 2201/096
See application file for complete search history.

(56) References Cited

U.S. PATENT DOCUMENTS 6,184,577 B1  2/2001  Takemura et al.
6,207,904 B1  3/2001  Kramer et al.
(Continued)

OTHER PUBLICATIONS

Final Office Action for U.S. Appl. No. 16/289,156, dated Jul. 23, 2021, 29 pages.
(Continued)

*Primary Examiner* — Hoa C Nguyen
(74) *Attorney, Agent, or Firm* — Foley & Lardner LLP

(57) ABSTRACT

A wiring structure includes a conductive structure, a surface structure and at least one through via. The conductive structure includes at least one dielectric layer and at least one circuit layer in contact with the dielectric layer. The surface structure is disposed adjacent to a top surface of the conductive structure. The through via extends through the surface structure and extending into at least a portion of the conductive structure.

17 Claims, 47 Drawing Sheets

(51) Int. Cl.
   *H01L 23/00* (2006.01)
   *H01L 23/498* (2006.01)
   *H01L 23/552* (2006.01)
   *H01L 21/48* (2006.01)
   *H01L 21/66* (2006.01)
   *H01L 21/683* (2006.01)
   *H01L 23/66* (2006.01)
   *H01L 25/16* (2006.01)

(52) U.S. Cl.
   CPC ........... *H01L 2221/68345* (2013.01); *H01L 2221/68359* (2013.01); *H01L 2223/6616* (2013.01); *H01L 2224/16227* (2013.01); *H01L 2924/19105* (2013.01); *H01L 2924/3511* (2013.01)

(56) References Cited

U.S. PATENT DOCUMENTS

| | | | |
|---|---|---|---|
| 6,237,218 B1 * | 5/2001 | Ogawa | H05K 3/4638 174/254 |
| 6,316,738 B1 | 11/2001 | Mori et al. | |
| 6,340,796 B1 | 1/2002 | Smith et al. | |
| 6,426,470 B1 | 7/2002 | Farquhar et al. | |
| 6,703,564 B2 | 3/2004 | Mori | |
| 6,809,268 B2 | 10/2004 | Hayashi et al. | |
| 6,928,726 B2 | 8/2005 | Zollo et al. | |
| 7,060,595 B2 | 6/2006 | Ou et al. | |
| 7,119,319 B2 | 10/2006 | Noto et al. | |
| 7,312,405 B2 | 12/2007 | Hsu | |
| 7,514,770 B2 | 4/2009 | Chang et al. | |
| 7,730,613 B2 | 6/2010 | Vasoya | |
| 7,888,784 B2 | 2/2011 | Gurumurthy et al. | |
| 8,288,875 B2 | 10/2012 | Shimizu et al. | |
| 8,440,916 B2 | 5/2013 | Li et al. | |
| 8,804,361 B2 | 8/2014 | Machida et al. | |
| 8,941,015 B2 | 1/2015 | Hsu et al. | |
| 9,155,191 B2 | 10/2015 | Kim | |
| 9,603,248 B2 | 3/2017 | Hisada et al. | |
| 9,648,735 B2 | 5/2017 | Mahler et al. | |
| 9,743,526 B1 | 8/2017 | Blackshear et al. | |
| 9,822,226 B2 | 11/2017 | Chujo et al. | |
| 10,440,818 B1 | 10/2019 | Chan | |
| 10,888,001 B2 | 1/2021 | Lin et al. | |
| 10,952,320 B2 | 3/2021 | Watanabe et al. | |
| 10,998,247 B2 | 5/2021 | Cho et al. | |
| 2002/0180015 A1 | 12/2002 | Yamaguchi et al. | |
| 2004/0195669 A1 | 10/2004 | Wilkins et al. | |
| 2005/0112798 A1 * | 5/2005 | Bjorbell | H01L 24/82 438/106 |
| 2005/0218502 A1 | 10/2005 | Sunohara et al. | |
| 2005/0230711 A1 | 10/2005 | Chang et al. | |
| 2006/0272853 A1 | 12/2006 | Muramatsu et al. | |
| 2006/0289202 A1 | 12/2006 | Takeuchi et al. | |
| 2007/0119541 A1 * | 5/2007 | Kawabata | H05K 3/0058 156/307.7 |
| 2007/0120248 A1 * | 5/2007 | Yoshimura | H05K 3/4638 257/698 |
| 2007/0230146 A1 | 10/2007 | Suzuki et al. | |
| 2009/0090465 A1 | 4/2009 | Vasoya | |
| 2010/0276192 A1 | 11/2010 | Pai et al. | |
| 2011/0114372 A1 | 5/2011 | Kato et al. | |
| 2012/0295403 A1 | 11/2012 | Wang et al. | |
| 2013/0149514 A1 | 6/2013 | Hayashi | |
| 2013/0215586 A1 * | 8/2013 | Furusawa | H01L 23/49827 361/767 |
| 2014/0014399 A1 | 1/2014 | Kariya et al. | |
| 2014/0020940 A1 | 1/2014 | Mano et al. | |
| 2014/0225701 A1 | 8/2014 | Morita et al. | |
| 2014/0301058 A1 | 10/2014 | Sunohara et al. | |
| 2015/0179476 A1 | 6/2015 | Tseng et al. | |
| 2015/0279772 A1 | 10/2015 | Inagaki et al. | |
| 2016/0113120 A1 * | 4/2016 | Ishihara | H05K 3/4682 174/262 |
| 2016/0133562 A1 | 5/2016 | Lee et al. | |
| 2016/0172287 A1 | 6/2016 | Arisaka et al. | |
| 2017/0125376 A1 | 5/2017 | Yeh et al. | |
| 2017/0164458 A1 | 6/2017 | Vrtis et al. | |
| 2019/0215958 A1 | 7/2019 | Ishihara et al. | |
| 2019/0380210 A1 * | 12/2019 | Lin | H01L 24/17 |
| 2020/0243602 A1 | 7/2020 | Jiang et al. | |

OTHER PUBLICATIONS

Non-Final Office Action for U.S. Appl. No. 16/289,067, dated Apr. 22, 2021, 20 pages.
Non-Final Office Action for U.S. Appl. No. 16/289,067, dated Dec. 9, 2020, 9 pages.
Non-Final Office Action for U.S. Appl. No. 16/289,156, dated Feb. 22, 2021, 25 pages.
Non-Final Office Action for U.S. Appl. No. 16/289,072, dated Feb. 6, 2020, 15 pages.
Notice of Allowance for U.S. Appl. No. 16/289,072, dated May 13, 2020, 8 pages.
Final Office Action for U.S. Appl. No. 16/289,067, dated Sep. 10, 2021, 22 pages.

* cited by examiner

WIRING STRUCTURE AND METHOD FOR MANUFACTURING THE SAME

CROSS-REFERENCE TO RELATED APPLICATION

This application is a continuation of U.S. patent application Ser. No. 16/289,072 filed Feb. 28, 2019, the contents of which is incorporated herein by reference in its entirety.

BACKGROUND

1. Field of the Disclosure

The present disclosure relates to a wiring structure and a manufacturing method, and to a wiring structure including at least two conductive structures attached or bonded together by an intermediate layer, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a wiring structure includes: (a) a conductive structure including at least one dielectric layer and at least one circuit layer in contact with the dielectric layer; (b) a surface structure disposed adjacent to a top surface of the conductive structure; and (c) at least one through via extending through the surface structure and extending into at least a portion of the conductive structure.

In some embodiments, a wiring structure includes: (a) a low-density stacked structure including at least one dielectric layer and at least one low-density circuit layer in contact with the dielectric layer; (b) a high-density stacked structure disposed on the low-density stacked structure, wherein the high-density stacked structure includes at least one dielectric layer and at least one high-density circuit layer in contact with the dielectric layer of the high-density stacked structure; (c) a surface structure disposed on a top surface of the high-density stacked structure; and (d) at least one upper through via extending through the surface structure and the high-density stacked structure, and terminating on the low-density circuit layer of the low-density stacked structure.

In some embodiments, a method for manufacturing a wiring structure includes: (a) providing a lower conductive structure including at least one dielectric layer and at least one circuit layer in contact with the dielectric layer; (b) providing an upper conductive structure including at least one dielectric layer and at least one circuit layer in contact with the dielectric layer of the upper conductive structure; (c) attaching the upper conductive structure to the lower conductive structure; (d) forming a surface structure on a top surface of the upper conductive structure; and (e) forming at least one upper via extending through the surface structure and into at least a portion of the upper conductive structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
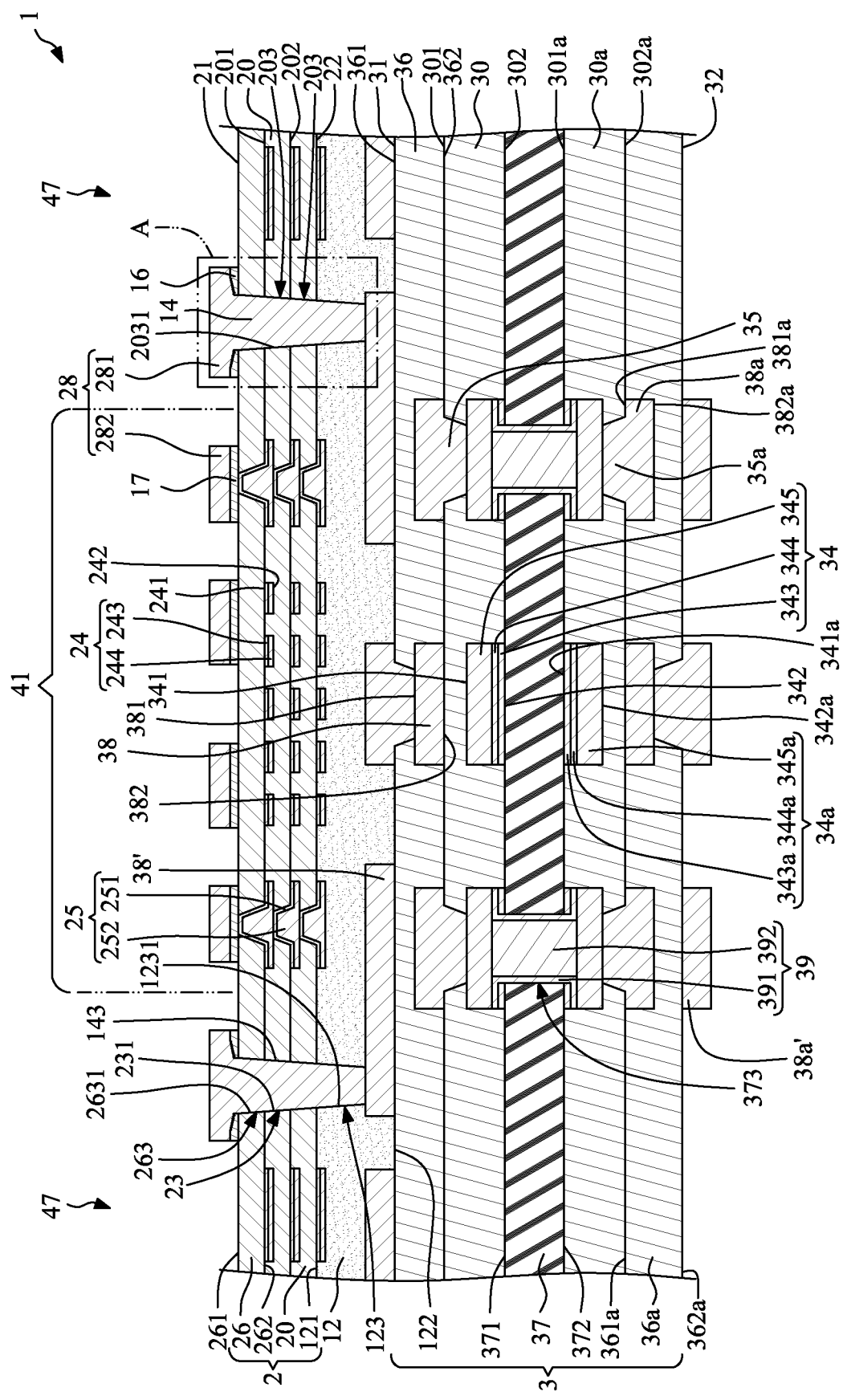
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}=28.24\%$. In addition, warpage of the twelve layers of circuit layers and dielectric layers may be accumulated, and, thus, the top several layers may have severe warpage. As a result, the yield of such core substrate may be further reduced.

To address the above concerns, in some comparative embodiments, a coreless substrate is provided. The coreless substrate may include a plurality of dielectric layers and a plurality of fan-out circuit layers. In some embodiments, a manufacturing process of a coreless substrate may include the following stages. Firstly, a carrier is provided. Then, a plurality of dielectric layers and a plurality of fan-out circuit layers are formed or stacked on a surface of the carrier. One fan-out circuit layer may be embedded in one corresponding dielectric layer. Then, the carrier is removed. Therefore, the coreless substrate may include a plurality of stacked dielectric layers and a plurality of fan-out circuit layers embedded in the dielectric layers. Since a line width/line space (L/S) of the fan-out circuit layers of such coreless substrate may be less than or equal to 2 μm/2 the number of the dielectric layers of such coreless substrate can be reduced. Further, the manufacturing yield for the fan-out circuit layers and the dielectric layers of such coreless substrate is high. For example, the manufacturing yield for one layer (including one fan-out circuit layer and one dielectric layer) of such coreless substrate may be 99%. However, the manufacturing cost of such coreless substrate is relatively high.

At least some embodiments of the present disclosure provide for a wiring structure which has an advantageous compromise of yield and manufacturing cost. In some embodiments, the wiring structure includes an upper conductive structure and a lower conductive structure bonded to the upper conductive structure through an intermediate layer. At least some embodiments of the present disclosure further provide for techniques for manufacturing the wiring structure.

Figure 2:
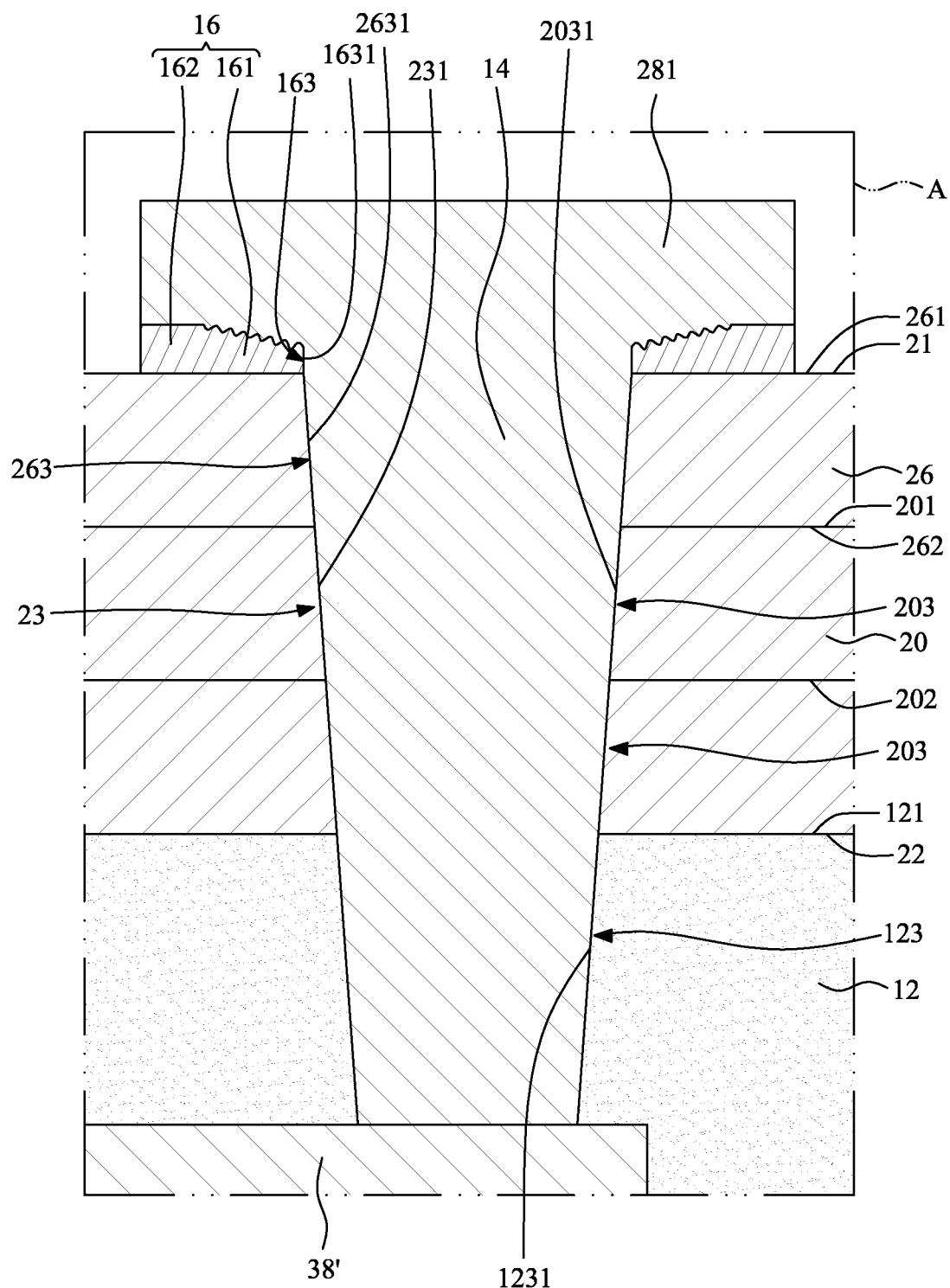
FIG. 2 illustrates a partially enlarged view of a region "A" in FIG. 1.

FIG. 1 illustrates a cross-sectional view of a wiring structure 1 according to some embodiments of the present disclosure. FIG. 2 illustrates a partially enlarged view of a region "A" in FIG. 1. The wiring structure 1 includes an upper conductive structure 2, a surface structure 16 and at least one upper through via 14. In some embodiments, the wiring structure 1 further includes an outer circuit layer 28, an intermediate layer 12 and a lower conductive structure 3.

The upper conductive structure 2 includes at least one dielectric layer (including, for example, two first dielectric layers 20 and a second dielectric layer 26) and at least one circuit layer (including, for example, three circuit layers 24 formed of a metal, a metal alloy, or other conductive material) in contact with the dielectric layer (e.g., the first dielectric layers 20 and the second dielectric layer 26). In some embodiments, the upper conductive structure 2 may be similar to a coreless substrate, and may be in a wafer type, a panel type or a strip type. The upper conductive structure 2 may be also referred to as "a stacked structure" or "a high-density conductive structure" or "a high-density stacked structure". The circuit layer (including, for example, the three circuit layers 24) of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21 and a bottom surface 22 opposite to the top surface 21, and defines at least one single, continuous through hole 23. As shown in FIG. 1, the upper conductive structure 2 includes a plurality of dielectric layers (e.g., the two first dielectric layers 20 and the second dielectric layer 26), a plurality of circuit layers (e.g., the three circuit layers 24) and at least one inner via 25. The dielectric layers (e.g., the first dielectric layers 20 and the second dielectric layer 26) are stacked on one another. For example, the second dielectric layer 26 is disposed on the first dielectric layers 20, and, thus, the second dielectric layer 26 is the topmost dielectric layer. In some embodiments, a material of the dielectric layers (e.g., the first dielectric layers 20 and the second dielectric layer 26) is transparent, and can be seen through or detected by human eyes or machine. That is, a mark disposed adjacent to the bottom surface 22 of the upper conductive structure 2 can be recognized or detected from the top surface 21 of the upper conductive structure 2 by human eyes or machine. In some embodiments, a transparent material of the dielectric layers has a light transmission for a wavelength in the visible range (or other pertinent wavelength for detection of a mark) of at least about 60%, at least about 70%, or at least about 80%.

In addition, each of the first dielectric layers 20 has a top surface 201 and a bottom surface 202 opposite to the top surface 201, and defines a through hole 203 having an inner surface 2031. The second dielectric layer 26 has a top surface 261 and a bottom surface 262 opposite to the top surface 261, and defines a through hole 263 having an inner surface 2631. The bottom surface 262 of the second dielectric layer 26 is disposed on and contacts the top surface 201 of the adjacent first dielectric layer 20. Thus, the top surface 21 of the upper conductive structure 2 is the top surface 261 of the second dielectric layer 26, and the bottom surface 22 of the upper conductive structure 2 is the bottom surface 202 of the bottommost first dielectric layer 20.

As shown in FIG. 1, each of the through holes 203 of the first dielectric layers 20 tapers downwardly along a direction from the top surface 21 towards the bottom surface 22 of the upper conductive structure 2; that is, a size of a top portion of the through hole 203 is greater than a size of a bottom portion of the through hole 203. The through hole 263 of the second dielectric layer 26 also tapers downwardly; that is, a size of a top portion of the through hole 263 is greater than a size of a bottom portion of the through hole 263. Further, the through hole 263 of the second dielectric layer 26 is aligned with and in communication with the through holes 203 of the first dielectric layers 20. The bottom portion of the through hole 263 of the second dielectric layer 26 is disposed adjacent to or connected to the top portion of the through hole 203 of the first dielectric layer 20 under the second dielectric layer 26. The size of the bottom portion of the through hole 263 of the second dielectric layer 26 is substantially equal to the size of the top portion of the through hole 203 of the first dielectric layer 20 under the second dielectric layer 26. Thus, the inner surface 2631 of the through hole 263 of the second dielectric layer 26 is coplanar with or aligned with the inner surfaces 2031 of the through holes 203 of the first dielectric layers 20. It is noted that the above-mentioned "coplanar" surfaces need not be flat. In some embodiments, the inner surface 2631 of the through hole 263 of the second dielectric layer 26 and the inner surfaces 2031 of the through holes 203 of the first dielectric layers 20 are curved surfaces, and are portions of an inner surface 231 of the single, continuous through hole 23 for accommodating the upper through via 14. The through hole 263 of the second dielectric layer 26 and the through holes 203 of the first dielectric layers 20 are collectively configured to form or define a portion of the single through hole 23. As shown in FIG. 1, cross-sectional views of one side of the inner surface 2631 of the through hole 263 of the second dielectric layer 26 and the inner surfaces 2031 of the through holes 203 of the first dielectric layers 20 are segments of a substantially straight line. That is, cross-sectional views of one side of the inner surface 2631 of the through hole 263 of the second dielectric layer 26 and the inner surfaces 2031 of the through holes 203 of the first dielectric layers 20 may extend along the same substantially straight line. The single through hole 23 extends through the upper conductive structure 2; that is, the single through hole 23 extends from the top surface 21 of the upper conductive structure 2 to the bottom surface 22 of the upper conductive structure 2. The single through hole 23 tapers downwardly.

The circuit layers 24 may be fan-out circuit layers or redistribution layers (RDLs), and an L/S of the circuit layers 24 may be less than or equal to about 2 µm/about 2 µm, or less than or equal to about 1.8 µm/about 1.8 µm. Each of the circuit layers 24 has a top surface 241 and a bottom surface 242 opposite to the top surface 241. In some embodiments, the circuit layer 24 is embedded in the corresponding first dielectric layer 20, and the top surface 241 of the circuit layer 24 may be substantially coplanar with the top surface 201 of the first dielectric layer 20. In some embodiments, each circuit layer 24 may include a seed layer 243 and a conductive material 244 (e.g., a metallic material) disposed on the seed layer 243. As shown in FIG. 1, the bottommost circuit layer 24 is disposed on and protrudes from the bottom surface 22 of the upper conductive structure 2 (e.g., the bottom surface 202 of the bottommost first dielectric layer 20).

The upper conductive structure 2 includes a plurality of inner vias 25. Some of the inner vias 25 are disposed between two adjacent circuit layers 24 for electrically connecting the two circuit layers 24. Some of the inner vias 25 are disposed between the topmost circuit layer 24 and the outer circuit layer 28 for electrically connecting the topmost circuit layer 24 and the outer circuit layer 28. In some embodiments, each inner via 25 may include a seed layer 251 and a conductive material 252 (e.g., a metallic material) disposed on the seed layer 251. In some embodiments, each inner via 25 and the corresponding circuit layer 24 may be formed integrally as a monolithic or one-piece structure. Each inner via 25 tapers upwardly along a direction from the bottom surface 22 towards the top surface 21 of the upper conductive structure 2. That is, a size (e.g., a width) of a top portion of the inner via 25 is less than a size (e.g., a width) of a bottom portion of the inner via 25 that is closer towards the bottom surface 22. In some embodiments, a maximum width of the inner via 25 (e.g., at the bottom portion) may be less than or equal to about 25 μm, such as about 25 μm, about 20 μm, about 15 μm or about 10 μm.

The lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3 may be similar to a core substrate that further includes a core portion 37, and may be in a wafer type, a panel type or a strip type. The lower conductive structure 3 may be also referred to as "a lower stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 1, the lower conductive structure 3 has a top surface 31 and a bottom surface 32 opposite to the top surface 31. The lower conductive structure 3 includes a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner via (including, for example, a plurality of upper interconnection vias 35 and a plurality of lower interconnection vias 35a).

The core portion 37 has a top surface 371 and a bottom surface 372 opposite to the top surface 371, and defines a plurality of first through holes 373 extending through the core portion 37. An interconnection via 39 is disposed or formed in each first through hole 373 for vertical connection. In some embodiments, the interconnection via 39 includes a base metallic layer 391 and an insulation material 392. The base metallic layer 391 is disposed or formed on a side wall of the first through hole 373, and defines a central through hole. The insulation material 392 fills the central through hole defined by the base metallic layer 391. In some embodiments, the interconnection via 39 may omit an insulation material, and may include a bulk metallic material that fills the first through hole 373.

The first upper dielectric layer 30 is disposed on the top surface 371 of the core portion 37, and has a top surface 301 and a bottom surface 302 opposite to the top surface 301. Thus, the bottom surface 302 of the first upper dielectric layer 30 contacts the top surface 371 of the core portion 37. The second upper dielectric layer 36 is stacked or disposed on the first upper dielectric layer 30, and has a top surface 361 and a bottom surface 362 opposite to the top surface 361. Thus, the bottom surface 362 of the second upper dielectric layer 36 contacts the top surface 301 of the first upper dielectric layer 30, and the second upper dielectric layer 36 is the topmost dielectric layer. In addition, the first lower dielectric layer 30a is disposed on the bottom surface 372 of the core portion 37, and has a top surface 301a and a bottom surface 302a opposite to the top surface 301a. Thus, the top surface 301a of the first lower dielectric layer 30a contacts the bottom surface 372 of the core portion 37. The second lower dielectric layer 36a is stacked or disposed on the first lower dielectric layer 30a. The second lower dielectric layer 36a has a top surface 361a and a bottom surface 362a opposite to the top surface 361a, and defines a through hole having an inner surface. Thus, the top surface 361a of the second lower dielectric layer 36a contacts the bottom surface 302a of the first lower dielectric layer 30a, and the second lower dielectric layer 36a is the bottommost dielectric layer. As shown in FIG. 1, the top surface 31 of the lower conductive structure 3 is the top surface 361 of the second upper dielectric layer 36, and the bottom surface 32 of the lower conductive structure 3 is the bottom surface 362a of the second lower dielectric layer 36a.

A thickness of each of the dielectric layers (e.g., the first dielectric layers 20 and the second dielectric layer 26) of the upper conductive structure 2 is less than or equal to about 40%, less than or equal to about 35%, or less than or equal to about 30% of a thickness of each of the dielectric layers (e.g., the first upper dielectric layer 30, the second upper dielectric layer 36, the first lower dielectric layer 30a and the second lower dielectric layer 36a) of the lower conductive structure 3. For example, a thickness of each of the dielectric layers (e.g., the first dielectric layers 20 and the second dielectric layer 26) of the upper conductive structure 2 may be less than or equal to about 7 μm, and a thickness of each of the dielectric layers (e.g., the first upper dielectric layer 30, the second upper dielectric layer 36, the first lower dielectric layer 30a and the second lower dielectric layer 36a) of the lower conductive structure 3 may be about 40 μm.

An L/S of the first upper circuit layer 34 may be greater than or equal to about 10 μm/about 10 μm. Thus, the L/S of the first upper circuit layer 34 may be greater than or equal to about five times the L/S of the circuit layers 24 of the upper conductive structure 2. The first upper circuit layer 34 has a top surface 341 and a bottom surface 342 opposite to the top surface 341. In some embodiments, the first upper circuit layer 34 is formed or disposed on the top surface 371 of the core portion 37, and covered by the first upper dielectric layer 30. The bottom surface 342 of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 μm/about 10 μm. Thus, the L/S of the second upper circuit layer 38 may be substantially equal to the L/S of the first upper circuit layer 34, and may be greater than or equal to about five times the L/S of the circuit layers 24 of the upper conductive structure 2. The second upper circuit layer 38 has a top surface 381 and a bottom surface 382 opposite to the top surface 381. In some embodiments, the second upper circuit layer 38 is formed or disposed on the top surface 301 of the first upper dielectric layer 30, and covered by the second upper dielectric layer 36. The bottom surface 382 of the second upper circuit layer 38 contacts the top surface 301 of the first upper dielectric layer 30. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the second upper circuit layer 38' is disposed on and protrudes from the top surface 361 of the second upper dielectric layer 36. In some embodiments, the second upper circuit layer 38 is electrically connected to the second upper circuit layer 38' through the upper interconnection vias 35. That is, the upper interconnection vias 35 are disposed between the second upper circuit layers 38, 38' for electrically connecting the second upper circuit layers 38, 38'. In some embodiments, the second upper circuit layer 38' and the upper interconnection vias 35 are formed integrally as a monolithic or one-piece structure. In some embodiments, the second upper circuit layer 38' is the topmost circuit layer of the lower conductive structure 3.

An L/S of the first lower circuit layer 34a may be greater than or equal to about 10 μm/about 10 μm. Thus, the L/S of the first lower circuit layer 34a may be greater than or equal to about five times the L/S of the circuit layers 24 of the upper conductive structure 2. The first lower circuit layer 34a has a top surface 341a and a bottom surface 342a opposite to the top surface 341a. In some embodiments, the first lower circuit layer 34a is formed or disposed on the bottom surface 372 of the core portion 37, and covered by the first lower dielectric layer 30a. The top surface 341a of the first lower circuit layer 34a contacts the bottom surface 372 of the core portion 37. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 nm/about 10 μm. Thus, the L/S of the second lower circuit layer 38a may be substantially equal to the L/S of the first upper circuit layer 34, and may be greater than or equal to about five times the L/S of the circuit layers 24 of the upper conductive structure 2. The second lower circuit layer 38a has a top surface 381a and a bottom surface 382a opposite to the top surface 381a. In some embodiments, the second lower circuit layer 38a is formed or disposed on the bottom surface 302a of the first lower dielectric layer 30a, and covered by the second lower dielectric layer 36a. The top surface 381a of the second lower circuit layer 38a contacts the bottom surface 302a of the first lower dielectric layer 30a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection via 35a tapers upwardly along a direction from the bottom surface 32 towards the top surface 31 of the lower conductive structure 3.

In addition, in some embodiments, the second lower circuit layer 38a' is disposed on and protrudes from the bottom surface 362a of the second lower dielectric layer 36a. In some embodiments, the second lower circuit layer 38a' is electrically connected to the second lower circuit layer 38a through the lower interconnection vias 35a. That is, the lower interconnection vias 35a are disposed between the second lower circuit layers 38a, 38a' for electrically connecting the second lower circuit layers 38a, 38a'. In some embodiments, the second lower circuit layer 38a' and the lower interconnection vias 35a are formed integrally as a monolithic or one-piece structure. In some embodiments, the second lower circuit layer 38a' is the bottommost low-density circuit layer of the lower conductive structure 3.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

The intermediate layer 12 is interposed or disposed between the upper conductive structure 2 and the lower conductive structure 3 to bond the upper conductive structure 2 and the lower conductive structure 3 together. That is, the intermediate layer 12 adheres to the bottom surface 22 of the upper conductive structure 2 and the top surface 31 of the lower conductive structure 3. In some embodiments, the intermediate layer 12 may be an adhesion layer that is cured from an adhesive material (e.g., includes a cured adhesive material such as an adhesive polymeric material). The intermediate layer 12 has a top surface 121 and a bottom surface 122 opposite to the top surface 121, and defines at least one first through hole 123 having an inner surface 1231. The top surface 121 of the intermediate layer 12 contacts the bottom surface 22 of the upper conductive structure 2 (that is, the bottom surface 22 of the upper conductive structure 2 is attached to the top surface 121 of the intermediate layer 12), and the bottom surface 122 of the intermediate layer 12 contacts the top surface 31 of the lower conductive structure 3. Thus, the bottommost circuit layer 24 of the upper conductive structure 2 and the topmost circuit layer (e.g., the second upper circuit layer 38') of the lower conductive structure 3 are embedded in the intermediate layer 12. In some embodiments, a bonding force between two adjacent dielectric layers (e.g., two adjacent first dielectric layers 20) of the upper conductive structure 2 is greater than a bonding force between a dielectric layer (e.g., the bottommost first dielectric layer 20) of the upper conductive structure 2 and the intermediate layer 12. A surface roughness of a boundary between two adjacent dielectric layers (e.g., two adjacent first dielectric layers 20) of the upper conductive structure 2 is greater than a surface roughness of a boundary between a dielectric layer (e.g., the bottommost first dielectric layer 20) of the upper conductive structure 2 and the intermediate layer 12, such as about 1.1 times or greater, about 1.3 times or greater, or about 1.5 times or greater in terms of root mean squared surface roughness.

In some embodiments, a material of the intermediate layer 12 is transparent, and can be seen through by human eyes or machine. That is, a mark disposed adjacent to the top surface 31 of the lower conductive structure 3 can be recognized or detected from the top surface 21 of the upper conductive structure 2 by human eyes or machine.

The first through hole 123 extends through the intermediate layer 12. In some embodiments, the first through hole 123 of the intermediate layer 12 extends through the bottommost first circuit layer 24 of the upper conductive structure 2 and terminates at or on a topmost circuit layer (e.g., the second upper circuit layer 38') of the lower conductive structure 3. That is, the first through hole 123 of the intermediate layer 12 does not extend through the topmost circuit layer (e.g., the second upper circuit layer 38') of the lower conductive structure 3. The first through hole 123 of the intermediate layer 12 may expose a portion of the topmost circuit layer (e.g., a top surface of the second upper circuit layer 38') of the lower conductive structure 3. As shown in FIG. 1, the first through hole 123 of the intermediate layer 12 tapers downwardly along a direction from the top surface 121 towards the bottom surface 122 of the intermediate layer 12; that is, a size of a top portion of the first through hole 123 is greater than a size of a bottom portion of the first through hole 123. Further, the first through hole 123 of the intermediate layer 12 is aligned with and in communication with the through holes 203 of the first dielectric layers 20 and the through hole 263 of the second dielectric layer 26. The bottom portion of through hole 203 of the bottommost first dielectric layer 20 is disposed adjacent to or connected to the top portion of the first through hole 123 of the intermediate layer 12. The size of the bottom portion of the through hole 203 of the bottommost first dielectric layer 20 is substantially equal to the size of the top portion of the first through hole 123 of the intermediate layer 12. Thus, the inner surface 1231 of the first through hole 123 of the intermediate layer 12 is coplanar or aligned with the inner surfaces 2031 of the through holes 203 of the first dielectric layers 20 and the inner surface 2631 of the through hole 263 of the second dielectric layer 26. In some embodiments, inner surface 1231 of the first through hole 123 of the intermediate layer 12 is a curved surface, and is a portion of the inner surface 231 of the single, continuous through hole 23 for accommodating the upper through via 14. The first through hole 123 of the intermediate layer 12, the through holes 203 of the first dielectric layers 20 and the through hole 263 of the second dielectric layer 26 are collectively configured to define or form the single through hole 23. Thus, the single through hole 23 includes the first through hole 123 of the intermediate layer 12, the through holes 203 of the first dielectric layers 20 and the through hole 263 of the second dielectric layer 26.

As shown in FIG. 1, cross-sectional views of one side of the first through hole 123 of the intermediate layer 12, the inner surfaces 2031 of the through holes 203 of the first dielectric layers 20 and the inner surface 2631 of the through hole 263 of the second dielectric layer 26 are segments of a substantially straight line. That is, cross-sectional views of one side of the inner surface 1231 of the first through hole 123 of the intermediate layer 12, the inner surfaces 2031 of the through holes 203 of the first dielectric layers 20 and the inner surface 2631 of the through hole 263 of the second dielectric layer 26 may extend along the same substantially straight line. The single through hole 23 extends through the upper conductive structure 2 and the intermediate layer 12; that is, the single through hole 23 extends from the top surface 21 of the upper conductive structure 2 to the bottom portion of the intermediate layer 12 to expose a portion of the topmost circuit layer (e.g., the top surface of the second upper circuit layer 38') of the lower conductive structure 3. The single through hole 23 tapers downwardly. A maximum width (e.g., a diameter at the top portion) of the single through hole 23 may be less than or equal to about 20 μm, such as about 20 μm, about 15 μm or about 10 μm.

The surface structure 16 is disposed adjacent to the top surface 21 of the upper conductive structure 2. As shown in FIG. 2, the surface structure 16 is disposed on the top surface 261 of the second dielectric layer 26, and defines a through hole 163 having an inner surface 1631. The through hole 163 of the surface structure 16 is aligned with and in communication with the through hole 23. The through hole 163 is formed by lithography (e.g., exposure and development) rather than drilling. Thus, a width (e.g., a diameter) of the through hole 163 can be reduced to less than or equal to about 20 μm, such as about 20 μm, about 15 μm or about 10 μm. Further, the inner surface 1631 may be substantially perpendicular to the top surface 21 of the conductive structure 2. A material of the surface structure 16 includes a metal, such as copper. The surface structure 16 includes a first portion 161 and a second portion 162. The first portion 161 is disposed adjacent to the through hole 163, and the second portion 162 is disposed further away from the through hole 163. In some embodiments, the second portion 162 surrounds the through hole 163, and the first portion 161 surrounds the through the hole 163 and is disposed between the second portion 162 and the through hole 163.

Figure 52:
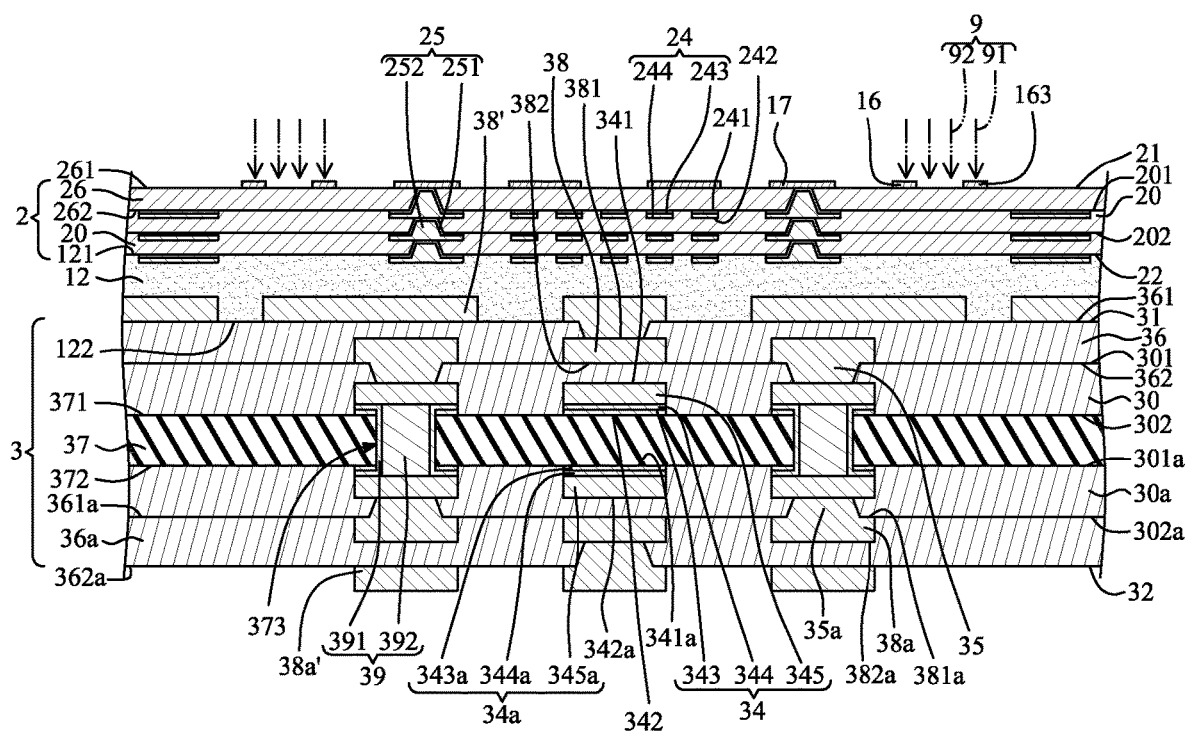
FIG. 52 illustrates one or more stages of an example of a method for manufacturing a wiring structure according to some embodiments of the present disclosure.

During a manufacturing process, the single through hole 23 is formed by laser drilling with the surface structure 16 serving as a mask (or a sacrificial layer). A power of the laser beam 9 (FIG. 52) is set to be low (e.g., about 800 KW), which can penetrate through the second dielectric layer 26 and the first dielectric layers 20 but does not penetrate through the metallic portion of the surface structure 16. In some embodiments, the power of the laser beam 9 is consistent during the drilling process. That is, the power of the laser beam 9 may not be changed throughout the drilling process. The width (e.g., the diameter) of the through hole 23 is determined by the width (e.g., the diameter) of the through hole 163 rather than the width (e.g., the diameter) of the laser beam 9 (FIG. 52). The laser beam 9 (FIG. 52) can remove a thickness of about 1 μm of the first portion 161 of the surface structure 16; thus, a thickness of the first portion 161 is less than a thickness of the second portion 162. The first portion 161 has a non-consistent or varying thickness, and the second portion 162 has a substantially consistent thickness. A top surface of the first portion 161 is a slanted surface with the thickness of the first portion 161 tapering along a direction towards the through hole 163, and a surface roughness of the top surface of the first portion 161 is greater than a surface roughness of a top surface of the second portion 162, such as about 1.1 times or greater, about 1.3 times or greater, or about 1.5 times or greater in terms of root mean squared surface roughness. After the laser drilling process, an inclination angle between the inner surface 231 of the through hole 23 and the top surface 21 of the conductive structure 2 is greater than about 90 degrees, such as about 93 degrees or greater, about 95 degrees or greater, or about 98 degrees or greater.

As shown in FIG. 1, at least one surface trace 17 is further included and disposed adjacent to the top surface 21 of the upper conductive structure 2 and electrically connected to the surface structure 16. In some embodiments, the surface trace 17 and the surface structure 16 are disposed on the top surface 261 of the second dielectric layer 26, and are formed concurrently.

The upper through via 14 is formed or disposed in the single through hole 23, and is formed of a metal, a metal alloy, or other conductive material. Thus, the upper through via 14 extends through at least a portion of the upper conductive structure 2 and the intermediate layer 12, and is electrically connected to the topmost circuit layer (e.g., the top surface of the second upper circuit layer 38') of the lower conductive structure 3. As shown in FIG. 1, the upper through via 14 extends through and contacts the bottommost first circuit layer 24 of the upper conductive structure 2, and terminates at or on, and contacts a portion of the topmost circuit layer (e.g., the top surface of the second upper circuit layer 38') of the lower conductive structure 3. The upper through via 14 extends from the top surface 21 of the upper conductive structure 2 to the bottom surface 122 of the intermediate layer 12. Thus, the upper through via 14 extends to contact a portion of the lower conductive structure 3, and the upper through via 14 does not extend through the lower conductive structure 3. Further, the upper through via 14 tapers downwardly; that is, a size of a top portion of the upper through via 14 is greater than a size of a bottom portion of the upper through via 14. Thus, a tapering direction of the inner via 25 of the upper conductive structure 2 is different from a tapering direction of the upper through via 14. In some embodiments, the upper through via 14 is a monolithic structure or one-piece structure having a homogeneous material composition, and a peripheral surface of the upper through via 14 is a substantially continuous surface without boundaries. A width (e.g., a diameter) of the upper through via 14 is less than or equal to about 20 µm, such as about 20 µm, about 15 µm or about 10 µm. The surface structure 16 includes the first portion 161 and the second portion 162. The first portion 161 of the surface structure 16 is disposed adjacent to the upper through via 14, and the first portion 161 of the surface structure 16 is disposed between the second portion 162 of the surface structure 16 and the upper through via 14.

As shown in FIG. 1, the upper conductive structure 2 includes a high-density region 41 and a low-density region 47. In some embodiments, a density of a circuit line (including, for example, a trace or a pad) in the high-density region 41 is greater than a density of a circuit line in the low-density region 47. That is, the count of the circuit line (including, for example, the trace or the pad) in a unit area within the high-density region 41 is greater than the count of the circuit line in an equal unit area within the low-density region 47. Alternatively, or in combination, an L/S of a circuit layer within the high-density region 41 is less than an L/S of a circuit layer within the low-density region 47. Further, the upper through via 14 is disposed in the low-density region 47 of the high-density conductive structure (e.g., the upper conductive structure 2). In some embodiments, the high-density region 41 may be a chip bonding area.

In addition, the outer circuit layer 28 (e.g., a top low-density circuit layer) is disposed on and protrudes from the top surface 21 of the upper conductive structure 2 (e.g., the top surface 261 of the second dielectric layer 26). As shown in FIG. 1, the outer circuit layer 28 includes a pad portion 281 and at least one surface trace 282. The pad portion 281 is disposed on the surface structure 16 and the upper through via 14. In some embodiments, the pad portion 281 and the upper through via 14 are formed integrally and concurrently, and the pad portion 281 and the upper through via 14 may be a monolithic or one-piece structure. The trace portion 282 is electrically connected to the pad portion 281, and is disposed adjacent to the top surface 21 of the upper conductive structure 2. As shown in FIG. 1, the trace portion 282 is disposed on the surface trace 17, and is conformal with the surface trace 17. An L/S of the outer circuit layer 28 may be greater than or equal to the L/S of the circuit layers 24. In some embodiments, the L/S of the outer circuit layer 28 may be substantially equal to the L/S of the second lower circuit layer 38a'. As illustrated in the embodiment of FIG. 1, there is no horizontally connecting or extending circuit layer in the second dielectric layer 26.

As shown in the embodiment illustrated in FIG. 1, the wiring structure 1 is a combination of the upper conductive structure 2 and the lower conductive structure 3, in which the circuit layers 24 of the upper conductive structure 2 has fine pitch, high yield and low thickness; and the circuit layers (for example, the first upper circuit layer 34, the second upper circuit layers 38, 38', the first lower circuit layer 34a and the second lower circuit layers 38a, 38a') of the lower conductive structure 3 have low manufacturing cost. Thus, the wiring structure 1 has an advantageous compromise of yield and manufacturing cost, and the wiring structure 1 has a relatively low thickness. In some embodiments, if a package has 10000 I/O counts, the wiring structure 1 includes three layers of the circuit layers 24 of the upper conductive structure 2 and six layers of the circuit layers (for example, the first upper circuit layer 34, the second upper circuit layers 38, 38', the first lower circuit layer 34a and the second lower circuit layers 38a, 38a') of the lower conductive structure 3. The manufacturing yield for one layer of the circuit layers 24 of the upper conductive structure 2 may be 99%, and the manufacturing yield for one layer of the circuit layers (for example, the first upper circuit layer 34, the second upper circuit layers 38, 38', the first lower circuit layer 34a and the second lower circuit layers 38a, 38a') of the lower conductive structure 3 may be 90%. Thus, the yield of the wiring structure 1 may be improved. In addition, the warpage of the upper conductive structure 2 and the warpage of the lower conductive structure 3 are separated and will not influence each other. In some embodiments, a warpage shape of the upper conductive structure 2 may be different from a warpage shape of the lower conductive structure 3. For example, the warpage shape of the upper conductive structure 2 may be a convex shape, and the warpage shape of the lower conductive structure 3 may be a concave shape. In some embodiments, the warpage shape of the upper conductive structure 2 may be the same as the warpage shape of the lower conductive structure 3; however, the warpage of the lower conductive structure 3 will not be accumulated onto the warpage of the upper conductive structure 2. Thus, the yield of the wiring structure 1 may be further improved.

In addition, during a manufacturing process, the lower conductive structure 3 and the upper conductive structure 2 may be tested individually before being bonded together. Therefore, known good lower conductive structure 3 and known good upper conductive structure 2 may be selectively bonded together. Bad (or unqualified) lower conductive structure 3 and bad (or unqualified) upper conductive structure 2 may be discarded. As a result, the yield of the wiring structure 1 may be further improved.

Figure 3:
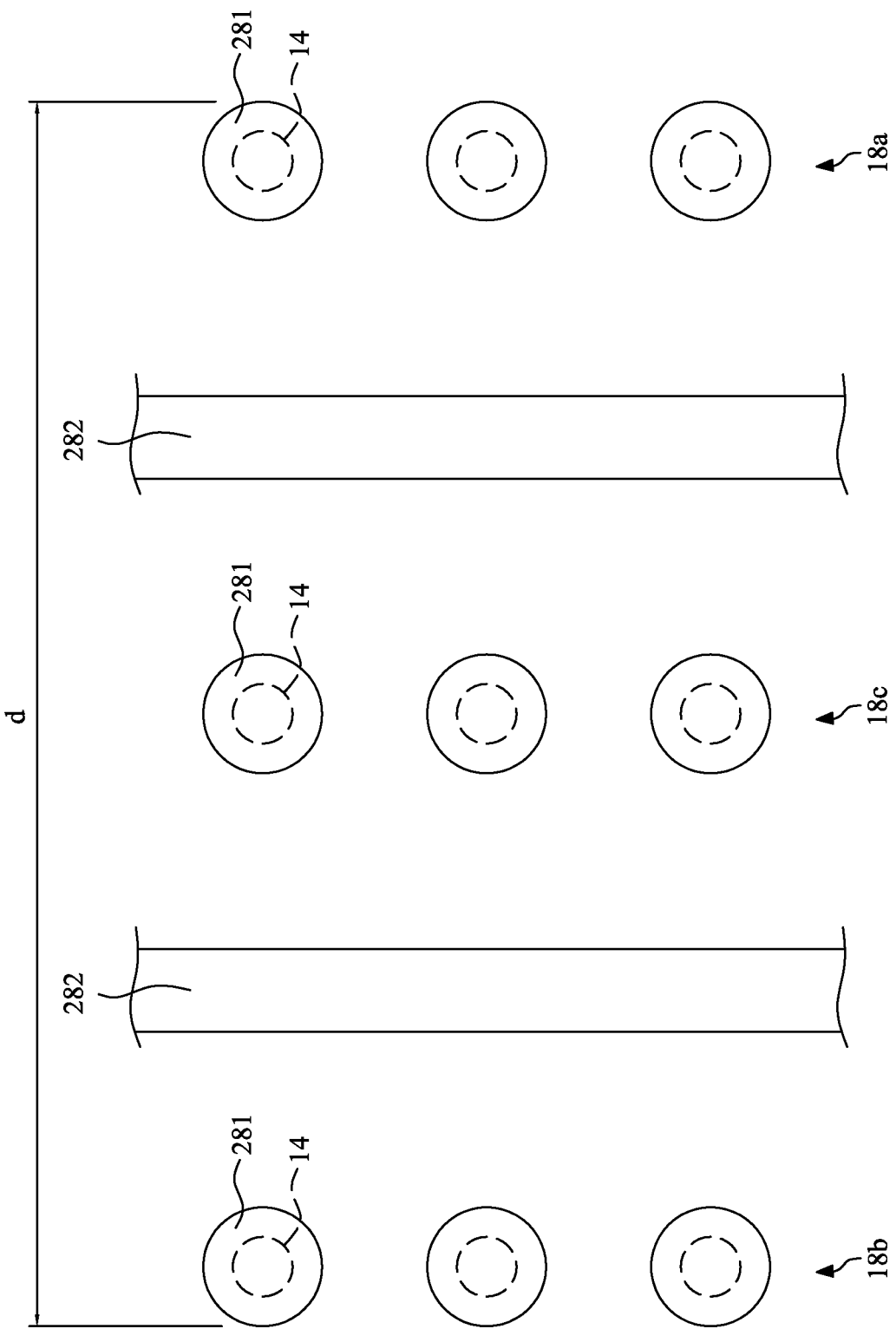
FIG. 3 illustrates a partially enlarged view of a top view of an upper conductive structure of FIG. 1.

FIG. 3 illustrates a partially enlarged view of a top view of the upper conductive structure 2 of FIG. 1. The upper through vias 14 are arranged in a plurality of rows (including, for example, a first row 18a, a second row 18b and a third row 18c) to form a plurality of via walls (or fence structures) having a function of signal isolation. In the illustrated embodiment, the width (e.g., the diameter) of the upper through via 14 can be determined by the width (e.g., the diameter) of the through hole 163 rather than the width (e.g., the diameter) of the laser beam 9 (FIG. 52). Thus, the width (e.g., the diameter) of the upper through via 14 can be reduced to a small value. If a distance d between the first row 18a and the second row 18b is fixed, the third row 18c and two trace portions 282 can be disposed between the first row 18a and the second row 18b. In a comparative embodiment, the width (e.g., the diameter) of the upper through via 14 is relatively large. Thus, when the distance d between the first row 18a and the second row 18b is fixed, there is space to accommodate the two trace portions 282 between the first row 18a and the second row 18b, but the third row 18c is not further disposed between the first row 18a and the second row 18b.

Figure 4:
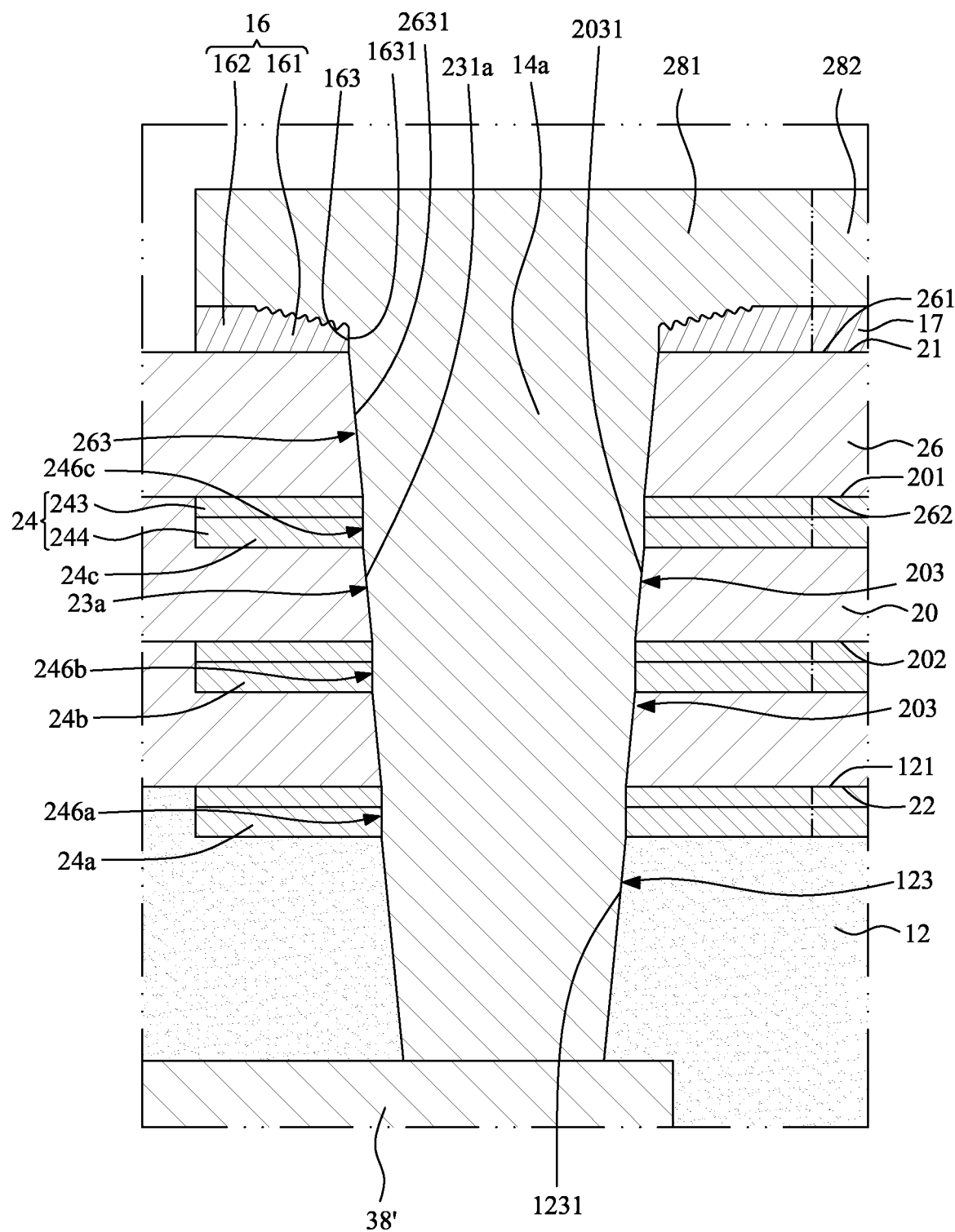
FIG. 4 illustrates a cross-sectional view of an upper through via according to some embodiments of the present disclosure.
Figure 5:
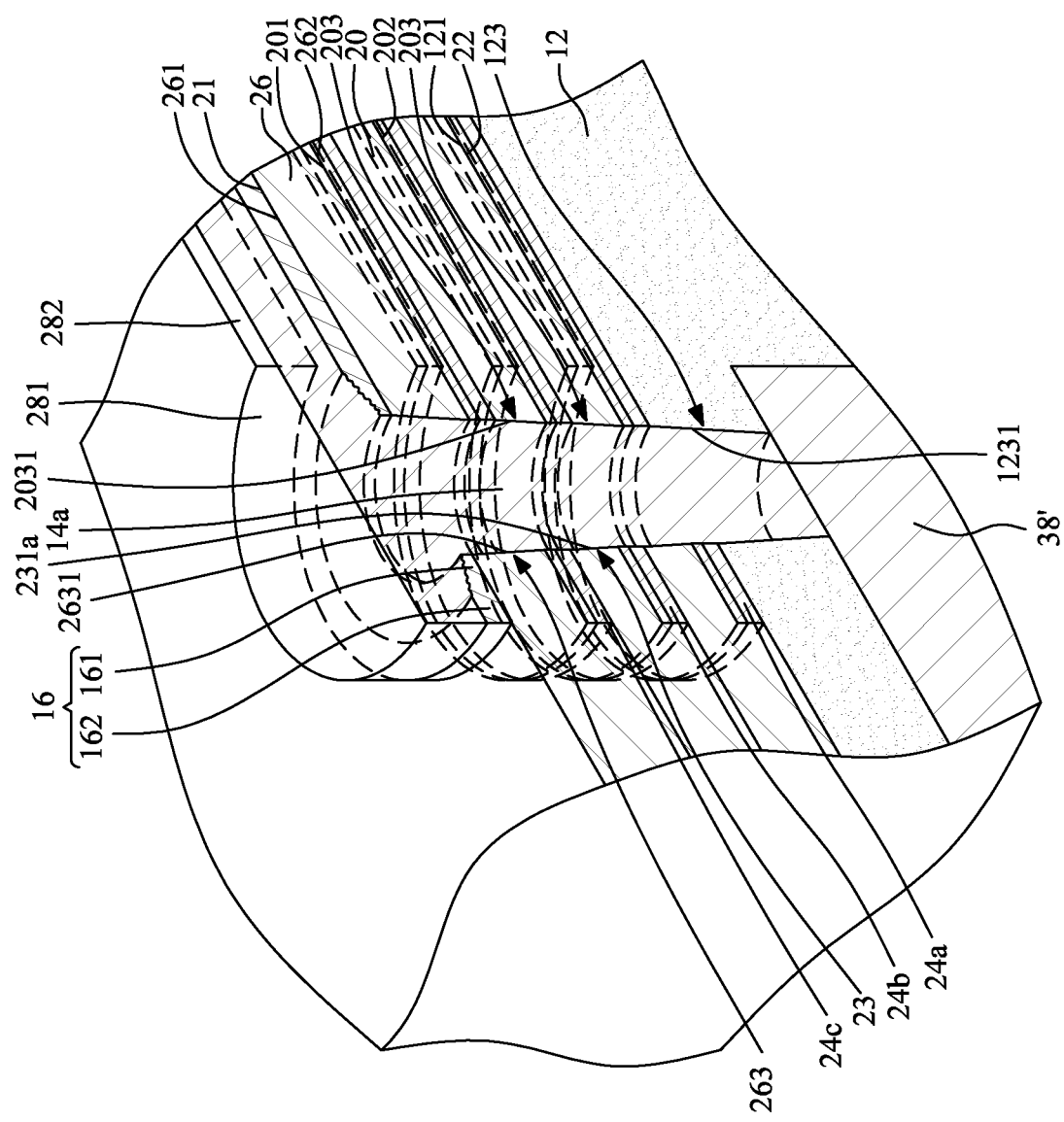
FIG. 5 illustrates a perspective view of the upper through via of FIG. 4.

FIG. 4 illustrates a cross-sectional view of an upper through via 14a according to some embodiments of the present disclosure. FIG. 5 illustrates a perspective view of the upper through via 14a of FIG. 4. The circuit layers 24 of the upper conductive structure 2 include a first circuit layer 24a, a second circuit layer 24b and a third circuit layer 24c. The third circuit layer 24c is disposed below the through hole 163 of the surface structure 16, the second circuit layer 24b is disposed below the third circuit layer 24c, and the first circuit layer 24a is disposed below the second circuit layer 24b. The first circuit layer 24a defines a through hole 246a, the second circuit layer 24b defines a through hole 246b, and the third circuit layer 24c defines a through hole 246c. The through hole 163 of the surface structure 16, the through hole 246c of the third circuit layer 24c, the through hole 246b of the second circuit layer 24b and the through hole 246a of the first circuit layer 24a are aligned with each other. It is noted that the through hole 246c of the third circuit layer 24c, the through hole 246b of the second circuit layer 24b and the through hole 246a of the first circuit layer 24a are formed by lithography (e.g., exposure and development) rather than drilling. Thus, inner surfaces of the through holes 246a, 246b, 246c are substantially perpendicular to the top surface 21 of the upper conductive structure 2. In some embodiments, a width (e.g., a diameter) of the through hole 246c of the third circuit layer 24c is less than a width (e.g., a diameter) of the through hole 163, a width (e.g., a diameter) of the through hole 246b of the second circuit layer 24b is less than the width (e.g., the diameter) of the through hole 246c of the third circuit layer 24c, and a width (e.g., a diameter) of the through hole 246a of the first circuit layer 24a is less than the width (diameter) of the through hole 246b of the second circuit layer 24b.

As shown in FIG. 4, the inner surface 231a of the through hole 23a further includes the inner surfaces of the through holes 246a, 246b, 246c. Thus, the inner surface 231a of the through hole 23a may not be a substantially smooth or continuous surface. The upper through via 14a is disposed in the through hole 23a to extend through and contact the circuit layers 24 (e.g., the first circuit layer 24a, the second circuit layer 24b and the third circuit layer 24c) of the upper conductive structure 2. It is noted that a size and a shape of the bottom portion of the upper through via 14a may be defined by the through hole 246c of the third circuit layer 24c, the through hole 246b of the second circuit layer 24b and the through hole 246a of the first circuit layer 24a.

Figure 6:
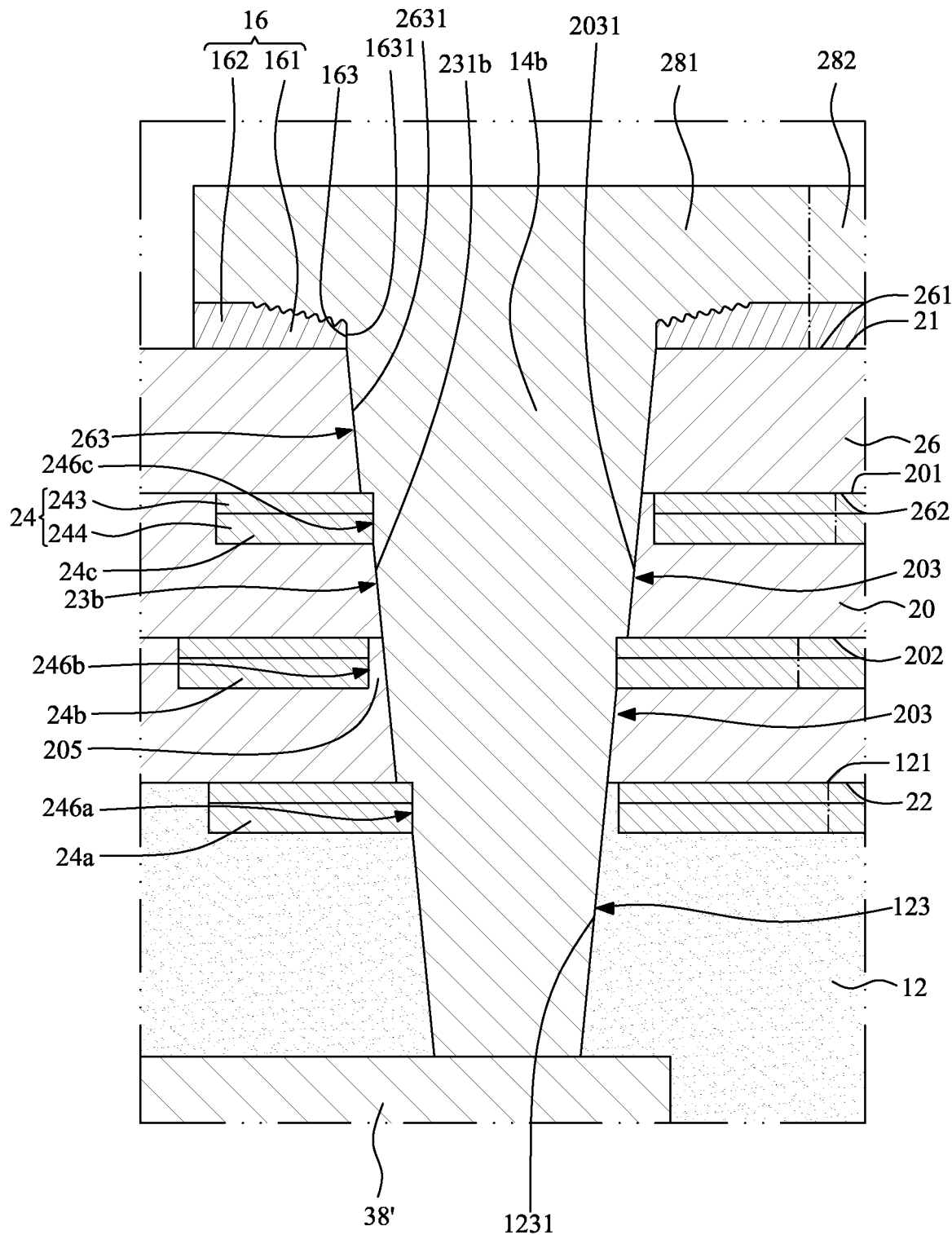
FIG. 6 illustrates a cross-sectional view of an upper through via according to some embodiments of the present disclosure.

FIG. 6 illustrates a cross-sectional view of an upper through via 14b according to some embodiments of the present disclosure. The upper through via 14b is similar to the upper through via 14a shown in FIG. 4, except that the through hole 163 of the surface structure 16, the through hole 246c of the third circuit layer 24c, the through hole 246b of the second circuit layer 24b and the through hole 246a of the first circuit layer 24a are misaligned or displaced from one another. Thus, the inner surface 231b of the through hole 23b may not be a substantially smooth or continuous surface. The upper through via 14b is disposed in the through hole 23b to extend through and contact the circuit layers 24 (e.g., the first circuit layer 24a, the second circuit layer 24b and the third circuit layer 24c) of the upper conductive structure 2. In addition, as shown in FIG. 6, a portion 205 of the bottommost first dielectric layer 20 may extend into a space between a peripheral surface of the upper through via 14b and an inner surface of the through hole 246b of the second circuit layer 24b.

Figure 7:
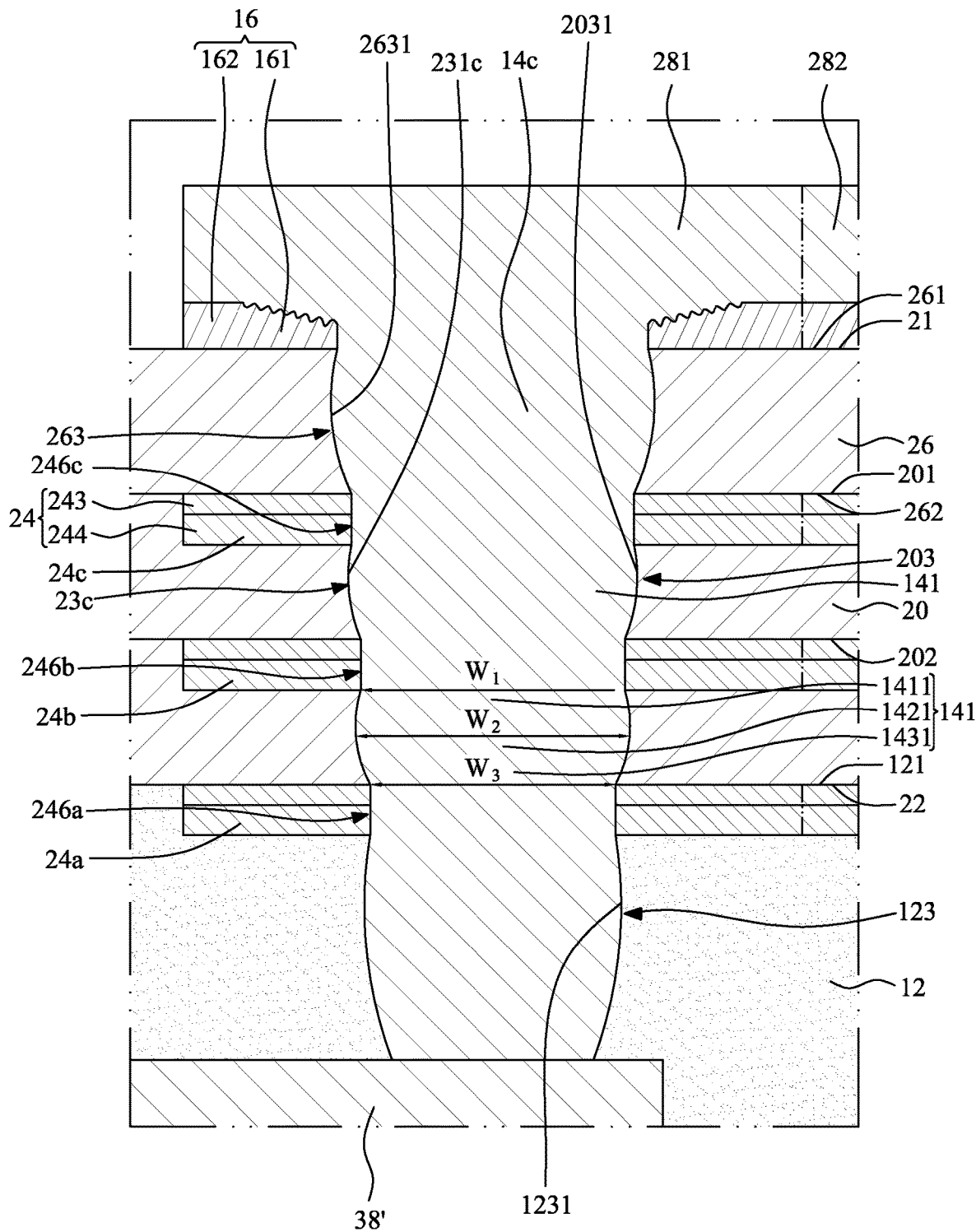
FIG. 7 illustrates a cross-sectional view of an upper through via according to some embodiments of the present disclosure.

FIG. 7 illustrates a cross-sectional view of an upper through via 14c according to some embodiments of the present disclosure. The upper through via 14c is similar to the upper through via 14a shown in FIG. 4, except for a shape of the through hole 23c. As shown in FIG. 7, the inner surfaces 2031 of the through holes 203 of the first dielectric layers 20 and the inner surface 2631 of the through hole 263 of the second dielectric layer 26 are curved surfaces. Thus, the upper through via 14c in the through hole 23c has a calabash shape. In some embodiments, the upper through via 14c includes a plurality of sections 141 disposed between the circuit layers 24 (e.g., the first circuit layer 24a, the second circuit layer 24b and the third circuit layer 24c) of the upper conductive structure 2. Each section 141 includes a top portion 1411, a middle portion 1412 and a bottom portion 1413. A width W2 of the middle portion 1421 is greater than a width $W_1$ of the top portion 1411, and the width W2 of the middle portion 1421 is greater than a width W3 of the bottom portion 1423. That is, a sidewall of each of the sections 141 from a cross-sectional view is curved (e.g., convex).

Figure 8:
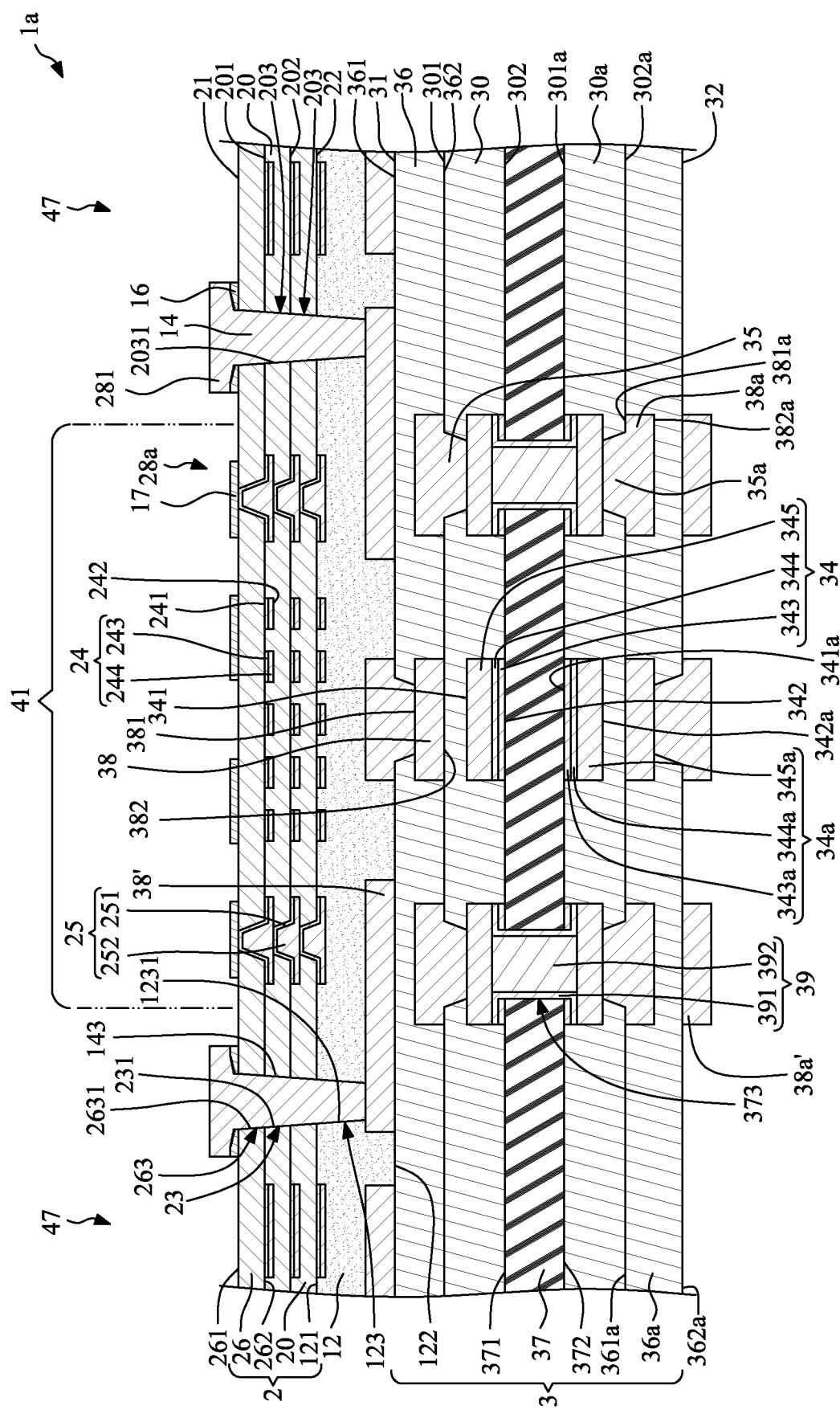
FIG. 8 illustrates a cross-sectional view of a wiring structure according to some embodiments of the present disclosure.

FIG. 8 illustrates a cross-sectional view of a wiring structure 1a according to some embodiments of the present disclosure. The wiring structure 1a is similar to the wiring structure 1 shown in FIG. 1, except that the trace portion 282 (FIG. 1) is omitted. Thus, an outer circuit layer 28a may include the surface trace 17 and the pad portion 281.

Figure 9:
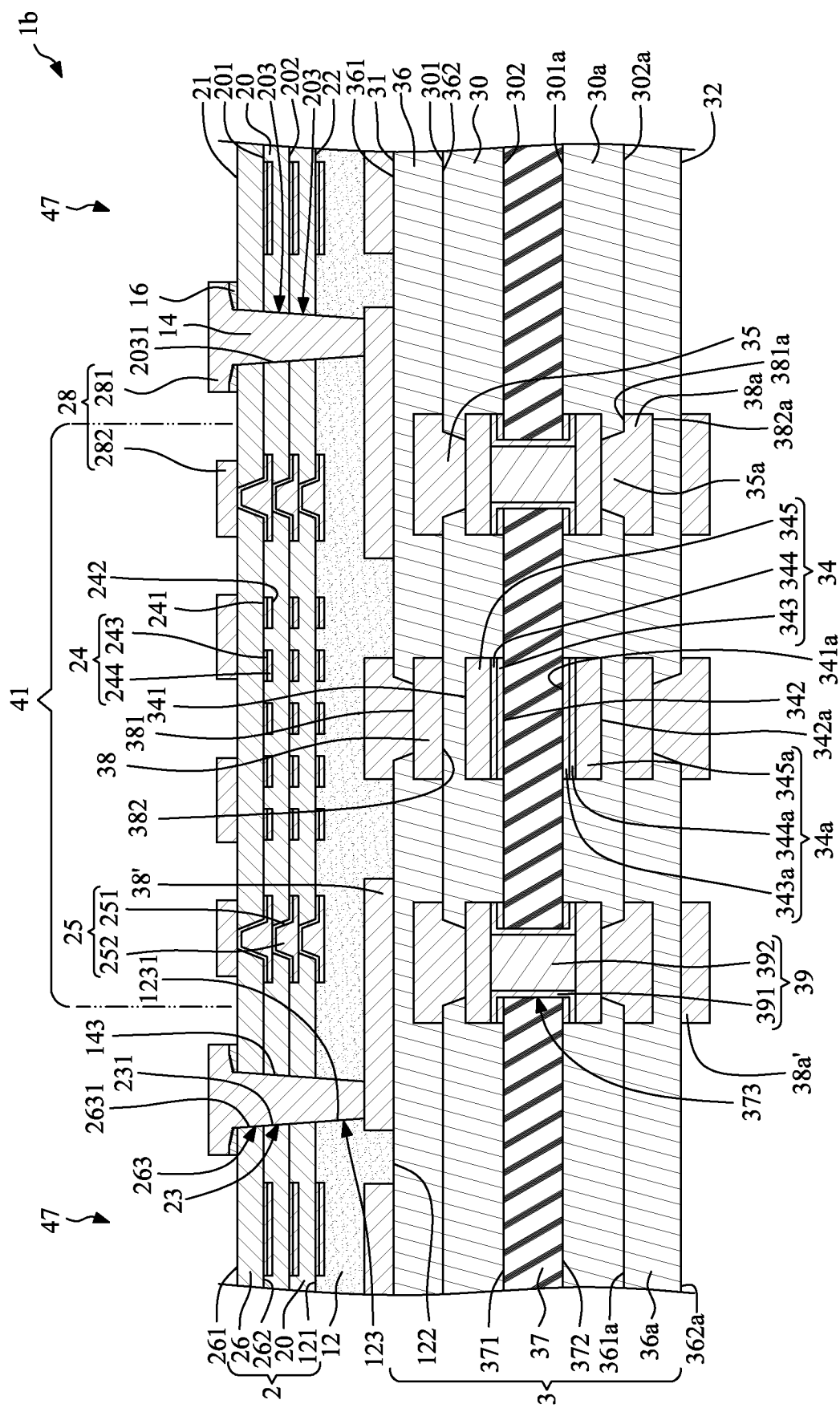
FIG. 9 illustrates a cross-sectional view of a wiring structure according to some embodiments of the present disclosure.

FIG. 9 illustrates a cross-sectional view of a wiring structure 1b according to some embodiments of the present disclosure. The wiring structure 1b is similar to the wiring structure 1 shown in FIG. 1, except that the surface trace 17 (FIG. 1) is omitted. Thus, the trace portion 282 of the outer circuit layer 28 may be disposed on the top surface 21 of the upper conductive structure 2 directly.

Figure 10:
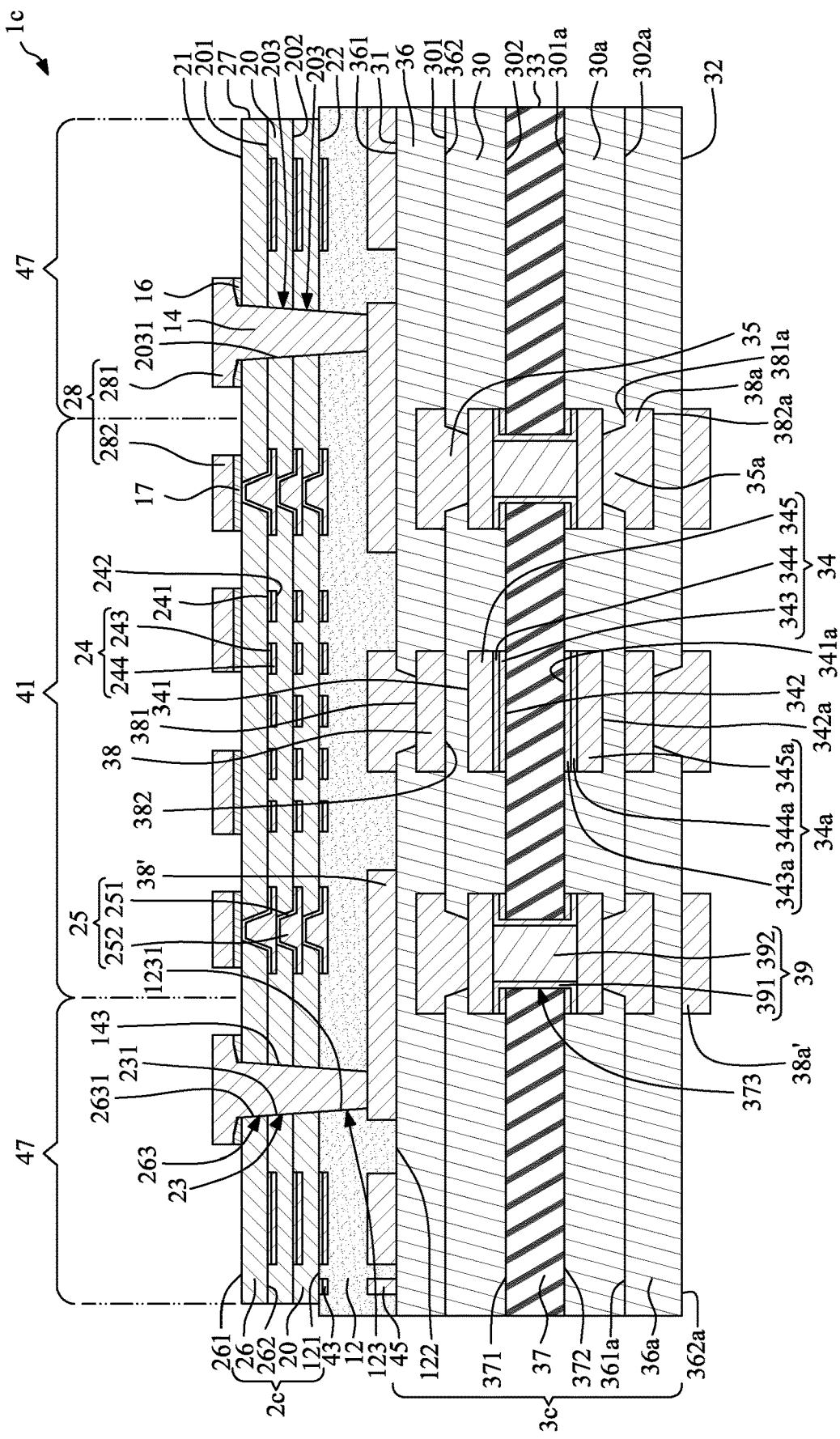
FIG. 10 illustrates a cross-sectional view of a wiring structure according to some embodiments of the present disclosure.

FIG. 10 illustrates a cross-sectional view of a wiring structure 1c according to some embodiments of the present disclosure. The wiring structure 1c is similar to the wiring structure 1 shown in FIG. 1, except for structures of an upper conductive structure 2c and a lower conductive structure 3c. As shown in FIG. 10, the upper conductive structure 2c and the lower conductive structure 3c are both strip structures. Thus, the wiring structure 1c is a strip structure. In some embodiments, the lower conductive structure 3c may be a panel structure that carries a plurality of strip upper conductive structures 2c. Thus, the wiring structure 1c is a panel structure. A length (e.g., about 240 mm) of the upper conductive structure 2c is greater than a width (e.g., about 95 mm) of the upper conductive structure 2c from a top view. Further, a length of the lower conductive structure 3c is greater than a width of the lower conductive structure 3c from a top view. In addition, a lateral peripheral surface 27 of the upper conductive structure 2c is not coplanar with (e.g., is inwardly recessed from or otherwise displaced from) a lateral peripheral surface 33 of the lower conductive structure 3c. In some embodiments, during a manufacturing process, the lower conductive structure 3c and the upper conductive structure 2c may be both known good strip structures. Alternatively, the upper conductive structure 2c may be a known good strip structure, and the lower conductive structure 3c may be a known good panel structure. As a result, the yield of the wiring structure 1c may be further improved.

As shown in FIG. 10, the upper conductive structure 2c includes at least one fiducial mark 43 at a corner thereof, and the lower conductive structure 3c includes at least one fiducial mark 45 at a corner thereof. The fiducial mark 43 of the upper conductive structure 2c is aligned with the fiducial mark 45 of the lower conductive structure 3c during a manufacturing process, so that the relative position of the upper conductive structure 2c and the lower conductive structure 3c is secured. In some embodiments, the fiducial mark 43 of the upper conductive structure 2c is disposed on and protrudes from the bottom surface 22 of the upper conductive structure 2c (e.g., the bottom surface 202 of the bottommost first dielectric layer 20). The fiducial mark 43 and the bottommost circuit layer 24 may be at, or part of, the same layer, and may be formed concurrently. Further, the fiducial mark 45 of the lower conductive structure 3c is disposed on and protrudes from the top surface 31 of the lower conductive structure 3c (e.g., the top surface 361 of the second upper dielectric layer 36). The fiducial mark 45 and the second upper circuit layer 38' may be at, or part of, the same layer, and may be formed concurrently.

Figure 10A:
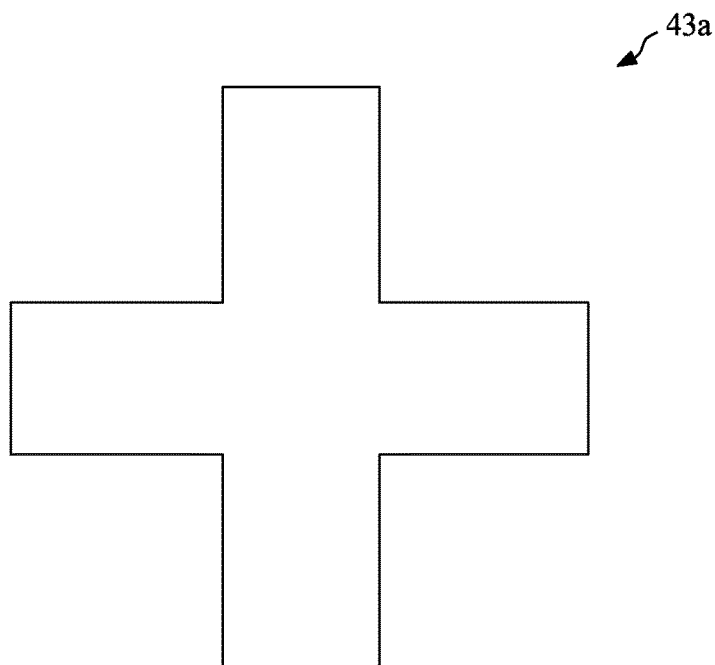
FIG. 10A illustrates a top view of an example of a fiducial mark of an upper conductive structure according to some embodiments of the present disclosure.

FIG. 10A illustrates a top view of an example of a fiducial mark 43a of the upper conductive structure 2c according to some embodiments of the present disclosure. The fiducial mark 43a of the upper conductive structure 2c has a continuous cross shape.

Figure 10B:
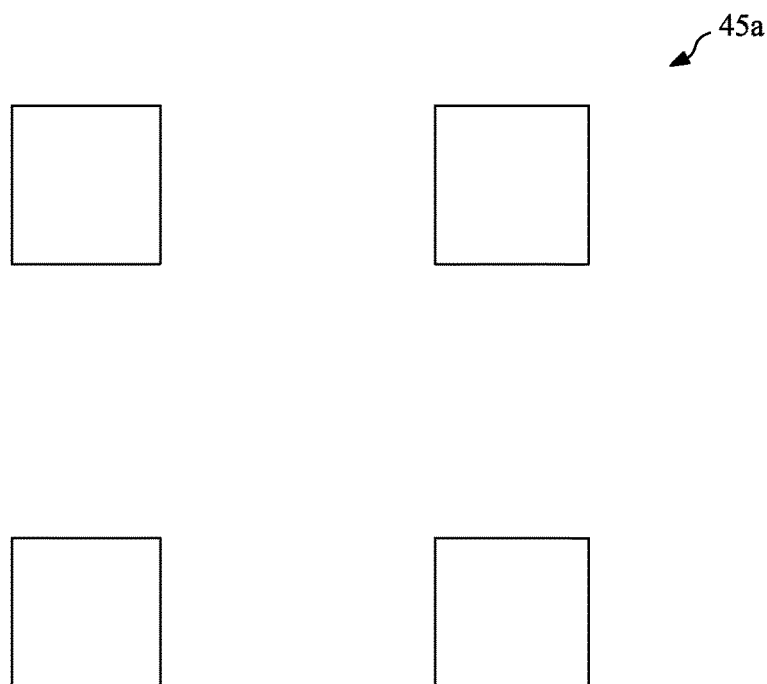
FIG. 10B illustrates a top view of an example of a fiducial mark of a lower conductive structure according to some embodiments of the present disclosure.

FIG. 10B illustrates a top view of an example of a fiducial mark 45a of the lower conductive structure 3c according to some embodiments of the present disclosure. The fiducial mark 45a of the lower conductive structure 3c includes four square-shaped segments spaced apart at four corners.

Figure 10C:
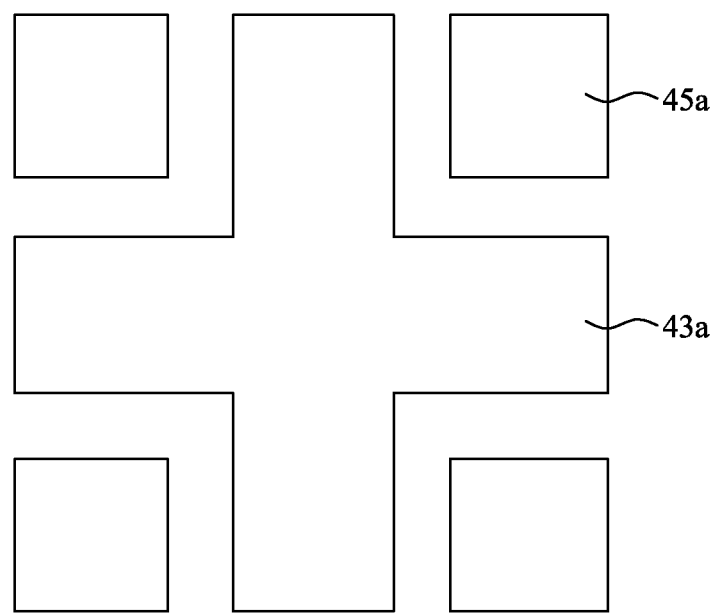
FIG. 10C illustrates a top view of a combination image of the fiducial mark of the upper conductive structure of FIG. 10A and the fiducial mark of the lower conductive structure of FIG. 10B.

FIG. 10C illustrates a top view of a combination image of the fiducial mark 43a of the upper conductive structure 2c of FIG. 10A and the fiducial mark 45a of the lower conductive structure 3c of FIG. 10B. When the upper conductive structure 2c is aligned with the lower conductive structure 3c precisely, the combination image shows the complete fiducial mark 43a and the complete fiducial mark 45a, as shown in FIG. 10C. That is, the fiducial mark 43a does not cover or overlap the fiducial mark 45a from the top view.

Figure 10D:
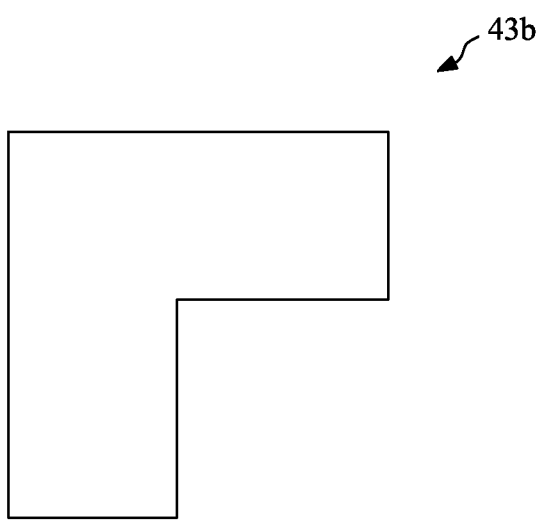
FIG. 10D illustrates a top view of an example of a fiducial mark of an upper conductive structure according to some embodiments of the present disclosure.

FIG. 10D illustrates a top view of an example of a fiducial mark 43b of the upper conductive structure 2c according to some embodiments of the present disclosure. The fiducial mark 43b of the upper conductive structure 2c has a continuous reversed "L" shape.

Figure 10E:
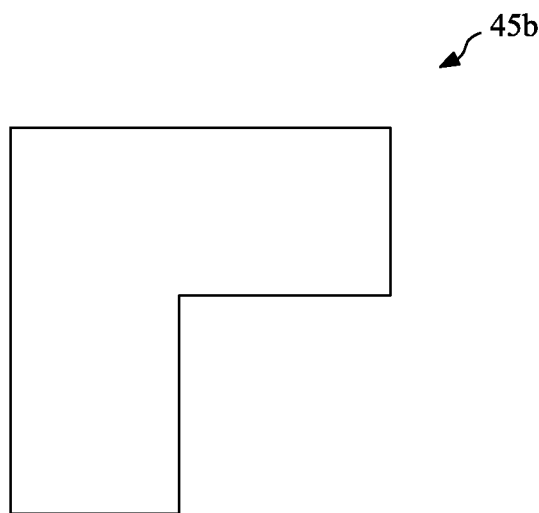
FIG. 10E illustrates a top view of an example of a fiducial mark of a lower conductive structure according to some embodiments of the present disclosure.

FIG. 10E illustrates a top view of an example of a fiducial mark 45b of the lower conductive structure 3c according to some embodiments of the present disclosure. The fiducial mark 45b of the lower conductive structure 3c has a continuous reversed "L" shape which is substantially the same as the fiducial mark 43b of the upper conductive structure 2c.

Figure 10F:
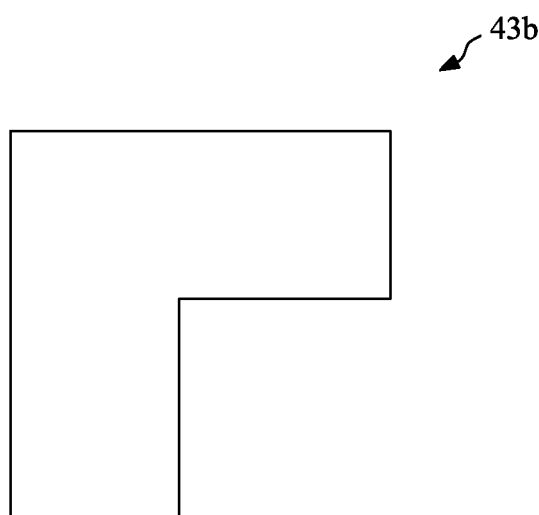
FIG. 10F illustrates a top view of a combination image of the fiducial mark of the upper conductive structure of FIG. 10D and the fiducial mark of the lower conductive structure of FIG. 10E.

FIG. 10F illustrates a top view of a combination image of the fiducial mark 43b of the upper conductive structure 2c of FIG. 10D and the fiducial mark 45b of the lower conductive structure 3c of FIG. 10E. When the upper conductive structure 2c is aligned with the lower conductive structure 3c precisely, the combination image shows solely the fiducial mark 43b of the upper conductive structure 2c, as shown in FIG. 10F. That is, the fiducial mark 43b completely covers or overlaps the fiducial mark 45b from the top view.

Figure 10G:
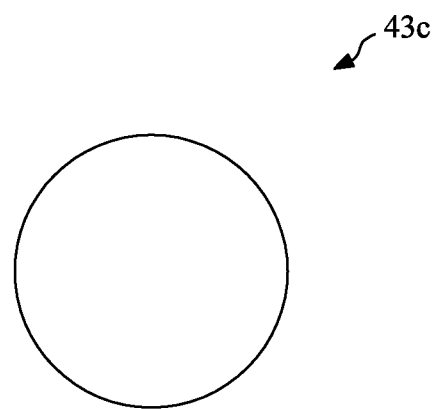
FIG. 10G illustrates a top view of an example of a fiducial mark of an upper conductive structure according to some embodiments of the present disclosure.

FIG. 10G illustrates a top view of an example of a fiducial mark 43c of the upper conductive structure 2c according to some embodiments of the present disclosure. The fiducial mark 43c of the upper conductive structure 2c has a continuous circular shape.

Figure 10H:
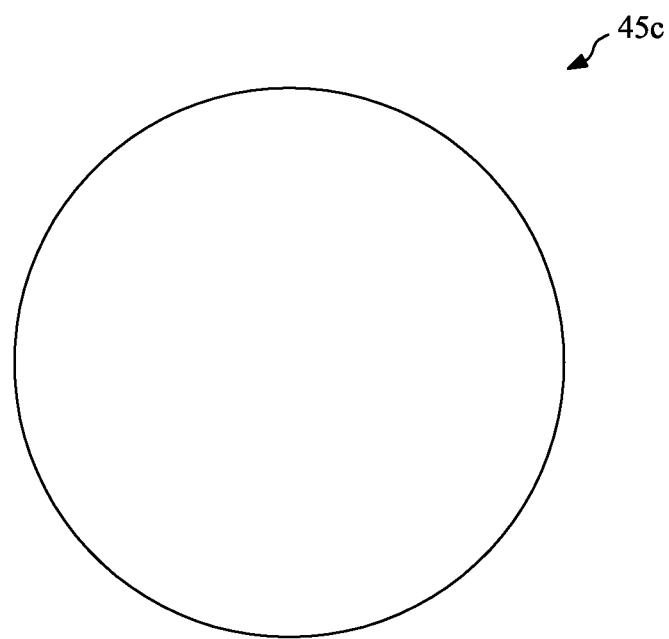
FIG. 10H illustrates a top view of an example of a fiducial mark of a lower conductive structure according to some embodiments of the present disclosure.

FIG. 10H illustrates a top view of an example of a fiducial mark 45c of the lower conductive structure 3c according to some embodiments of the present disclosure. The fiducial mark 45c of the lower conductive structure 3c has a continuous circular shape which is larger than the fiducial mark 43c of the upper conductive structure 2c.

Figure 10I:
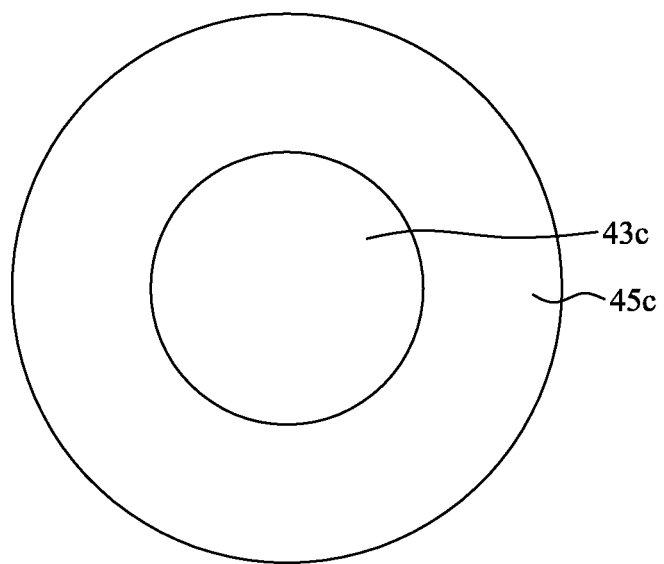
FIG. 10I illustrates a top view of a combination image of the fiducial mark of the upper conductive structure of FIG. 10G and the fiducial mark of the lower conductive structure of FIG. 10H.

FIG. 10I illustrates a top view of a combination image of the fiducial mark 43c of the upper conductive structure 2c of FIG. 10G and the fiducial mark 45c of the lower conductive structure 3c of FIG. 10H. When the upper conductive structure 2c is aligned with the lower conductive structure 3c precisely, the combination image shows two concentric circles, as shown in FIG. 10I. That is, the fiducial mark 43c is disposed at the center of the fiducial mark 45c.

Figure 11:
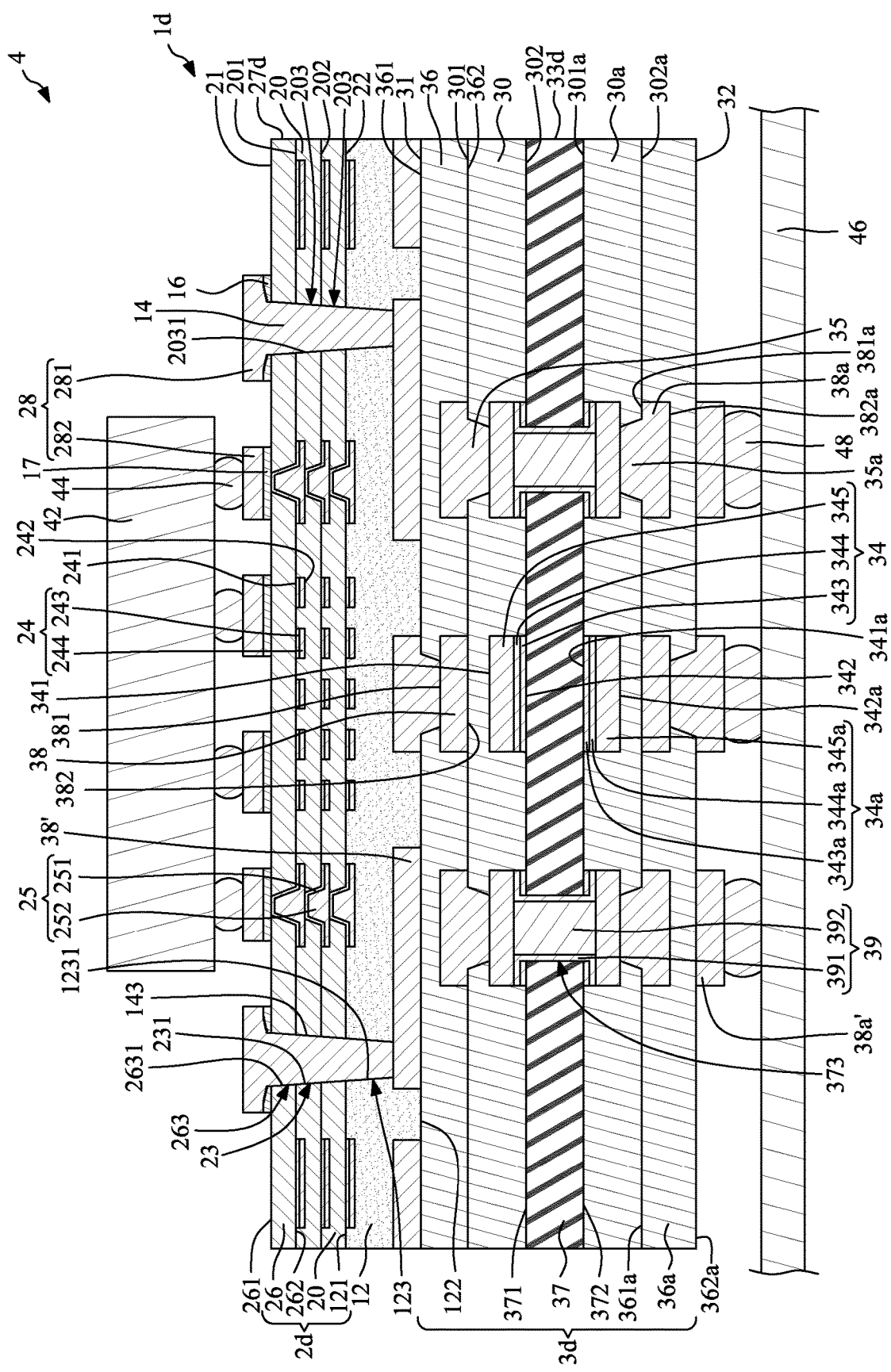
FIG. 11 illustrates a cross-sectional view of a bonding of a package structure and a substrate.

FIG. 11 illustrates a cross-sectional view of a bonding of a package structure 4 and a substrate 46 according to some embodiments. The package structure 4 includes a wiring structure 1d, a semiconductor chip 42, a plurality of first connecting elements 44 and a plurality of second connecting elements 48. The wiring structure 1d of FIG. 11 is similar to the wiring structure 1 shown in FIG. 1, except for structures of an upper conductive structure 2d and a lower conductive structure 3d. The upper conductive structure 2d and the lower conductive structure 3d are both dice and may be singulated concurrently. Thus, the wiring structure 1d is a unit structure. That is, a lateral peripheral surface 27d of the upper conductive structure 2d, a lateral peripheral surface 33d of the lower conductive structure 3d and a lateral peripheral surface of the intermediate layer 12 are substantially coplanar with each other. The semiconductor chip 42 is electrically connected and bonded to the outer circuit layer 28 of the upper conductive structure 2d through the first connecting elements 44 (e.g., solder bumps or other conductive bumps). The second lower circuit layer 38a' of the lower conductive structure 3d is electrically connected and bonded to the substrate 46 (e.g., a mother board such as a printed circuit board (PCB)) through the second connecting elements 48 (e.g., solder bumps or other conductive bumps).

Figure 12:
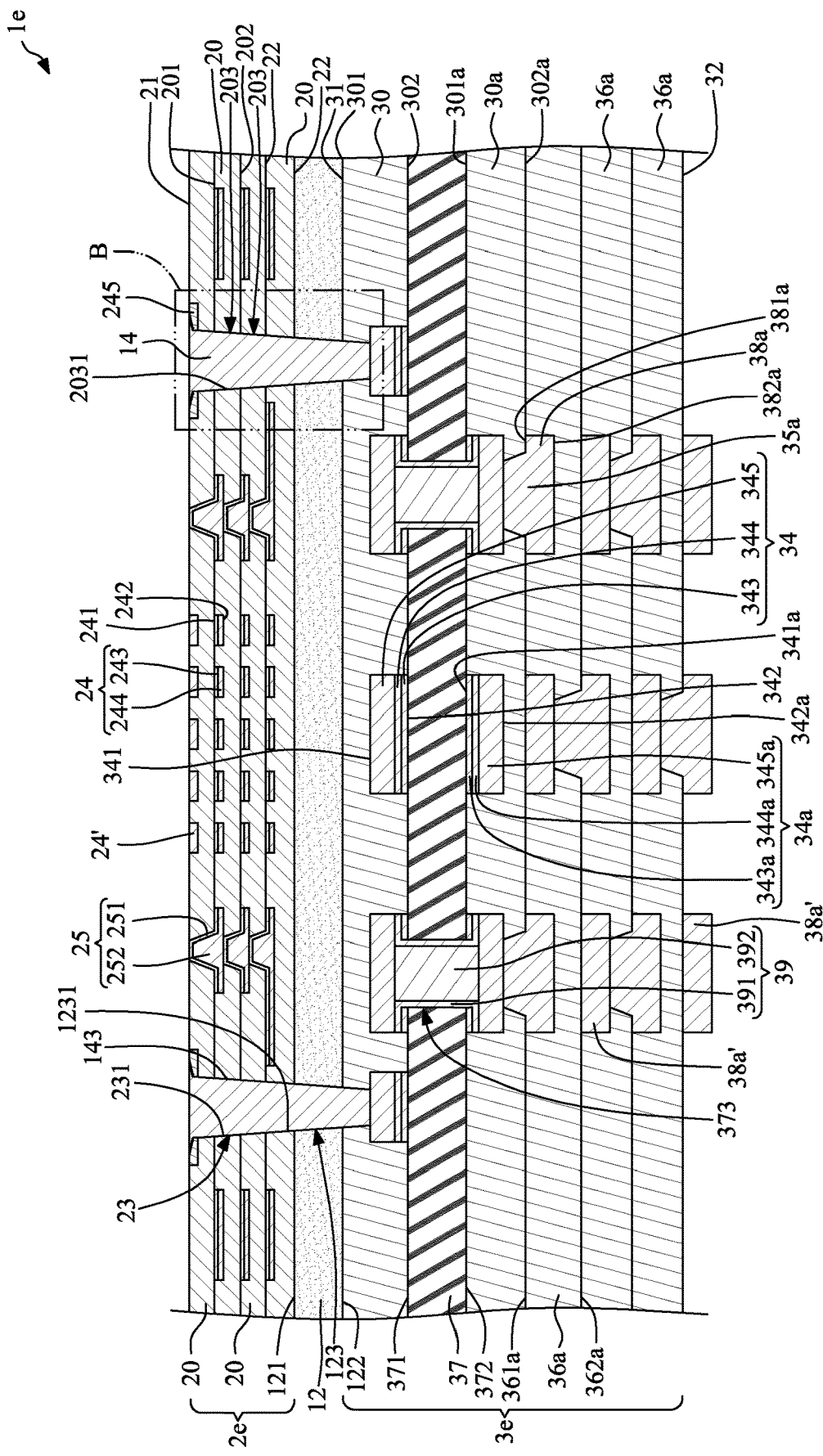
FIG. 12 illustrates a cross-sectional view of a wiring structure according to some embodiments of the present disclosure.

FIG. 12 illustrates a cross-sectional view of a wiring structure 1e according to some embodiments of the present disclosure. The wiring structure 1e is similar to the wiring structure 1 shown in FIG. 1, except for structures of an upper conductive structure 2e and a lower conductive structure 3e. In the upper conductive structure 2e, the second dielectric layer 26 is replaced by a topmost first dielectric layer 20. In addition, the upper conductive structure 2e may further include a topmost circuit layer 24'. The topmost circuit layer 24' may omit a seed layer, and may be electrically connected to the below circuit layer 24 through the inner vias 25. A top surface of the topmost circuit layer 24' may be substantially coplanar with the top surface 21 of the upper conductive structure 2e (e.g., the top surface 201 of the topmost first dielectric layer 20). Thus, the top surface of the topmost circuit layer 24' may be exposed from the top surface 21 of the upper conductive structure 2e (i.e., the top surface 201 of the topmost first dielectric layer 20). The topmost circuit layer 24' includes a pad portion 245 serving as a mask (or a sacrificial layer) during a laser drilling process. Further, the bottommost first dielectric layer 20 may cover the bottommost circuit layer 24. Thus, the entire bottom surface 22 of the upper conductive structure 2e (e.g., the bottom surface 202 of the bottommost first dielectric layer 20) is substantially flat.

In the lower conductive structure 3e, the second upper dielectric layer 36 and the second upper circuit layers 38, 38' are omitted. Thus, the top surface 31 of the lower conductive structure 3e is the top surface 301 of the first upper dielectric layer 30, which is substantially flat. Further, two additional second lower dielectric layers 36a and two additional second lower circuit layers 38a' are further included.

The intermediate layer 12 adheres to the bottom surface 22 of the upper conductive structure 2e and the top surface 31 of the lower conductive structure 3e. Thus, the entire top surface 121 and the entire bottom surface 122 of the intermediate layer 12 are both substantially flat. The intermediate layer 12 does not include or contact a horizontally extending or connecting circuit layer. That is, there is no horizontally extending or connecting circuit layer disposed or embedded in the intermediate layer 12. The upper through via 14 extends through the upper conductive structure 2e and the intermediate layer 12.

Figure 13:
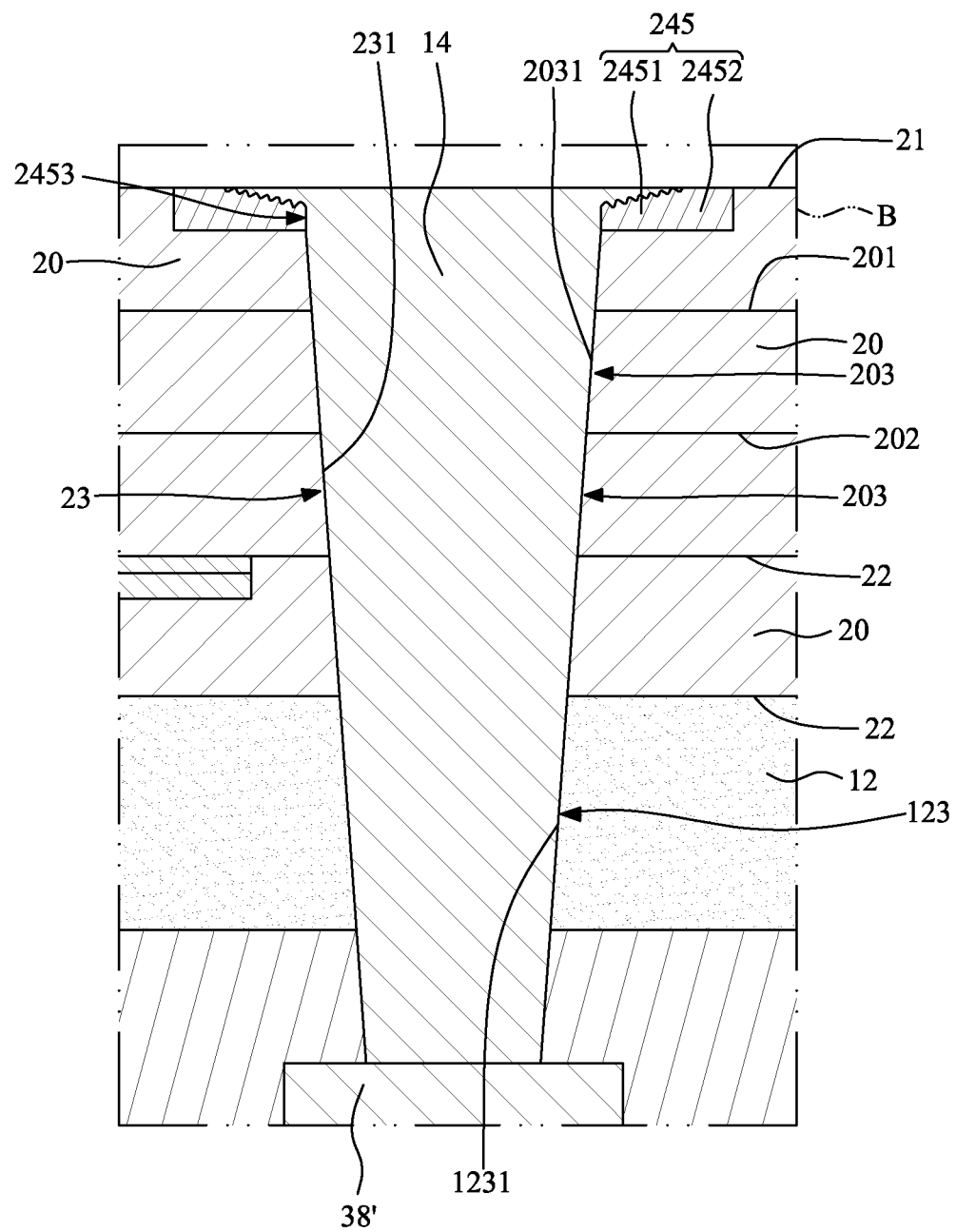
FIG. 13 illustrates a partially enlarged view of a region "B" in FIG. 12.

FIG. 13 illustrates a partially enlarged view of a region "B" in FIG. 12. The pad portion 245 is similar to the surface structure 16 of FIG. 1 and FIG. 2. The pad portion 245 is embedded in the topmost first dielectric layer 20, and is exposed from the top surface 21 of the upper conductive structure 2. The pad portion 245 defines a through hole 2453 that is aligned with and in communication with the through hole 23. The through hole 2453 is formed by lithography (e.g., exposure and development) rather than drilling. The pad portion 245 includes a first portion 2451 and a second portion 2452. The first portion 2451 is disposed adjacent to the through hole 2453, and the second portion 2452 is disposed further away from the through hole 2453. In some embodiments, the second portion 2452 surrounds the through hole 2453, and the first portion 2451 surrounds the through hole 2453 is disposed between the second portion 2452 and the through hole 2453. A thickness of the first portion 2451 is less than a thickness of the second portion 2452. The first portion 2451 has a non-consistent or varying thickness, and the second portion 2452 has a substantially consistent thickness. A top surface of the first portion 2451 is a slanted surface with the thickness of the first portion 2451 tapering along a direction towards the through hole 2453, and a surface roughness of the top surface of the first portion 2451 is greater than a surface roughness of the second portion 2452, such as about 1.1 times or greater, about 1.3 times or greater, or about 1.5 times or greater in terms of root mean squared surface roughness.

Figure 14:
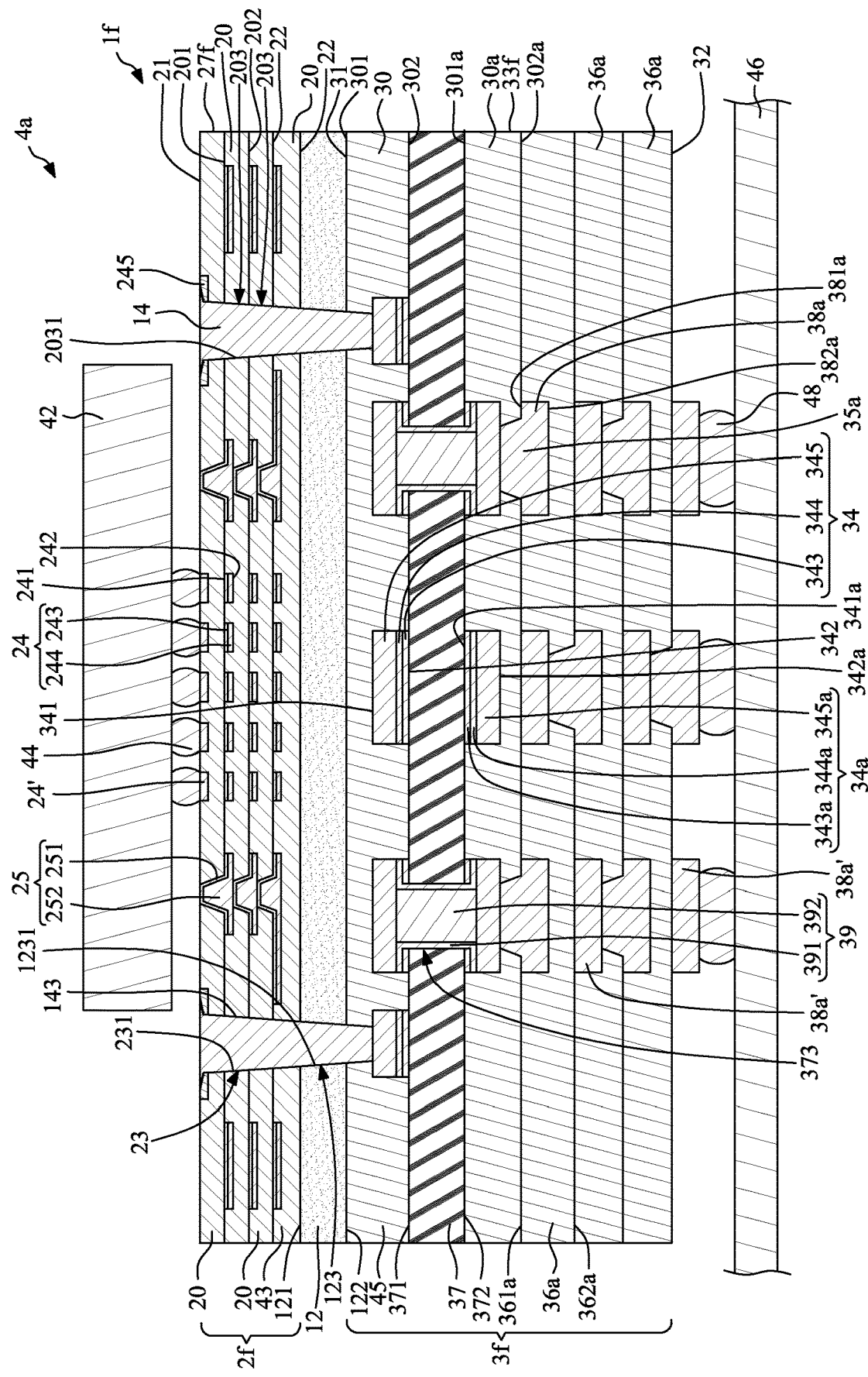
FIG. 14 illustrates a cross-sectional view of a bonding of a package structure and a substrate.

FIG. 14 illustrates a cross-sectional view of a bonding of a package structure 4a and a substrate 46 according to some embodiments. The package structure 4a includes a wiring structure 1f, a semiconductor chip 42, a plurality of first connecting elements 44 and a plurality of second connecting elements 48. The wiring structure if is similar to the wiring structure 1e shown in FIG. 12, except for structures of an upper conductive structure 2f and a lower conductive structure 3f. The upper conductive structure 2f and the lower conductive structure 3f are both dice and may be singulated concurrently. Thus, the wiring structure if is a unit structure. That is, a lateral peripheral surface 27f of the upper conductive structure 2f, a lateral peripheral surface 33f of the lower conductive structure 3f and a lateral peripheral surface of the intermediate layer 12 are substantially coplanar with each other.

The semiconductor chip 42 is electrically connected and bonded to the topmost circuit layer 24' of the upper conductive structure 2f through the first connecting elements 44 (e.g., solder bumps or other conductive bumps). The bottommost second lower circuit layer 38a' of the lower conductive structure 3f is electrically connected and bonded to the substrate 46 (e.g., a mother board such as a PCB) through the second connecting elements 48 (e.g., solder bumps or other conductive bumps).

Figure 15:
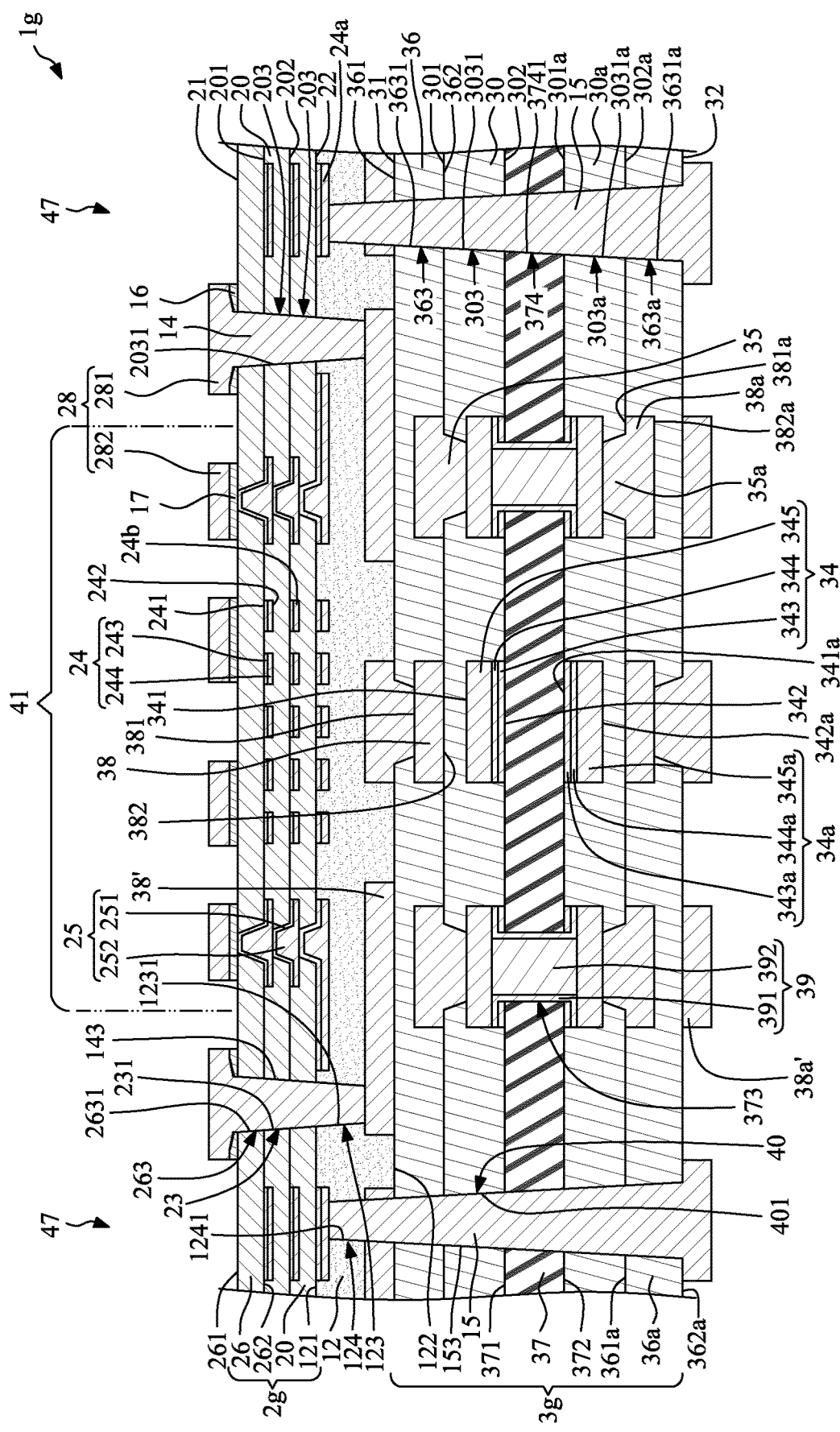
FIG. 15 illustrates a cross-sectional view of a wiring structure according to some embodiments of the present disclosure.

FIG. 15 illustrates a cross-sectional view of a wiring structure 1g according to some embodiments of the present disclosure. The wiring structure 1g is similar to the wiring structure 1 shown in FIG. 1, except for structures of an upper conductive structure 2g and a lower conductive structure 3g. In addition, at least one lower through via 15 is further included.

As shown in FIG. 15, the lower conductive structure 3g defines a single through hole 40 having an inner surface 401. The core portion 37 defines a plurality of second through holes 374 extending through the core portion 37. Each of the second through holes 374 has an inner surface 3741. The first upper dielectric layer 30 defines a through hole 303 having an inner surface 3031. The second upper dielectric layer 36 defines a through hole 363 having an inner surface 3631. The first lower dielectric layer 30a defines a through hole 303a having an inner surface 3031a. The second lower dielectric layer 36a defines a through hole 363a having an inner surface 3631a. The through hole 363, the through holes 303, the second through hole 374, the through hole 303a and the through hole 363a are collectively configured to define or form a portion of the single through hole 40 for accommodating the lower through via 15. As shown in FIG. 15, cross-sectional views of one side of the inner surface 3631 of the through hole 363, the inner surfaces 3031 of the through holes 303, the inner surface 3741 of the second through hole 374, the inner surface 3031a of the through hole 303a and the inner surface 3631a of the through hole 363a are segments of a substantially straight line. That is, cross-sectional views of one side of the inner surface 3631 of the through hole 363, the inner surfaces 3031 of the through holes 303, the inner surface 3741 of the second through hole 374, the inner surface 3031a of the through hole 303a and the inner surface 3631a of the through hole 363a may extend along the same substantially straight line. The single through hole 40 extends through the lower conductive structure 3g, that is, the single through hole 40 extends from the bottom surface 32 of the lower conductive structure 3g to the top surface 31 of the lower conductive structure 3g. The single through hole 40 tapers upwardly.

In addition, a thickness of a bottommost first circuit layer 24a of the upper conductive structure 2g is greater than a thickness of the second circuit layer 24b, such as about 1.1 times or greater, about 1.3 times or greater, or about 1.5 times or greater. For example, the thickness of the first circuit layer 24a may be about 4 µm, and the thickness of the second circuit layer 24b may be about 3 µm. This is because the first circuit layer 24a may be use to block a laser beam in a manufacturing process. The bottommost circuit layer 24a (e.g., the first circuit layer 24a) is disposed on and protrudes from the bottom surface 22 of the upper conductive structure 2g (e.g., the bottom surface 202 of the bottommost first dielectric layer 20).

The lower through via 15 is formed or disposed in the single through hole 40. Thus, the lower through via 15 extends through at least a portion of the lower conductive structure 3g and the intermediate layer 12, and is electrically connected to a circuit layer (e.g., the bottom surface of the first circuit layer 24a) of the upper conductive structure 2g. As shown in FIG. 15, the lower through via 15 extends through and contacts the topmost circuit layer (e.g., the second upper circuit layer 38') of the lower conductive structure 3g, and terminates at or on, and contacts a portion of the bottommost circuit layer (e.g., the bottom surface of the first circuit layer 24a) of the upper conductive structure 2g. The lower through via 15 extends from the bottom surface 32 of the lower conductive structure 3g to the top portion of the intermediate layer 12. Thus, the lower through via 15 extends to contact a portion of the upper conductive structure 2g, and the lower through via 15 does not extend through the upper conductive structure 2g. A length of the lower through via 15 is greater than a thickness of the low-density conductive structure (e.g., the lower conductive structure 3g). Further, the lower through via 15 tapers upwardly, that is, a size of a top portion of the lower through via 15 is smaller than a size of a bottom portion of the lower through via 15. Thus, a tapering direction of the inner via 25 of the upper conductive structure 2g is the same as a tapering direction of the lower through via 15. In some embodiments, the lower through via 15 is a monolithic structure or one-piece structure having a homogeneous material composition, and a peripheral surface 153 of the lower through via 15 is a substantially continuous surface without boundaries. The lower through via 15 and the second lower circuit layer 38a' may be formed integrally as a monolithic or one-piece structure. The size of the top portion of the lower through via 15 may be substantially equal to the size of the bottom portion of the upper through via 14, and the tapering direction of the lower through via 15 may be different from the tapering direction of the upper through via 14.

Figure 16:
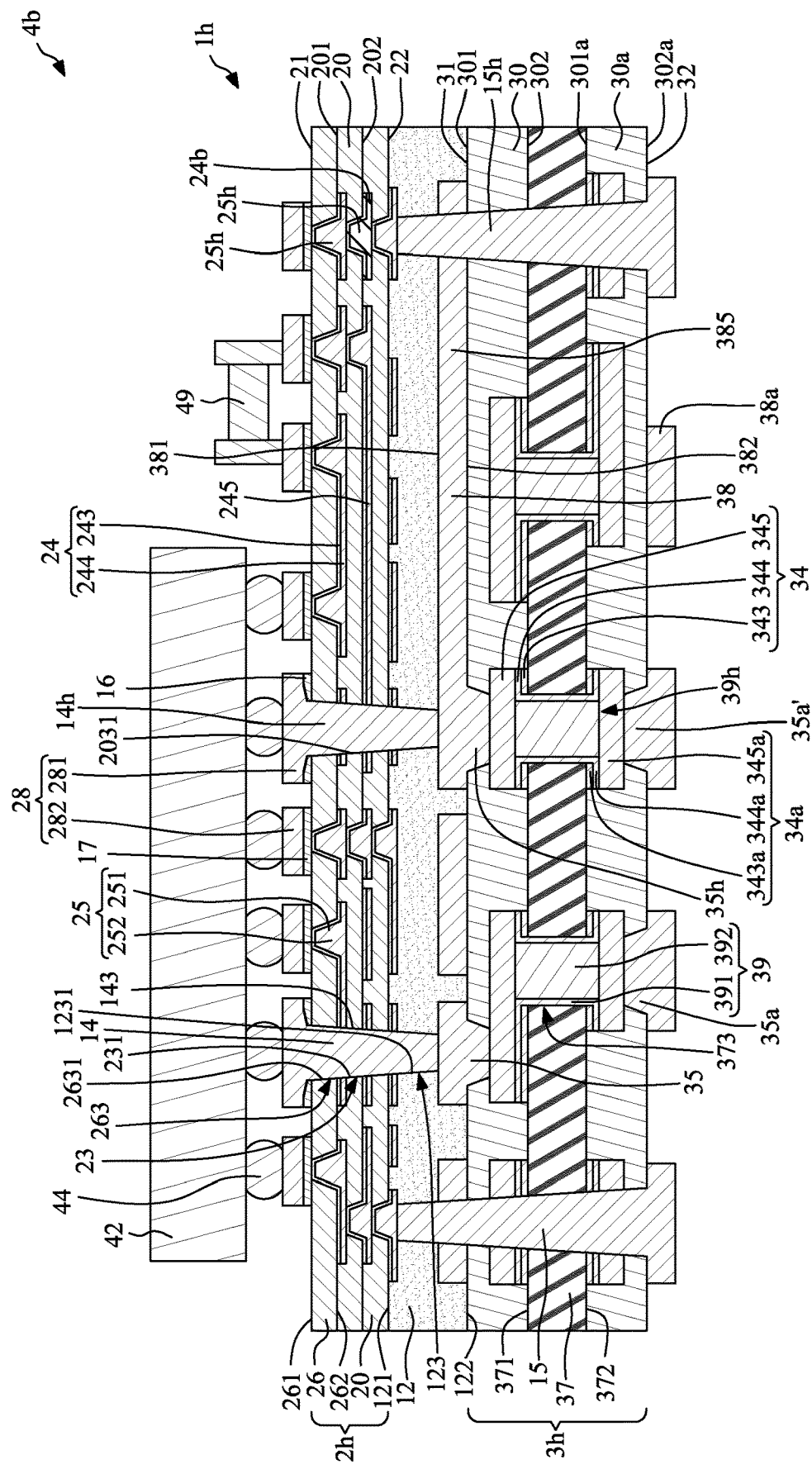
FIG. 16 illustrates a cross-sectional view of a package structure according to some embodiments of the present disclosure.

FIG. 16 illustrates a cross-sectional view of a package structure 4b according to some embodiments of the present disclosure. The package structure 4b includes a wiring structure 1h, a semiconductor chip 42, a plurality of first connecting elements 44 and at least one passive component 49. The wiring structure 1h of FIG. 16 is similar to the wiring structure 1d shown in FIG. 11, except for structures of an upper conductive structure 2h and a lower conductive structure 3h. In the upper conductive structure 2h, an upper through via 14h may be disposed under the semiconductor chip 42, and one of the circuit layers (e.g., the second circuit layer 24b) may include one or more traces (e.g., high-density traces) and a ground plane 245 for grounding. In some embodiments, a plurality of upper through vias 14h may be disposed parallel or laterally adjacent to each other to form a first via wall (or a fence structure). Further, a plurality of inner vias 25h may be stacked on each other to form a columnar structure, and a plurality of columnar structures may be disposed parallel or laterally adjacent to each other to form a second via wall (or a fence structure). The upper conductive structure 2h can provide a signal transmission between semiconductor chips 42, between a semiconductor chip 42 and a passive component 49, and/or between passive components 49. Such transmitted signals may exclude power signals. For example, the upper conductive structure 2h can provide excellent stability of signal transmissions of radio frequency (RF) signals and high-speed digital signals. The high-speed digital signals and RF/analog modulation signals can be arranged on the same layer or on different layers. In order to prevent the RF/analog modulation signals from being interfered by the high-speed digital signals, two kinds of layouts for two situations may be designed as follows. In the first situation that the high-speed digital signals and RF/analog modulation signals are arranged on the same layer, the above-mentioned first via wall or second via wall can achieve a function of signal isolation. That is, the first via wall or the second via wall can be disposed between the high-speed digital signals and the RF/analog modulation signals. In the second situation that the high-speed digital signals and RF/analog modulation signals are arranged on the different layers, the above-mentioned ground plane 245 can achieve a function of signal isolation. That is, the ground plane 245 can be disposed between the high-speed digital signals and the RF/analog modulation signals.

In the lower conductive structure 3h, the second upper circuit layer 38', the second upper dielectric layer 36, the second lower circuit layer 38a' and the second lower dielectric layer 36a are omitted. Further, a lower through via 15h may be disposed under the stacked inner vias 25h, and one of the circuit layers (e.g., the second upper circuit layers 38) may include one or more traces (e.g., low-density traces) and a ground plane 385 for grounding. The lower conductive structure 3h can provide a power signal transmission between semiconductor chips 42, between a semiconductor chip 42 and a passive component 49, and/or between passive components 49. It is noted that the circuit layers (e.g., the upper circuit layers 34, 38 and the lower circuit layers 34a, 38a) have the characteristic of low direct current (DC) impedance and low parasitic capacitance. Further, the ground plane 385 can achieve a function of signal isolation between the lower conductive structure 3h and the upper conductive structure 2h.

The common grounding of the wiring structure 1h can be achieved by the following two paths. The first path is a combination of the ground plane 245, the ground plane 385, the upper through via 14h, the upper interconnection via 35h, an interconnection via 39h and a lower interconnection via 35a'. The second path is a combination of the ground plane 245, the ground plane 385, the stacked inner vias 25h and the lower through via 15h. In addition, the first via wall may further include the upper interconnection via 35h, the interconnection via 39h and the lower interconnection via 35a' under the upper through via 14h to form an extended first via wall. The second via wall may further include the lower through via 15h under the stacked inner vias 25h to form an extended second via wall. The extended first via wall and the extended second via wall can prevent the signals from leaking when they are disposed adjacent to the lateral peripheral surface of the wiring structure 1h.

FIG. 17 through FIG. 53 illustrate a method for manufacturing a wiring structure according to some embodiments of the present disclosure. In some embodiments, the method is for manufacturing the wiring structure 1 shown in FIG. 1 and/or the package structure 4 shown in FIG. 11.

Figure 17:
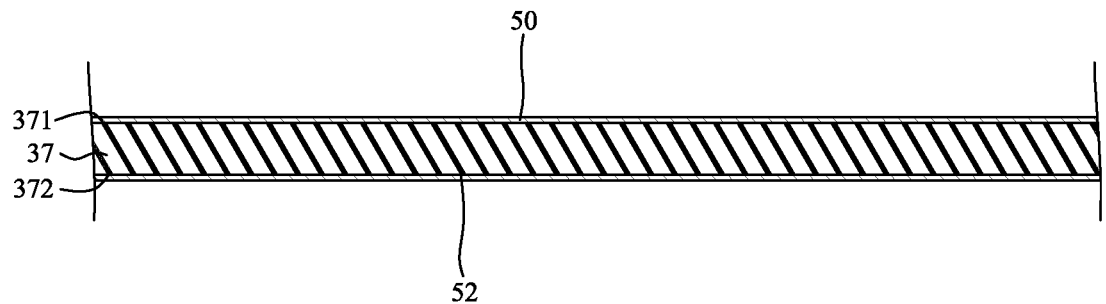
FIG. 17 illustrates one or more stages of an example of a method for manufacturing a wiring structure according to some embodiments of the present disclosure.

Referring to FIG. 17 through FIG. 36, a lower conductive structure 3 is provided. The lower conductive structure 3 is manufactured as follows. Referring to FIG. 17, a core portion 37 with a top copper foil 50 and a bottom copper foil 52 is provided. The core portion 37 may be in a wafer type, a panel type or a strip type. The core portion 37 has a top surface 371 and a bottom surface 372 opposite to the top surface 371. The top copper foil 50 is disposed on the top surface 371 of the core portion 37, and the bottom copper foil 52 is disposed on the bottom surface 372 of the core portion 37.

Figure 18:
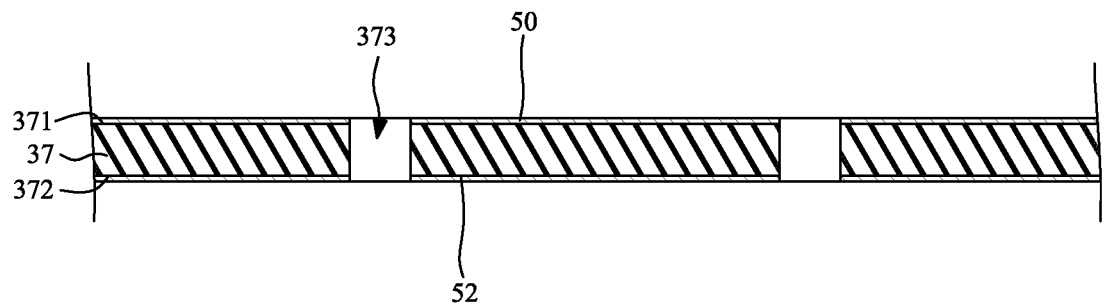
FIG. 18 illustrates one or more stages of an example of a method for manufacturing a wiring structure according to some embodiments of the present disclosure.

Referring to FIG. 18, a plurality of first through holes 373 are formed to extend through the core portion 37, the top copper foil 50 and the bottom copper foil 52 by a drilling technique (such as laser drilling or mechanical drilling) or other suitable techniques.

Figure 19:
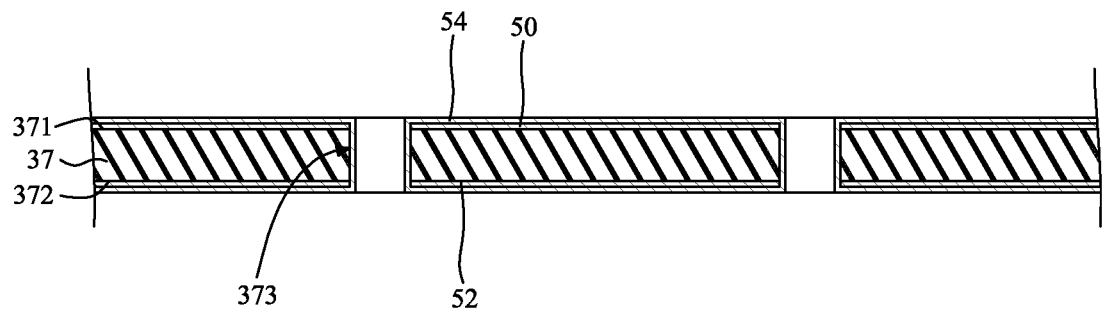
FIG. 19 illustrates one or more stages of an example of a method for manufacturing a wiring structure according to some embodiments of the present disclosure.

Referring to FIG. 19, a second metallic layer 54 is formed or disposed on the top copper foil 50, the bottom copper foil 52 and side walls of the first through holes 373 by a plating technique or other suitable techniques. A portion of the second metallic layer 54 on the side wall of each first through hole 373 defines a central through hole.

Figure 20:
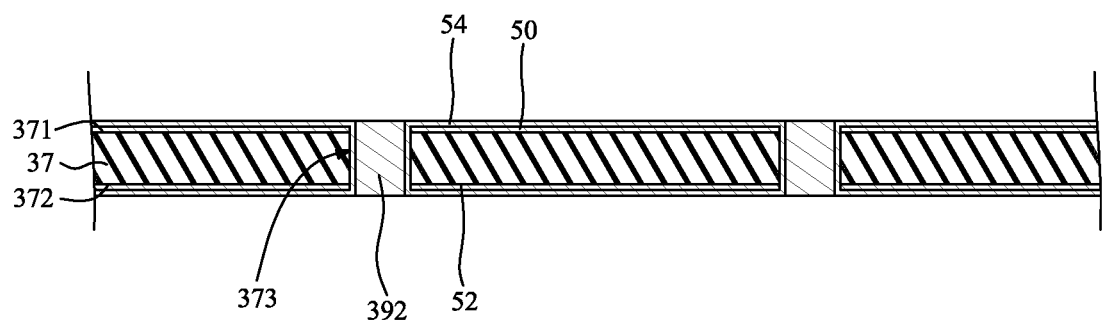
FIG. 20 illustrates one or more stages of an example of a method for manufacturing a wiring structure according to some embodiments of the present disclosure.

Referring to FIG. 20, an insulation material 392 is disposed to fill the central through hole defined by the second metallic layer 54.

Figure 21:
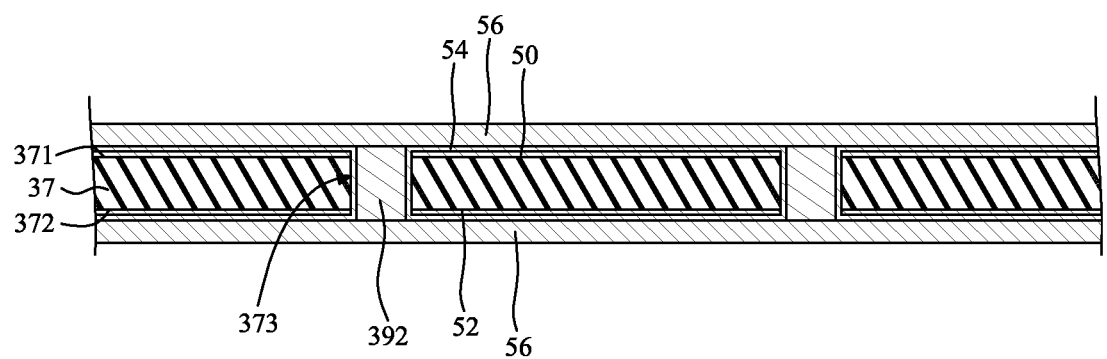
FIG. 21 illustrates one or more stages of an example of a method for manufacturing a wiring structure according to some embodiments of the present disclosure.

Referring to FIG. 21, a top third metallic layer 56 and a bottom third metallic layer 56 are formed or disposed on the second metallic layer 54 by a plating technique or other suitable techniques. The third metallic layers 56 cover the insulation material 392.

Figure 22:
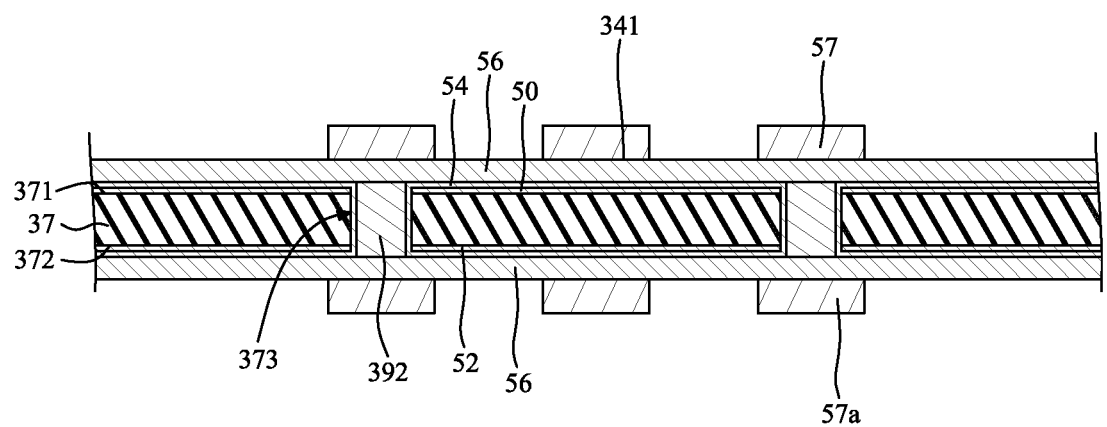
FIG. 22 illustrates one or more stages of an example of a method for manufacturing a wiring structure according to some embodiments of the present disclosure.

Referring to FIG. 22, a top photoresist layer 57 is formed or disposed on the top third metallic layer 56, and a bottom photoresist layer 57a is formed or disposed on the bottom third metallic layer 56. Then, the photoresist layers 57, 57a are patterned by exposure and development.

Figure 23:
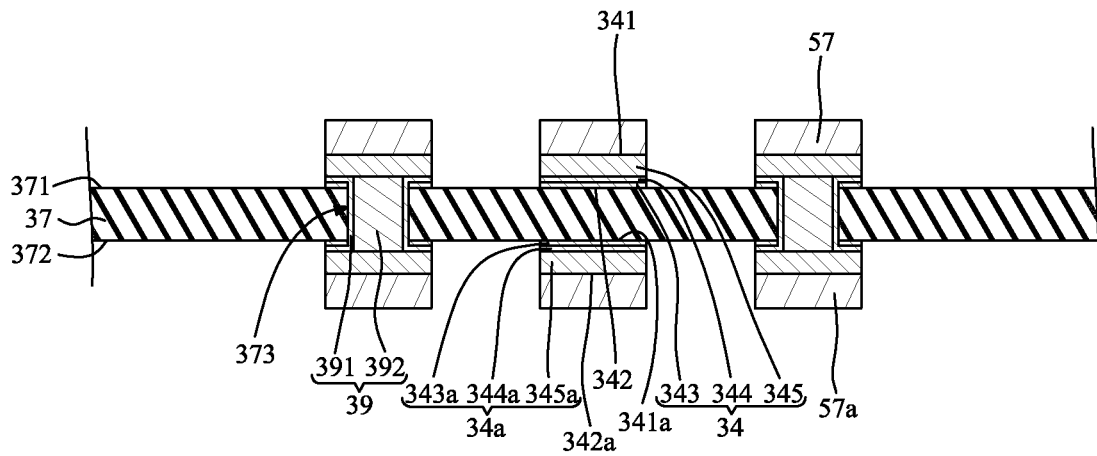
FIG. 23 illustrates one or more stages of an example of a method for manufacturing a wiring structure according to some embodiments of the present disclosure.

Referring to FIG. 23, portions of the top copper foil 50, the second metallic layer 54 and the top third metallic layer 56 that are not covered by the top photoresist layer 57 are removed by an etching technique or other suitable techniques. Portions of the top copper foil 50, the second metallic layer 54 and the top third metallic layer 56 that are covered by the top photoresist layer 57 remain to form a first upper circuit layer 34. Meanwhile, portions of the bottom copper foil 52, the second metallic layer 54 and the bottom third metallic layer 56 that are not covered by the bottom photoresist layer 57a are removed by an etching technique or other suitable techniques. Portions of the bottom copper foil 52, the second metallic layer 54 and the bottom third metallic layer 56 that are covered by the bottom photoresist layer 57a remain to form a first lower circuit layer 34a. Meanwhile, portions of the second metallic layer 54 and the insulation material 392 that are disposed in the first through hole 373 form an interconnection via 39. As shown in FIG. 23, the first upper circuit layer 34 has a top surface 341 and a bottom surface 342 opposite to the top surface 341. In some embodiments, the first upper circuit layer 34 is formed or disposed on the top surface 371 of the core portion 37. The bottom surface 342 of the first upper circuit layer 34 contacts the top surface 371 of the core portion 37. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a portion of the top copper foil 50. The second metallic layer 344 is disposed on the first metallic layer 343, and may be a plated copper layer formed from the second metallic layer 54. The third metallic layer 345 is disposed on the second metallic layer 344, and may be another plated copper layer formed from the top third metallic layer 56.

The first lower circuit layer 34a has a top surface 341a and a bottom surface 342a opposite to the top surface 341a. In some embodiments, the first lower circuit layer 34a is formed or disposed on the bottom surface 372 of the core portion 37. The top surface 341a of the first lower circuit layer 34a contacts the bottom surface 372 of the core portion 37. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a portion of the bottom copper foil 52. The second metallic layer 344a is disposed on the first metallic layer 343a, and may be a plated copper layer formed from the second metallic layer 54. The third metallic layer 345a is disposed on the second metal layer 344a, and may be another plated copper layer formed from the bottom third metallic layer 56. The interconnection via 39 includes a base metallic layer 391 formed from the second metallic layer 54 and the insulation material 392. In some embodiments, the interconnection via 39 may include a bulk metallic material that fills the first through hole 373. The interconnection via 39 electrically connects the first upper circuit layer 34 and the first lower circuit layer 34a.

Figure 24:
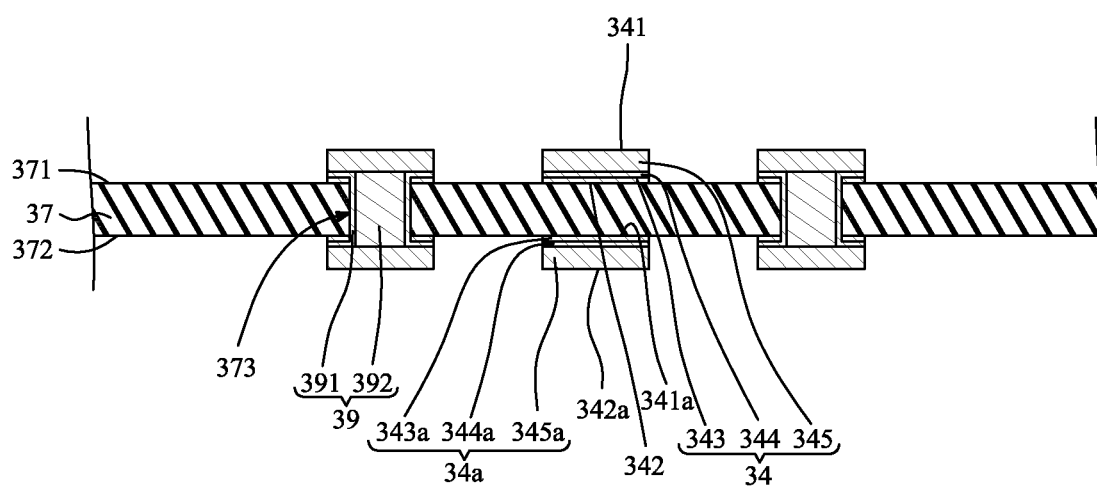
FIG. 24 illustrates one or more stages of an example of a method for manufacturing a wiring structure according to some embodiments of the present disclosure.

Referring to FIG. 24, the top photoresist layer 57 and the bottom photoresist layer 57a are removed by a stripping technique or other suitable techniques.

Figure 25:
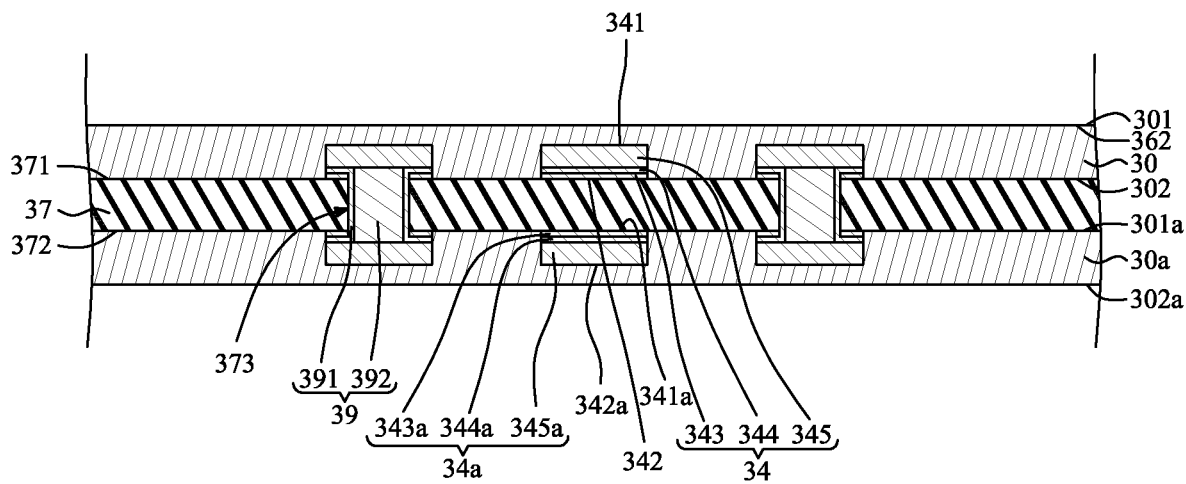
FIG. 25 illustrates one or more stages of an example of a method for manufacturing a wiring structure according to some embodiments of the present disclosure.

Referring to FIG. 25, a first upper dielectric layer 30 is formed or disposed on the top surface 371 of the core portion 37 to cover the top surface 371 of the core portion 37 and the first upper circuit layer 34 by a lamination technique or other suitable techniques. Meanwhile, a first lower dielectric layer 30a is formed or disposed on the bottom surface 372 of the core portion 37 to cover the bottom surface 372 of the core portion 37 and the first lower circuit layer 34a by a lamination technique or other suitable techniques.

Figure 26:
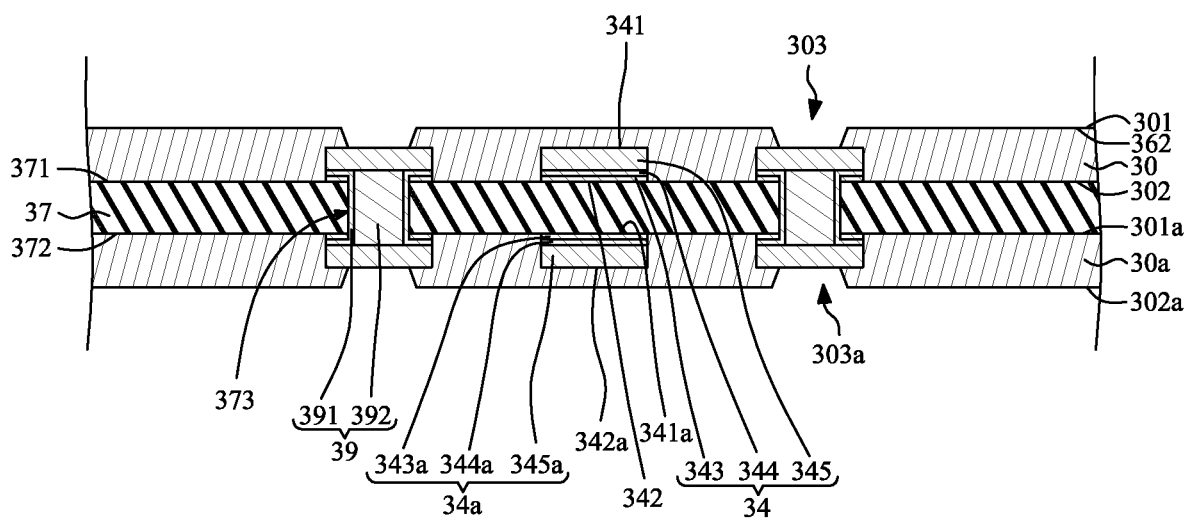
FIG. 26 illustrates one or more stages of an example of a method for manufacturing a wiring structure according to some embodiments of the present disclosure.

Referring to FIG. 26, at least one through hole 303 is formed to extend through the first upper dielectric layer 30 to expose a portion of the first upper circuit layer 34 by a drilling technique or other suitable techniques. Meanwhile, at least one through hole 303a is formed to extend through the first lower dielectric layer 30a to expose a portion of the first lower circuit layer 34a by a drilling technique or other suitable techniques.

Figure 27:
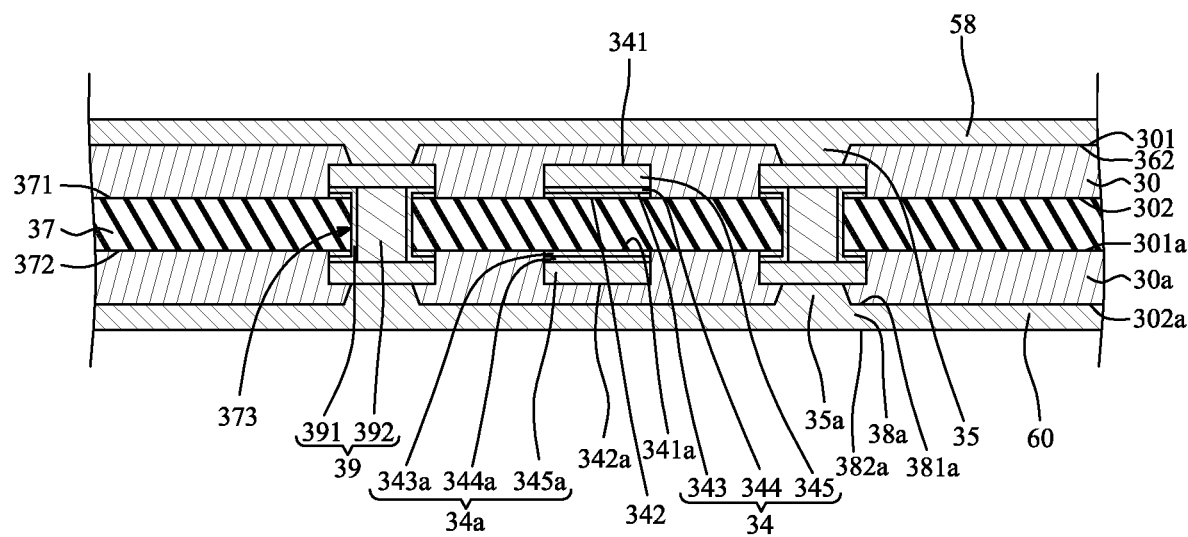
FIG. 27 illustrates one or more stages of an example of a method for manufacturing a wiring structure according to some embodiments of the present disclosure.

Referring to FIG. 27, a top metallic layer 58 is formed on the first upper dielectric layer 30 and in the through hole 303 to form an upper interconnection via 35 by a plating technique or other suitable techniques. Meanwhile, a bottom metallic layer 60 is formed on the first lower dielectric layer 30a and in the through hole 303a to form a lower interconnection via 35a by a plating technique or other suitable techniques. As shown in FIG. 27, the upper interconnection via 35 tapers downwardly, and the lower interconnection via 35a tapers upwardly.

Figure 28:
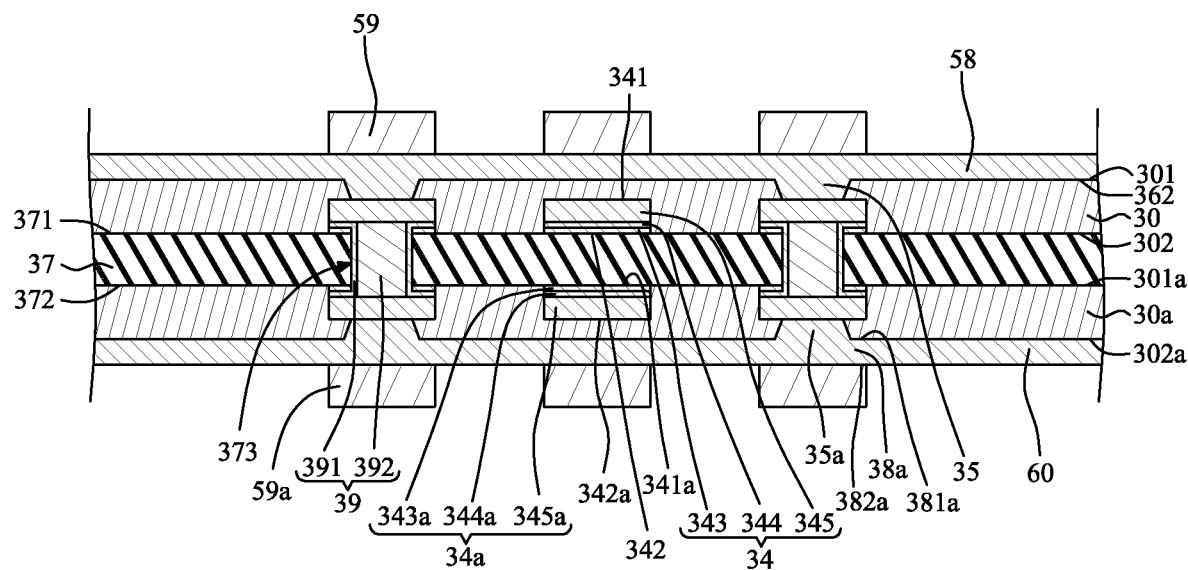
FIG. 28 illustrates one or more stages of an example of a method for manufacturing a wiring structure according to some embodiments of the present disclosure.

Referring to FIG. 28, a top photoresist layer 59 is formed or disposed on the top metallic layer 58, and a bottom photoresist layer 59a is formed or disposed on the bottom metallic layer 60. Then, the photoresist layers 59, 59a are patterned by exposure and development.

Figure 29:
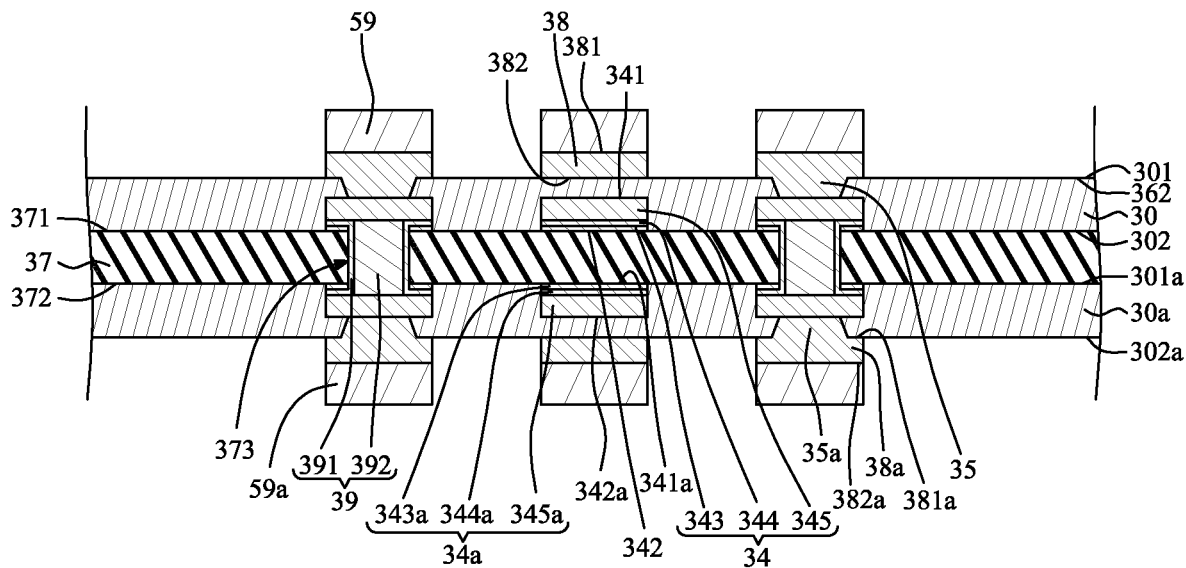
FIG. 29 illustrates one or more stages of an example of a method for manufacturing wiring structure according to some embodiments of the present disclosure.

Referring to FIG. 29, portions of the top metallic layer 58 that are not covered by the top photoresist layer 59 are removed by an etching technique or other suitable techniques. Portions of the top metallic layer 58 that are covered by the top photoresist layer 59 remain to form a second upper circuit layer 38. Meanwhile, portions of the bottom metallic layer 60 that are not covered by the bottom photoresist layer 59a are removed by an etching technique or other suitable techniques. Portions of the bottom metallic layer 60 that are covered by the bottom photoresist layer 59a remain to form a second lower circuit layer 38a.

Figure 30:
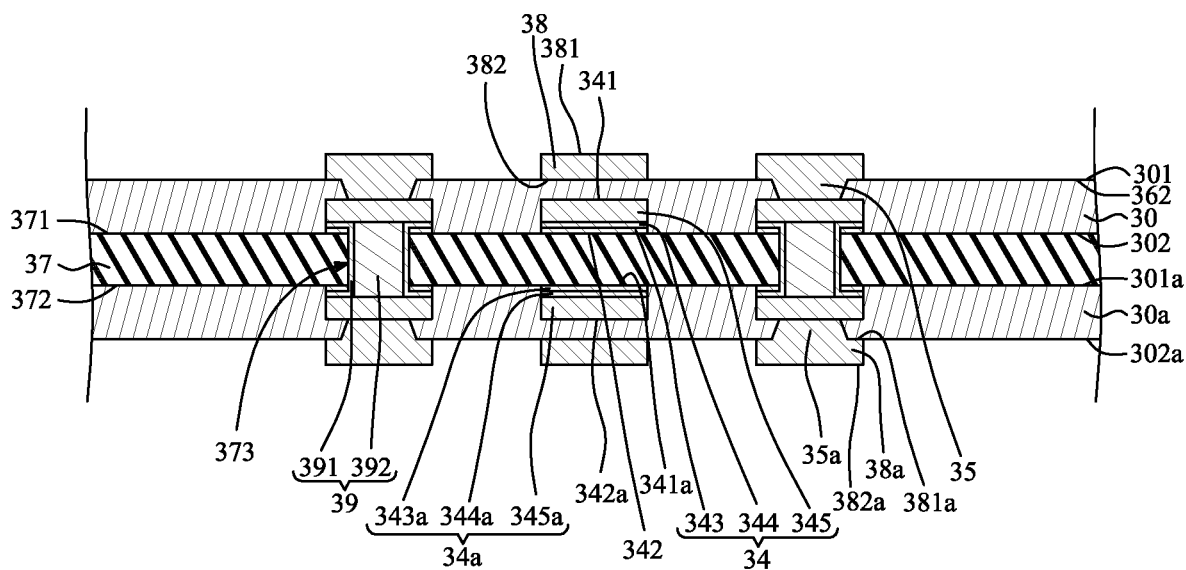
FIG. 30 illustrates one or more stages of an example of a method for manufacturing a wiring structure according to some embodiments of the present disclosure.

Referring to FIG. 30, the top photoresist layer 59 and the bottom photoresist layer 59a are removed by a stripping technique or other suitable techniques.

Figure 31:
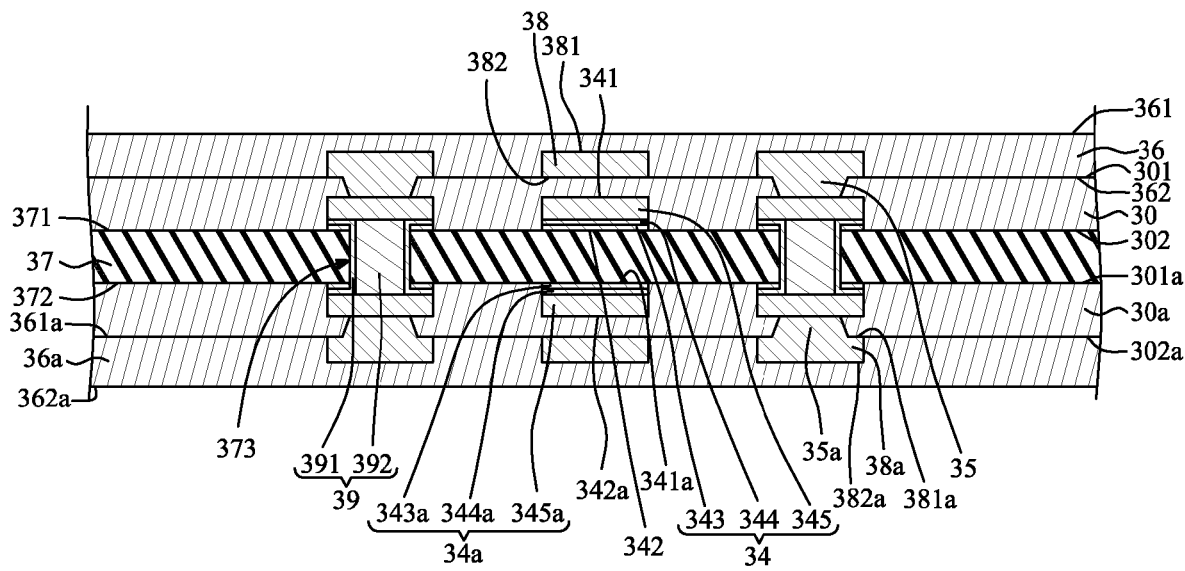
FIG. 31 illustrates one or more stages of an example of a method for manufacturing a wiring structure according to some embodiments of the present disclosure.

Referring to FIG. 31, a second upper dielectric layer 36 is formed or disposed on the top surface 301 of the first upper dielectric layer 30 to cover the top surface 301 of the first upper dielectric layer 30 and the second upper circuit layer 38 by a lamination technique or other suitable techniques. Meanwhile, a second lower dielectric layer 36a is formed or disposed on the bottom surface 302a of the first lower dielectric layer 30a to cover the bottom surface 302a of the first lower dielectric layer 30a and the second lower circuit layer 38a by a lamination technique or other suitable techniques.

Figure 32:
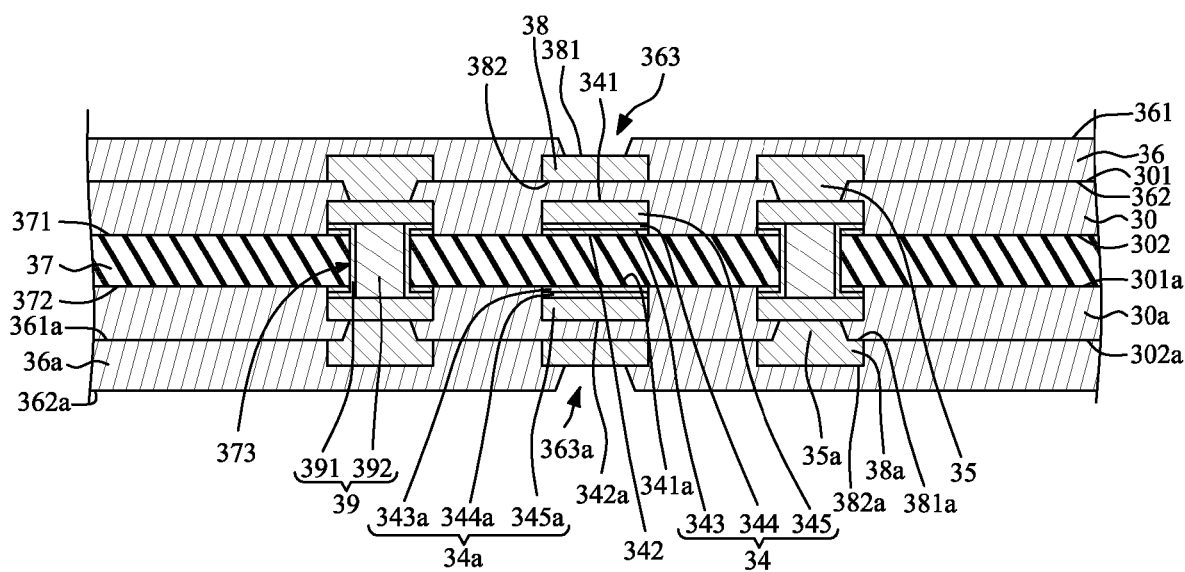
FIG. 32 illustrates one or more stages of an example of a method for manufacturing a wiring structure according to some embodiments of the present disclosure.

Referring to FIG. 32, at least one through hole 363 is formed to extend through the second upper dielectric layer 36 to expose a portion of the second upper circuit layer 38 by a drilling technique or other suitable techniques. Meanwhile, at least one through hole 363a is formed to extend through the second lower dielectric layer 36a to expose a portion of the second lower circuit layer 38a by a drilling technique or other suitable techniques.

Figure 33:
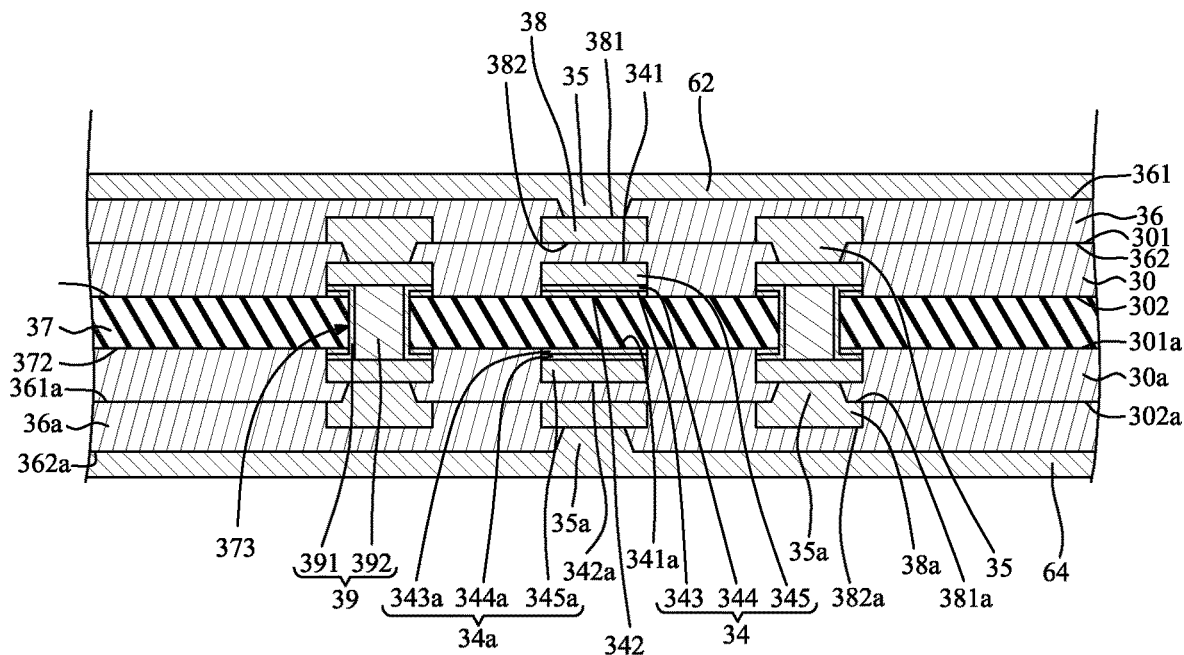
FIG. 33 illustrates one or more stages of an example of a method for manufacturing a wiring structure according to some embodiments of the present disclosure.

Referring to FIG. 33, a top metallic layer 62 is formed on the second upper dielectric layer 36 and in the through hole 363 to form an upper interconnection via 35 by a plating technique or other suitable techniques. Meanwhile, a bottom metallic layer 64 is formed on the second lower dielectric layer 36a and in the through hole 363a to form a lower interconnection via 35a by a plating technique or other suitable techniques.

Figure 34:
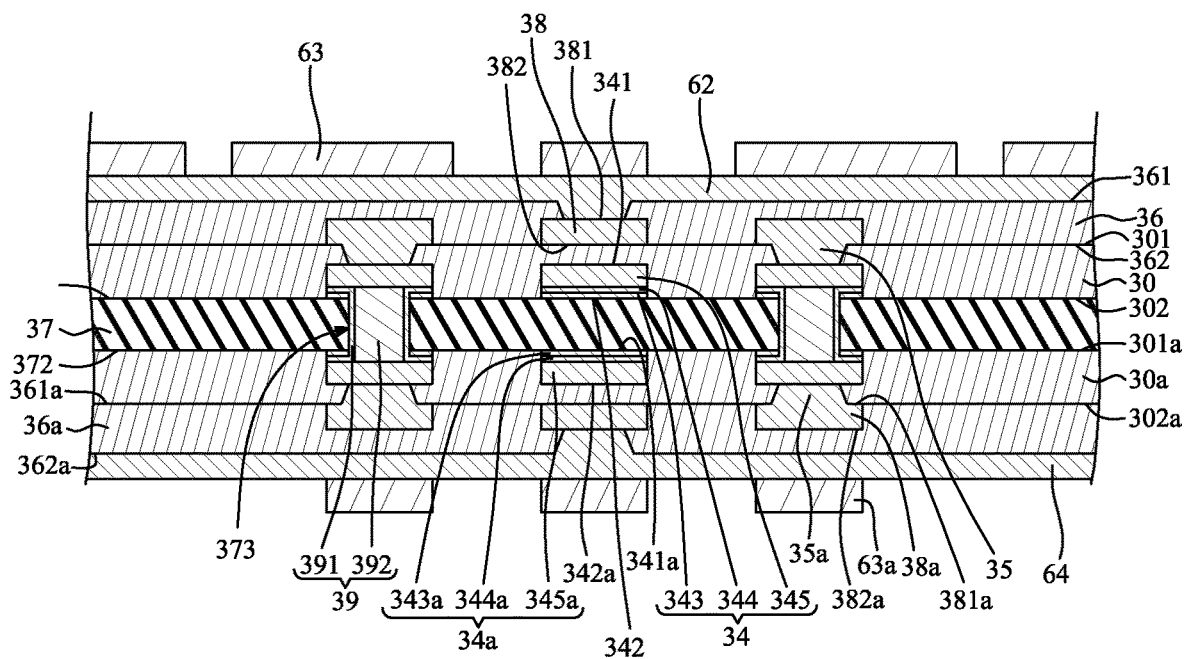
FIG. 34 illustrates one or more stages of an example of a method for manufacturing a wiring structure according to some embodiments of the present disclosure.

Referring to FIG. 34, a top photoresist layer 63 is formed or disposed on the top metallic layer 62 and a bottom photoresist layer 63a is formed or disposed on the bottom metallic layer 64. Then, the photoresist layers 63, 63a are patterned by exposure and development.

Figure 35:
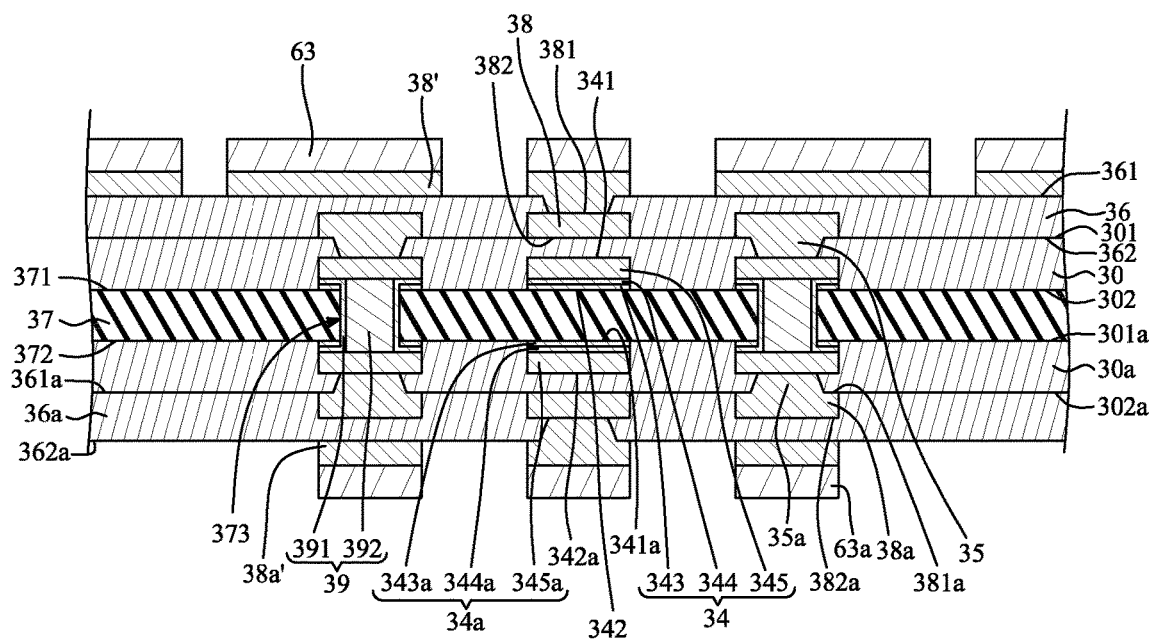
FIG. 35 illustrates one or more stages of an example of a method for manufacturing a wiring structure according to some embodiments of the present disclosure.

Referring to FIG. 35, portions of the top metallic layer 62 that are not covered by the top photoresist layer 63 are removed by an etching technique or other suitable techniques. Portions of the top metallic layer 62 that are covered by the top photoresist layer 63 remain to form a second upper circuit layer 38'. Meanwhile, portions of the bottom metallic layer 64 that are not covered by the bottom photoresist layer 63a are removed by an etching technique or other suitable techniques. Portions of the bottom metallic layer 64 that are covered by the bottom photoresist layer 63a remain to form a second lower circuit layer 38a'.

Figure 36:
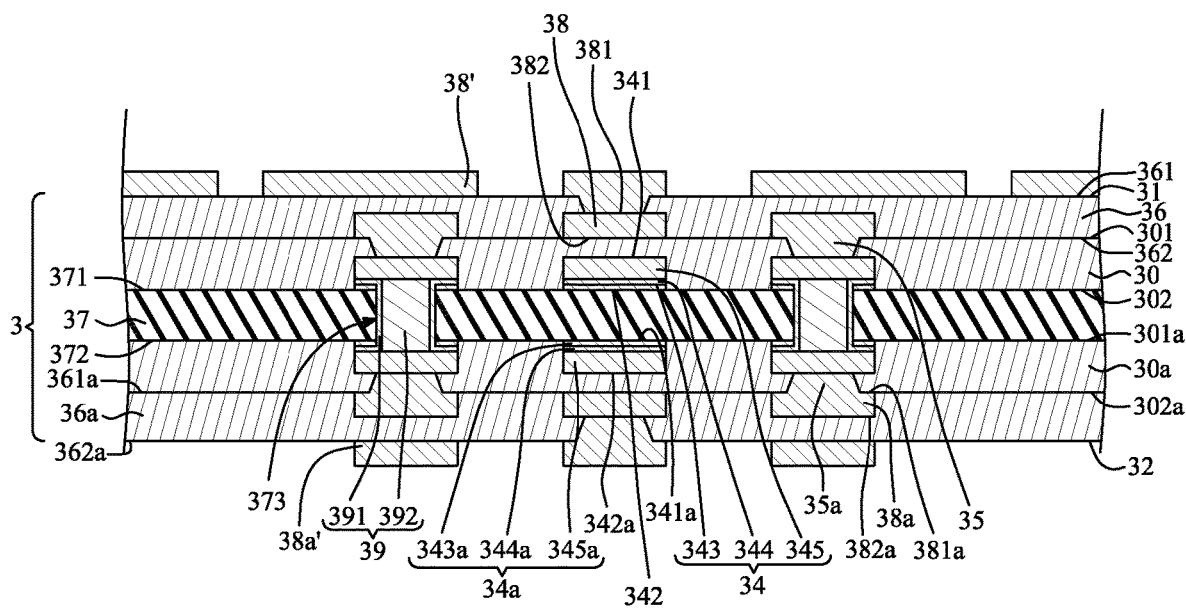
FIG. 36 illustrates one or more stages of an example of a method for manufacturing a wiring structure according to some embodiments of the present disclosure.

Referring to FIG. 36, the top photoresist layer 63 and the bottom photoresist layer 63a are removed by a stripping technique or other suitable techniques. Meanwhile, the lower conductive structure 3 is formed, and the dielectric layers (including, the first upper dielectric layer 30, the second upper dielectric layer 36, the first lower dielectric layer 30a and the second lower dielectric layer 36a) are cured. At least one of the circuit layers (including, for example, one first upper circuit layer 34, two second upper circuit layers 38, 38', one first lower circuit layer 34a and two second lower circuit layers 38a, 38a') is in contact with at least one of the dielectric layers (e.g., the first upper dielectric layer 30, the second upper dielectric layer 36, the first lower dielectric layer 30a and the second lower dielectric layer 36a). Then, an electrical property (such as open circuit/short circuit) of the lower conductive structure 3 is tested.

Figure 37:
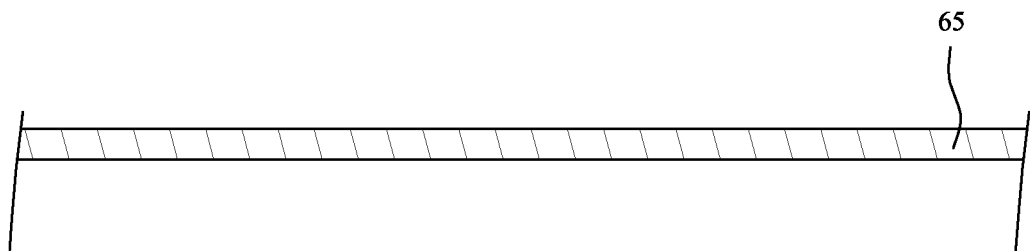
FIG. 37 illustrates one or more stages of an example of a method for manufacturing a wiring structure according to some embodiments of the present disclosure.

Referring to FIG. 37 through FIG. 47, an upper conductive structure 2 is provided. The upper conductive structure 2 is manufactured as follows. Referring to FIG. 37, a carrier 65 is provided. The carrier 65 may be a glass carrier, and may be in a wafer type, a panel type or a strip type.

Figure 38:
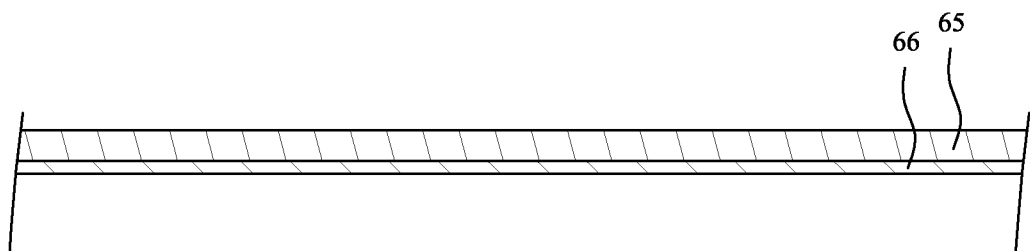
FIG. 38 illustrates one or more stages of an example of a method for manufacturing a wiring structure according to some embodiments of the present disclosure.

Referring to FIG. 38, a release layer 66 is coated on a bottom surface of the carrier 65.

Figure 39:
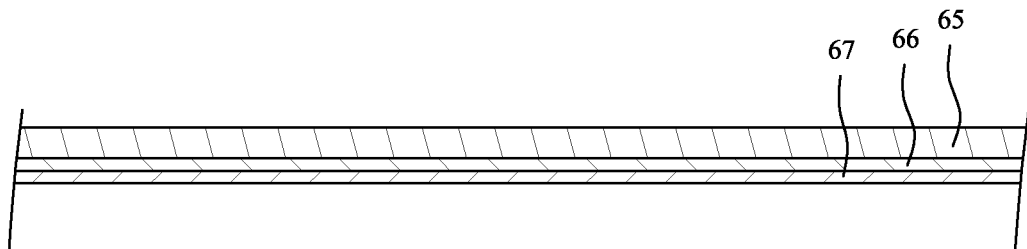
FIG. 39 illustrates one or more stages of an example of a method for manufacturing a wiring structure according to some embodiments of the present disclosure.

Referring to FIG. 39, a conductive layer 67 (e.g., a seed layer) is formed or disposed on the release layer 66 by a physical vapor deposition (PVD) technique or other suitable techniques.

Figure 40:
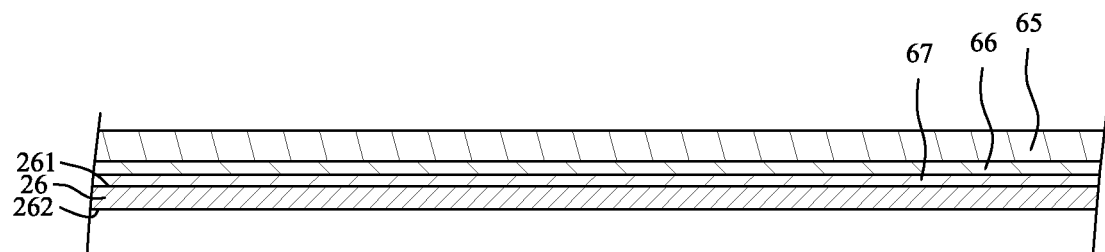
FIG. 40 illustrates one or more stages of an example of a method for manufacturing wiring structure according to some embodiments of the present disclosure.

Referring to FIG. 40, a second dielectric layer 26 is formed on the conductive layer 67 by a coating technique or other suitable techniques.

Figure 41:
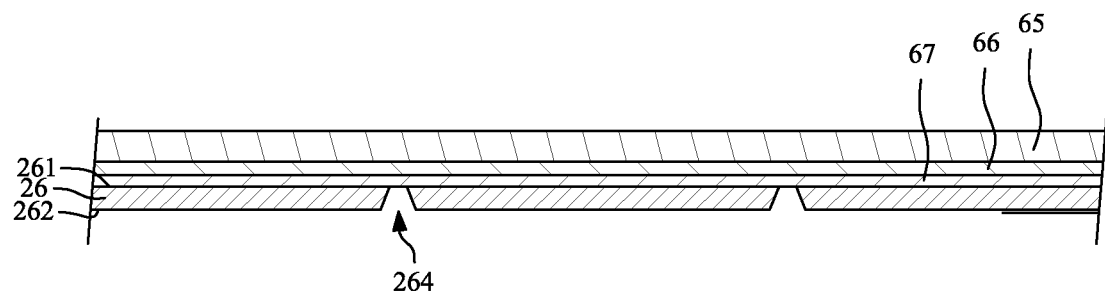
FIG. 41 illustrates one or more stages of an example of a method for manufacturing a wiring structure according to some embodiments of the present disclosure.

Referring to FIG. 41, at least one through hole 264 is formed to extend through the second dielectric layer 26 to expose a portion of the conductive layer 67 by an exposure and development technique or other suitable techniques.

Figure 42:
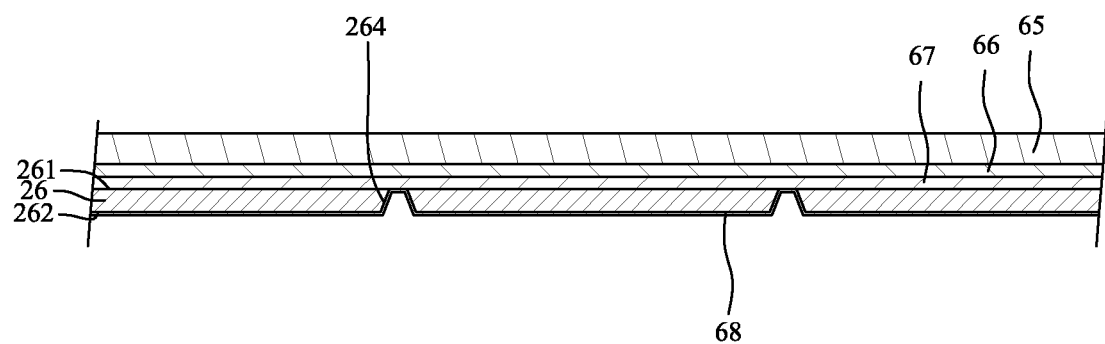
FIG. 42 illustrates one or more stages of an example of a method for manufacturing a wiring structure according to some embodiments of the present disclosure.

Referring to FIG. 42, a seed layer 68 is formed on a bottom surface 262 of the second dielectric layer 26 and in the through hole 264 by a PVD technique or other suitable techniques.

Figure 43:
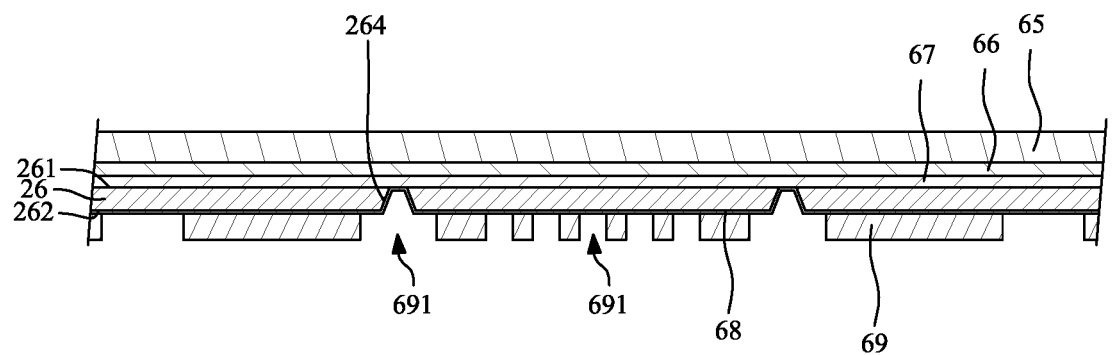
FIG. 43 illustrates one or more stages of an example of a method for manufacturing a wiring structure according to some embodiments of the present disclosure.

Referring to FIG. 43, a photoresist layer 69 is formed on the seed layer 68. Then, the photoresist layer 69 is patterned to expose portions of the seed layer 68 by an exposure and development technique or other suitable techniques. The photoresist layer 69 defines a plurality of openings 691. At least one opening 691 of the photoresist layer 69 corresponds to, and is aligned with, the through hole 264 of the second dielectric layer 26.

Figure 44:
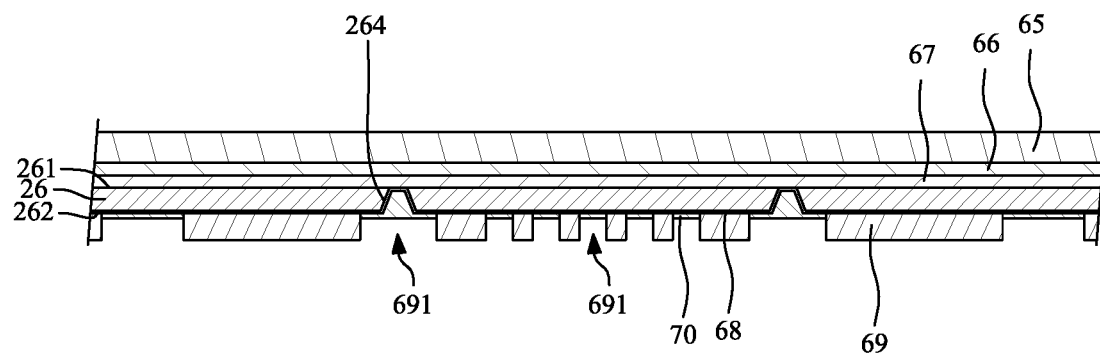
FIG. 44 illustrates one or more stages of an example of a method for manufacturing a wiring structure according to some embodiments of the present disclosure.

Referring to FIG. 44, a conductive material 70 (e.g., a metallic material) is disposed in the openings 691 of the photoresist layer 69 and on the seed layer 68 by a plating technique or other suitable techniques.

Figure 45:
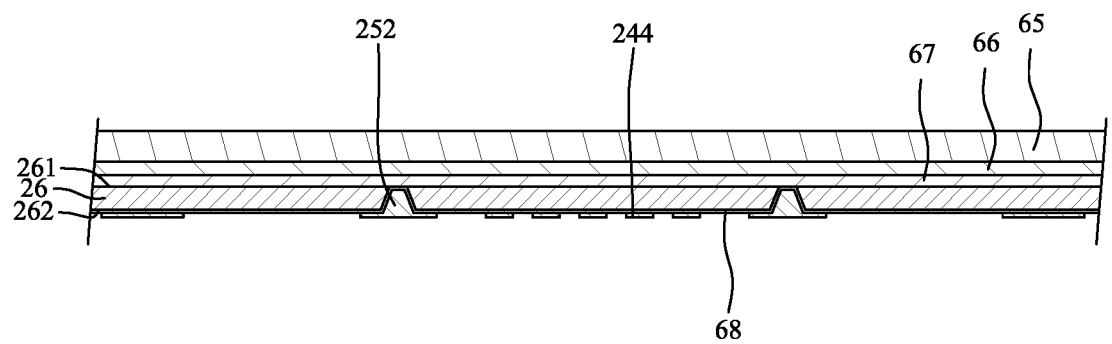
FIG. 45 illustrates one or more stages of an example of a method for manufacturing a wiring structure according to some embodiments of the present disclosure.

Referring to FIG. 45, the photoresist layer 69 is removed by a stripping technique or other suitable techniques.

Figure 46:
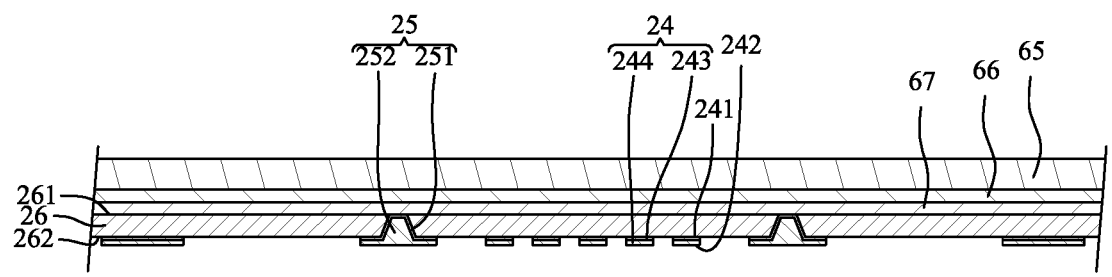
FIG. 46 illustrates one or more stages of an example of a method for manufacturing a wiring structure according to some embodiments of the present disclosure.

Referring to FIG. 46, portions of the seed layer 68 that are not covered by the conductive material 70 are removed by an etching technique or other suitable techniques. Meanwhile, a circuit layer 24 and at least one inner via 25 are formed. The circuit layer 24 may be a fan-out circuit layer or an RDL, and an L/S of the circuit layer 24 may be less than or equal to about 2 µm/about 2 µm, or less than or equal to about 1.8 µm/about 1.8 µm. The circuit layer 24 is disposed on the bottom surface 262 of the second dielectric layer 26. In some embodiments, the circuit layer 24 may include a seed layer 243 formed from the seed layer 68 and a conductive material 244 (e.g., a metallic material) disposed on the seed layer 243 and formed from the conductive material 70. The inner via 25 is disposed in the through hole 264 of the second dielectric layer 26. In some embodiments, the inner via 25 may include a seed layer 251 and a conductive material 252 (e.g., a metallic material) disposed on the seed layer 251. The inner via 25 tapers upwardly.

Figure 47:
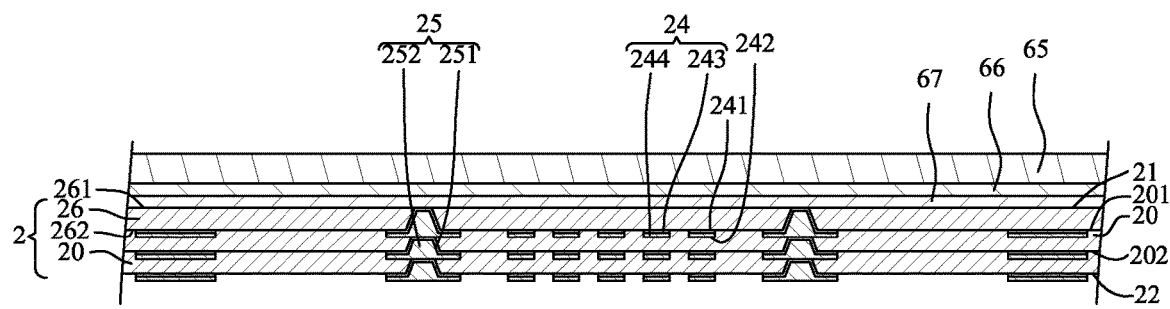
FIG. 47 illustrates one or more stages of an example of a method for manufacturing a wiring structure according to some embodiments of the present disclosure.

Referring to FIG. 47, a plurality of first dielectric layers 20 and a plurality of circuit layers 24 are formed by repeating the stages of FIG. 40 to FIG. 46. In some embodiments, each circuit layer 24 is embedded in the corresponding first dielectric layer 20, and a top surface 241 of the circuit layer 24 may be substantially coplanar with a top surface 201 of the first dielectric layer 20. Meanwhile, the upper conductive structure 2 is formed, and the dielectric layers (including, the first dielectric layers 20 and the second dielectric layer 26) are cured. At least one of the circuit layers (including, for example, three circuit layers 24) is in contact with at least one of the dielectric layers (e.g., the first dielectric layers 20 and the second dielectric layer 26). Then, an electrical property (such as open circuit/short circuit) of the upper conductive structure 2 is tested.

Figure 48:
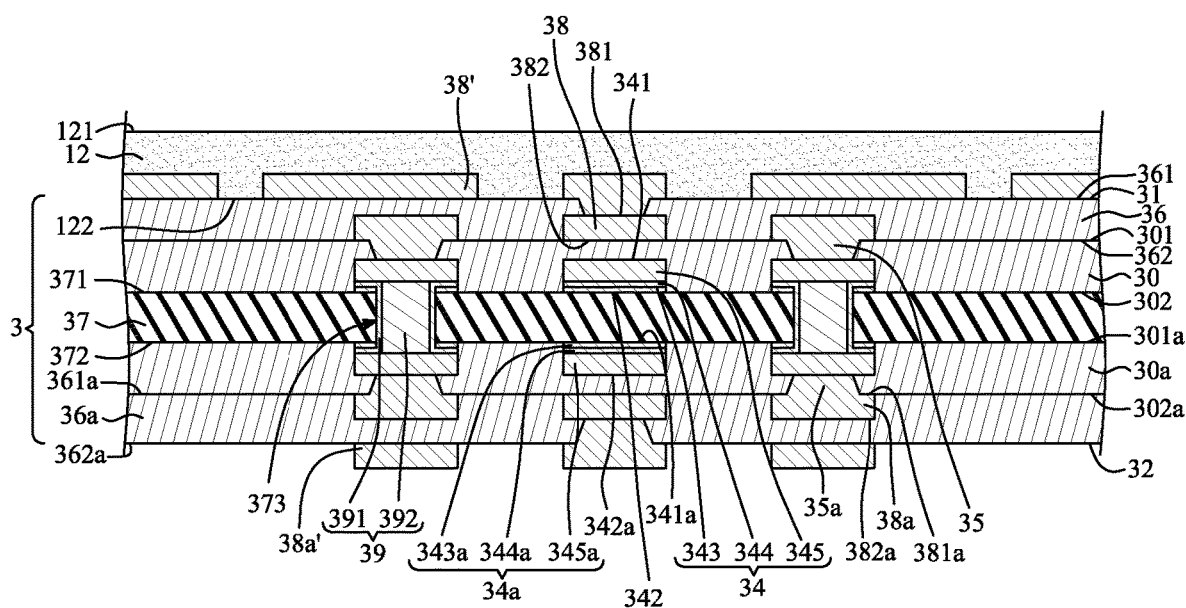
FIG. 48 illustrates one or more stages of an example of a method for manufacturing a wiring structure according to some embodiments of the present disclosure.

Referring to FIG. 48, an adhesive layer 12 is formed or applied on the top surface 31 of the lower conductive structure 3.

Figure 49:
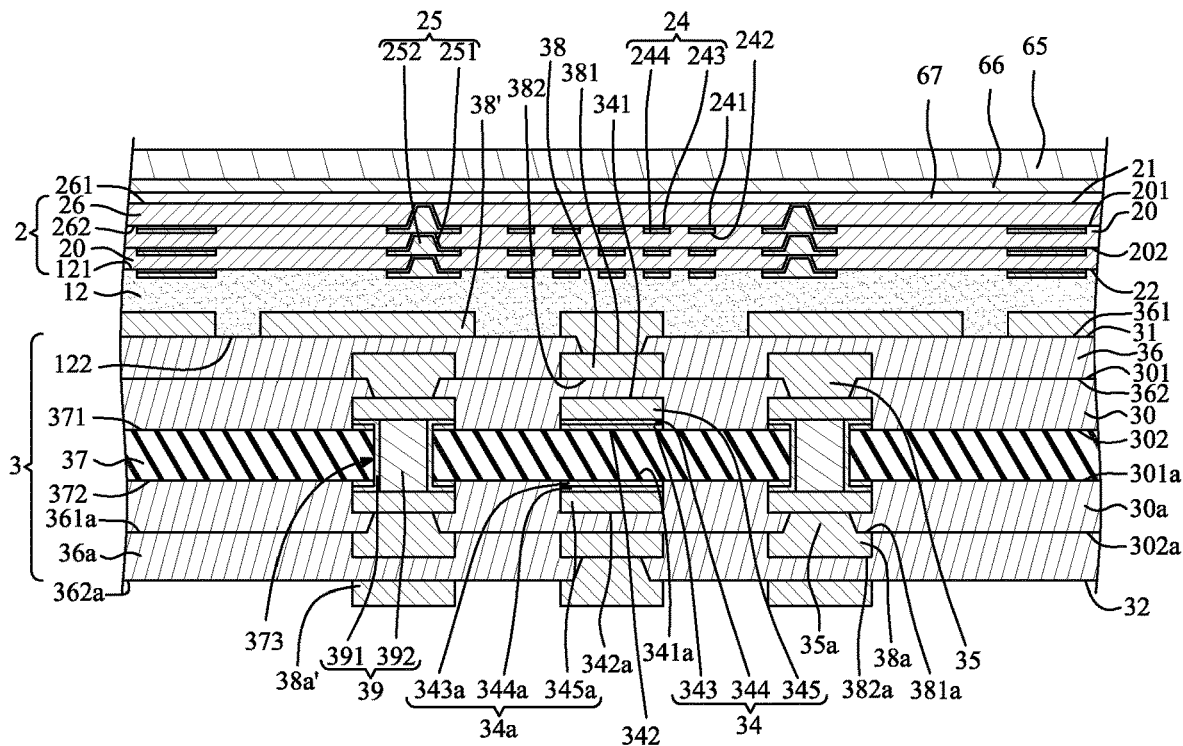
FIG. 49 illustrates one or more stages of an example of a method for manufacturing a wiring structure according to some embodiments of the present disclosure.

Referring to FIG. 49, the upper conductive structure 2 is attached to the lower conductive structure 3 through the adhesive layer 12. In some embodiments, the known good upper conductive structure 2 is attached to the known good lower conductive structure 3. Then, the adhesive layer 12 is cured to form an intermediate layer 12. In some embodiments, the upper conductive structure 2 may be pressed onto the lower conductive structure 3. Thus, the thickness of the intermediate layer 12 is determined by the gap between the upper conductive structure 2 and the lower conductive structure 3. The top surface 121 of the intermediate layer 12 contacts the bottom surface 22 of the upper conductive structure 2 (that is, the bottom surface 22 of the upper conductive structure 2 is attached to the top surface 121 of the intermediate layer 12), and the bottom surface 122 of the intermediate layer 12 contacts the top surface 31 of the lower conductive structure 3. Thus, the bottommost circuit layer 24 (e.g., the first circuit layer 24a) of the upper conductive structure 2 and the second upper circuit layer 38' of the lower conductive structure 3 are embedded in the intermediate layer 12. In some embodiments, a bonding force between two adjacent dielectric layers (e.g., two adjacent first dielectric layers 20) of the upper conductive structure 2 is greater than a bonding force between a dielectric layer (e.g., the bottommost first dielectric layer 20) of the upper conductive structure 2 and the intermediate layer 12. A surface roughness of a boundary between two adjacent dielectric layers (e.g., two adjacent first dielectric layers 20) of the upper conductive structure 2 is greater than a surface roughness of a boundary between a dielectric layer (e.g., the bottommost first dielectric layer 20) of the upper conductive structure 2 and the intermediate layer 12.

Figure 50:
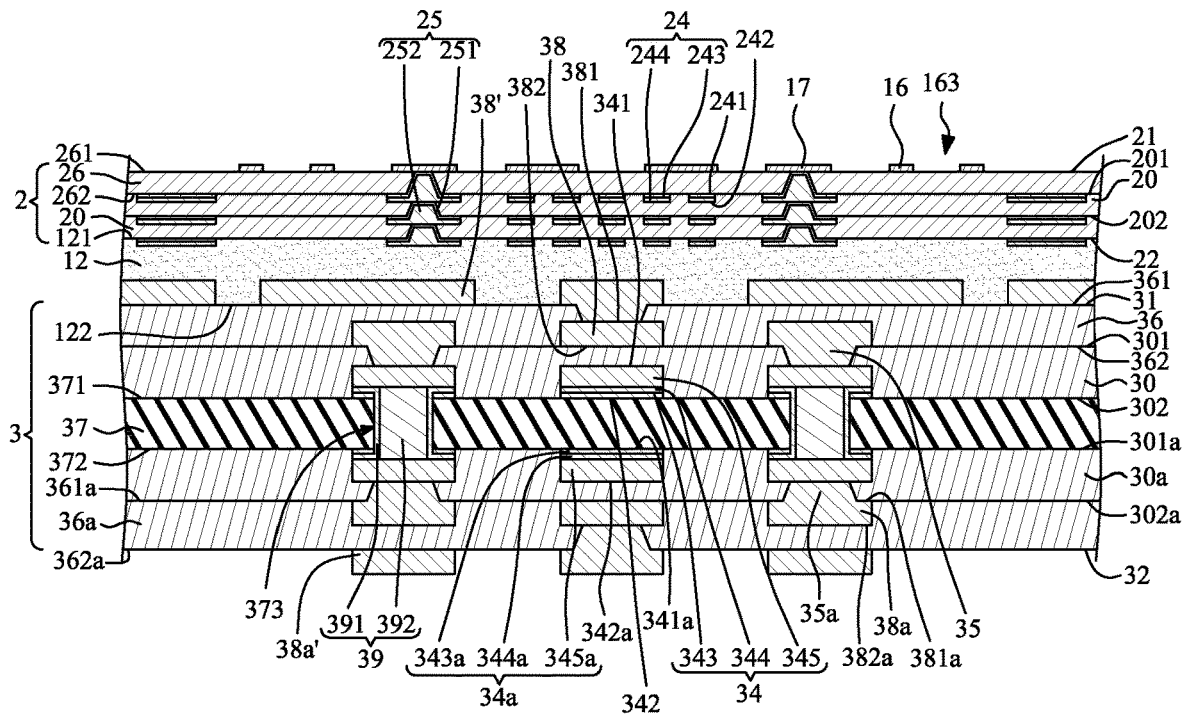
FIG. 50 illustrates one or more stages of an example of a method for manufacturing a wiring structure according to some embodiments of the present disclosure.
Figure 51:
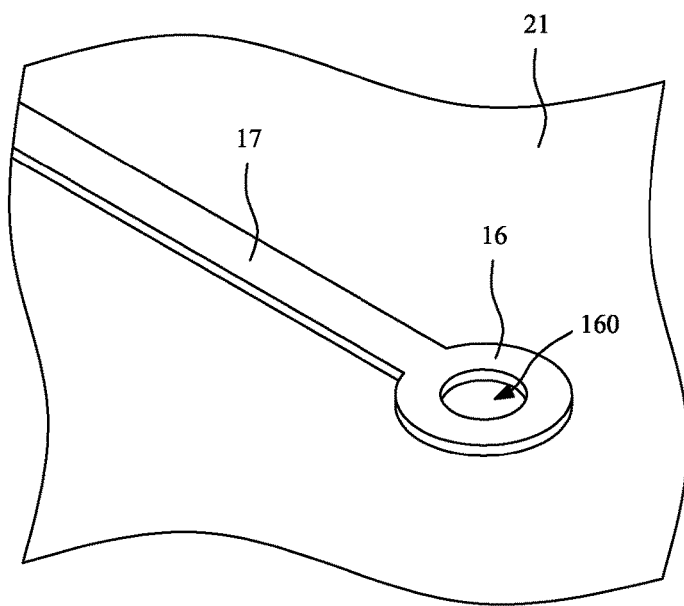
FIG. 51 illustrates one or more stages of an example of a method for manufacturing a wiring structure according to some embodiments of the present disclosure.

Referring to FIG. 50 and FIG. 51, wherein FIG. 51 is a perspective view of a surface trace 17 and a surface structure 16. The carrier 65, the release layer 66 and the conductive layer 67 are removed so as to expose a portion of the inner via 25. Then, at least one surface trace 17 and the surface structure 16 are formed on the top surface 21 of the upper conductive structure 2. The surface trace 17 and the surface structure 16 are formed as follows. A metallic layer is formed on the entire top surface 21 of the upper conductive structure 2. Then, the metallic layer is patterned by lithography (e.g., exposure and development) to form the surface trace 17, the surface structure 16 and a through hole 163 in the surface structure 16. The surface trace 17 is electrically connected to the surface structure 16, and may be formed integrally with the surface structure 16 as a monolithic or one-piece structure. The through hole 163 of the surface structure 16 is formed by lithography rather than drilling, and a width (e.g., a diameter) of the through hole 163 can be reduced to less than or equal to about 20 µm, such as about 20 µm, about 15 µm or about 10 µm. Further, the inner surface of the through hole 163 may be substantially perpendicular to the top surface 21 of the conductive structure 2.

Figure 53:
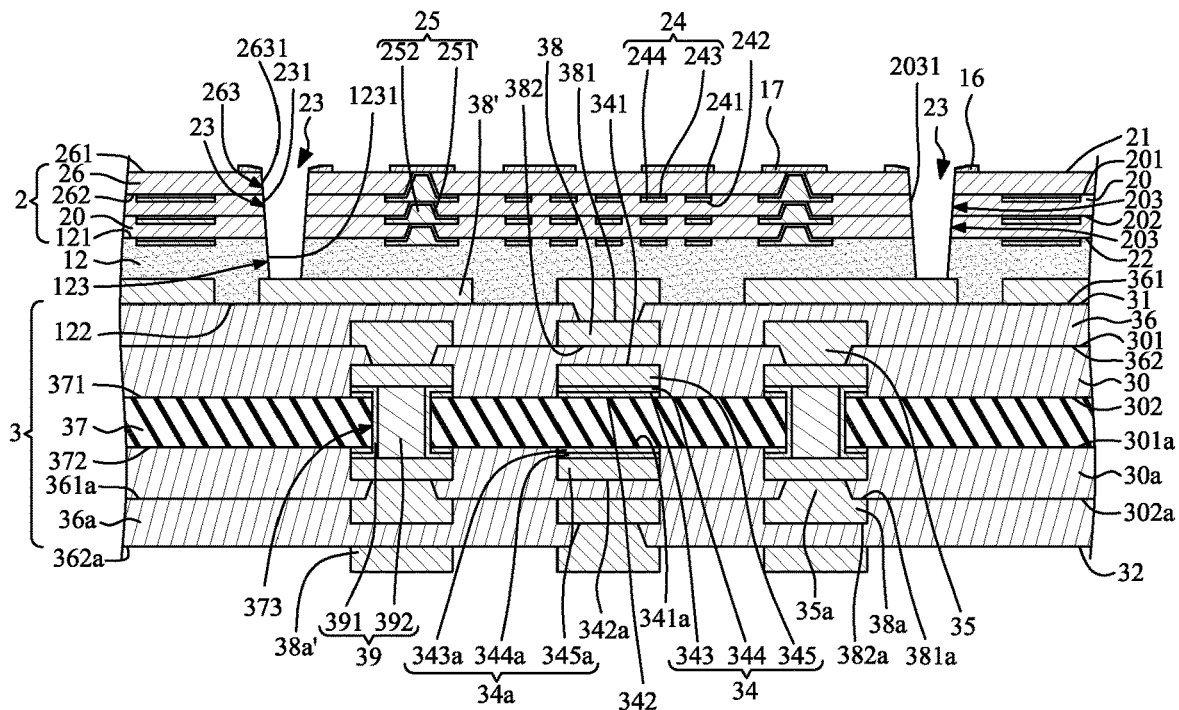
FIG. 53 illustrates one or more stages of an example of a method for manufacturing a wiring structure according to some embodiments of the present disclosure.

Referring to FIG. 52 and FIG. 53, a laser beam 9 is applied to the surface structure 16 and the top surface 21 of the upper conductive structure 2. The laser beam 9 may be a carbon dioxide ($CO_2$) laser or ultraviolet (UV) laser. A first portion 91 of the laser beam 9 is blocked by a solid portion of the surface structure 16, and a second portion 92 of the laser beam 9 passes through the through hole 163 of the surface structure 16 to form a through hole 23 in the upper conductive structure 2 and the intermediate layer 12 to expose the circuit layer (e.g., the second upper circuit layer 38') of the lower conductive structure 3. That is, the single through hole 23 is formed by laser drilling with the surface structure 16 serving as a mask (or a sacrificial layer). A power of the laser beam 9 is set to be low (e.g., about 800 KW), which can penetrate through the second dielectric layer 26 and the first dielectric layers 20 but does not penetrate through a metallic portion of the surface structure 16. In some embodiments, the power of the laser beam 9 is consistent during the drilling process. That is, the power of the laser beam 9 may not be changed throughout the drilling process. The width (e.g., the diameter) of the through hole 23 is determined by the width (e.g., the diameter) of the through hole 163 rather than the width (e.g., the diameter) of the laser beam 9. The laser beam 9 can remove a thickness of about 1 µm of a portion (e.g., a first portion 161) of the surface structure 16. Thus, after the laser drilling process, as shown in FIG. 2, a portion of the surface structure 16 (e.g., a part of the first portion 161) is removed by the laser beam; thus, a thickness of the first portion 161 is less than a thickness of a second portion 162. The first portion 161 has a non-consistent or varying thickness, and the second portion 162 has a substantially consistent thickness. A top surface of the first portion 161 is a slanted surface with the thickness of the first portion 161 tapering along a direction towards the through hole 163, and a surface roughness of the top surface of the first portion 161 is greater than a surface roughness of a top surface of the second portion 162, such as about 1.1 times or greater, about 1.3 times or greater, or about 1.5 times or greater in terms of root mean squared surface roughness. In addition, an inclination angle between the inner surface 231 of the through hole 23 and the top surface 21 of the conductive structure 2 is greater than about 90 degrees, such as about 93 degrees or greater, about 95 degrees or greater, or about 98 degrees or greater.

The through hole 23 may include a through hole 263 of the second dielectric layer 26, a plurality of through holes 203 of the first dielectric layers 20 and a through hole 123 of the intermediate layer 12. In some embodiments, the through hole 23 extends through the bottommost first circuit layer 24 of the upper conductive structure 2 and terminates at or on the topmost circuit layer (e.g., the second upper circuit layer 38') of the lower conductive structure 3. That is, the through hole 23 does not extend through the topmost circuit layer (e.g., the second upper circuit layer 38') of the lower conductive structure 3. As shown in FIG. 53, the through hole 23 tapers downwardly; that is, a size of a top portion of the through hole 23 is greater than a size of a bottom portion of the through hole 23. In addition, the inner surface 1231 of the through hole 123 of the intermediate layer 12 is coplanar with or aligned with the inner surfaces 2031 of the through holes 203 of the first dielectric layers 20 and the inner surface 2631 of the through hole 263 of the second dielectric layer 26. Thus, cross-sectional views of one side of the through hole 123 of the intermediate layer 12, the inner surfaces 2031 of the through holes 203 of the first dielectric layers 20 and the inner surface 2631 of the through hole 263 of the second dielectric layer 26 are segments of a substantially straight line. That is, cross-sectional views of one side of the inner surface 1231 of the through hole 123 of the intermediate layer 12, the inner surfaces 2031 of the through holes 203 of the first dielectric layers 20 and the inner surface 2631 of the through hole 263 of the second dielectric layer 26 may extend along the same substantially straight line. That is, the inner surface of the single through hole 23 may be a substantially smooth or continuous surface. A maximum width (e.g., at the top portion) of the single through hole 23 may be less than or equal to about 20 µm, such as about 20 µm, about 15 µm or about 10 µm Then, a metallic layer is formed on the surface trace 17, and the surface structure 16 to form at least one upper through via 14 in the through hole 23 and an outer circuit layer 28 (including a pad portion 281 and at least one surface trace 282) by a plating technique or other suitable techniques, so as to obtain the wiring structure 1 of FIG. 1.

Since the upper conductive structure 2 and the lower conductive structure 3 are manufactured separately, a warpage of the upper conductive structure 2 and a warpage of the lower conductive structure 3 are separated and will not influence each other. In some embodiments, a warpage shape of the upper conductive structure 2 may be different from a warpage shape of the lower conductive structure 3. For example, the warpage shape of the upper conductive structure 2 may be a convex shape, and the warpage shape of the lower conductive structure 3 may be a concave shape. In some embodiments, the warpage shape of the upper conductive structure 2 may be the same as the warpage shape of the lower conductive structure 3; however, the warpage of the lower conductive structure 3 will not be accumulated onto the warpage of the upper conductive structure 2. Thus, the yield of the wiring structure 1 may be improved. In addition, the lower conductive structure 3 and the upper conductive structure 2 may be tested individually before being bonded together. Therefore, known good lower conductive structure 3 and known good upper conductive structure 2 may be selectively bonded together. Bad (or unqualified) lower conductive structure 3 and bad (or unqualified) upper conductive structure 2 may be discarded. As a result, the yield of the wiring structure 1 may be further improved.

In some embodiments, a semiconductor chip 42 (FIG. 11) is electrically connected and bonded to the outer circuit layer 28 of the upper conductive structure 2 through a plurality of first connecting elements 44 (e.g., solder bumps or other conductive bumps). Then, the upper conductive structure 2, the intermediate layer 12 and the lower conductive structure 3 are singulated concurrently, so as to from a package structure 4 as shown in FIG. 11. The package structure 4 includes a wiring structure 1d and the semiconductor chip 42. The wiring structure 1d of FIG. 11 includes a singulated upper conductive structure 2d and a singulated lower conductive structure 3d. That is, a lateral peripheral surface 27d of the upper conductive structure 2d, a lateral peripheral surface 33d of the lower conductive structure 3d and a lateral peripheral surface of the intermediate layer 12 are substantially coplanar with each other. Then, the second lower circuit layer 38a' of the lower conductive structure 3d is electrically connected and bonded to a substrate 46 (e.g., a mother board such as a PCB) through a plurality of second connecting elements 48 (e.g., solder bumps or other conductive bumps).

Figure 54:
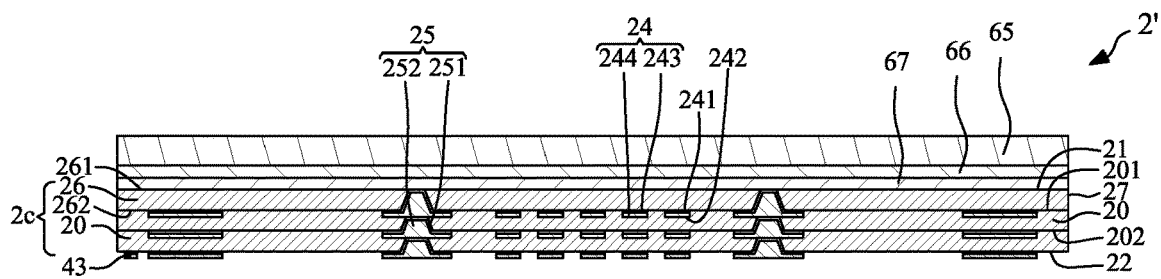
FIG. 54 illustrates one or more stages of an example of a method for manufacturing a wiring structure according to some embodiments of the present disclosure.

FIG. 54 through FIG. 57 illustrate a method for manufacturing a wiring structure according to some embodiments of the present disclosure. In some embodiments, the method is for manufacturing the wiring structure 1c shown in FIG. 10. The initial stages of the illustrated process are the same as, or similar to, the stages illustrated in FIG. 17 to FIG. 47. FIG. 54 depicts a stage subsequent to that depicted in FIG. 47.

Referring to FIG. 54, a fiducial mark 43 and the bottommost circuit layer 24 are formed concurrently and are at the same layer. Thus, the fiducial mark 43 is disposed on and protrudes from the bottom surface 22 of the upper conductive structure 2c. Then, the upper conductive structure 2c, the carrier 65, the release layer 66 and the conductive layer 67 are cut or singulated concurrently to form a plurality of strips 2'. Each of the strips 2' includes an upper conductive structure 2c that is a strip structure. Then, the strips 2' are tested. Alternatively, the upper conductive structure 2c may be tested before the cutting process.

Figure 55:
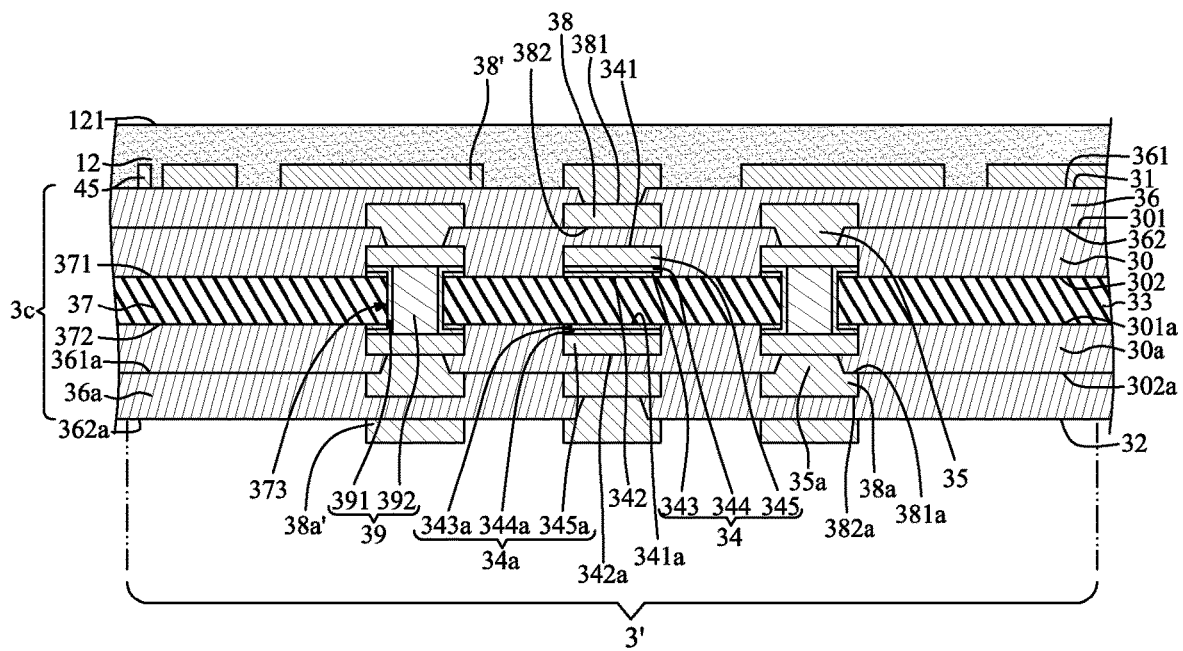
FIG. 55 illustrates one or more stages of an example of a method for manufacturing wiring structure according to some embodiments of the present disclosure.

Referring to FIG. 55, a fiducial mark 45 and the second upper circuit layer 38' are formed concurrently and at the same layer. Thus, the fiducial mark 45 is disposed on and protrudes from the top surface 31 of the lower conductive structure 3c. The lower conductive structure 3c includes a plurality of strip areas 3'. Then, the strip areas 3' are tested. Then, an adhesive layer 12 is formed or applied on the top surface 31 of the lower conductive structure 3c.

Figure 56:
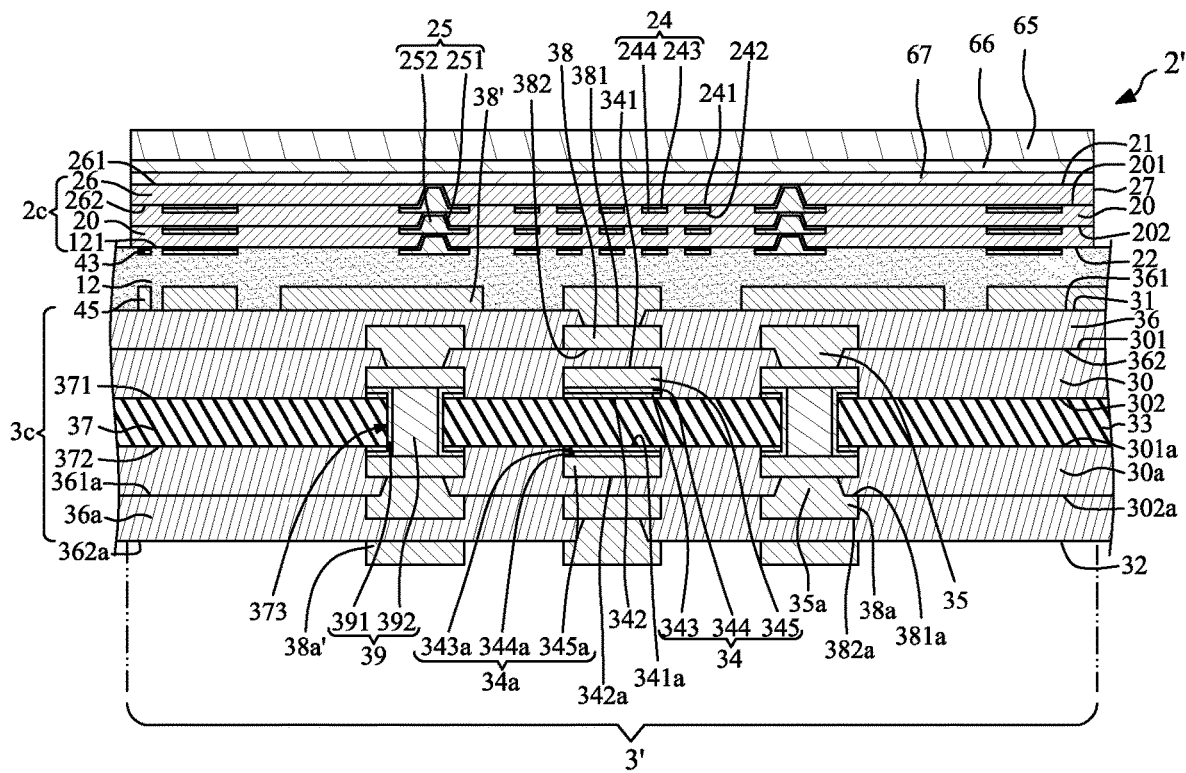
FIG. 56 illustrates one or more stages of an example of a method for manufacturing a wiring structure according to some embodiments of the present disclosure.

Referring to FIG. 56, the strips 2' are attached to the strip areas 3' of the lower conductive structure 3c through the adhesive layer 12. The upper conductive structure 2c faces and is attached to the lower conductive structure 3c. During the attaching process, the fiducial mark 43 of the upper conductive structure 2c is aligned with the fiducial mark 45 of the lower conductive structure 3c, so that the relative position of the upper conductive structure 2c and the lower conductive structure 3c is secured. In some embodiments, known good strip 2' is selectively attached to known good strip area 3' of the lower conductive structure 3c. For example, a desired yield of the wiring structure 1c (FIG. 10) may be set to be 80%. That is, (the yield of the upper conductive structure 2c)×(the yield of the strip area 3' of the lower conductive structure 3c) is set to be greater than or equal to 80%. If a yield of the upper conductive structure 2c (or strip 2') is less than a predetermined yield such as 80% (which is specified as bad or unqualified component), then the bad (or unqualified) upper conductive structure 2c (or strip 2') is discarded. If a yield of the upper conductive structure 2c (or strip 2') is greater than the predetermined yield such as 80% (which is specified as known good or qualified component), then the known good upper conductive structure 2c (or strip 2') can be used. In addition, if a yield of the strip area 3' of the lower conductive structure 3c is less than a predetermined yield such as 80% (which is specified as bad or unqualified component), then the bad (or unqualified) strip area 3' is marked and will not be bonded with any strip 2'. If a yield of the strip area 3' of the lower conductive structure 3c is greater than the predetermined yield such as 80% (which is specified as known good or qualified component), then the known good upper conductive structure 2c (or strip 2') can be bonded to the known good strip area 3' of the lower conductive structure 3c. It is noted that the upper conductive structure 2c (or strip 2') having a yield of 80% will not be bonded to the strip area 3' of the lower conductive structure 3c having a yield of 80%, since the resultant yield of the wiring structure 1c (FIG. 10) is 64%, which is lower than the desired yield of 80%. The upper conductive structure 2c (or strip 2') having a yield of 80% can be bonded to the strip area 3' of the lower conductive structure 3c having a yield of 100%; thus, the resultant yield of the wiring structure 1c (FIG. 10) can be 80%. In addition, the upper conductive structure 2c (or strip 2') having a yield of 90% can be bonded to the strip area 3' of the lower conductive structure 3c having a yield of greater than 90%, since the resultant yield of the wiring structure 1c (FIG. 10) can be greater than 80%.

Figure 57:
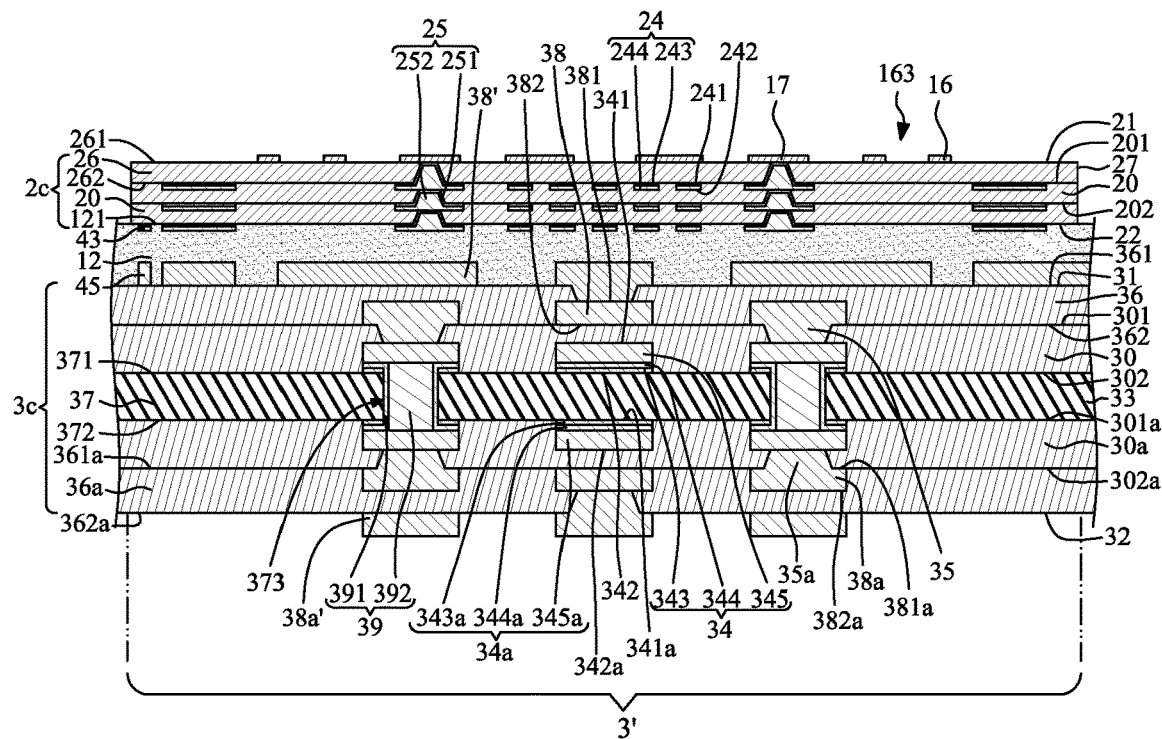
FIG. 57 illustrates one or more stages of an example of a method for manufacturing a wiring structure according to some embodiments of the present disclosure.

Referring to FIG. 57, the adhesive layer 12 is cured to form the intermediate layer 12. Then, the carrier 65, the release layer 66 and the conductive layer 67 are removed. Then, at least one surface trace 17, a surface structure 16, a through hole 163 in the surface structure 16 are formed on the top surface 21 of the upper conductive structure 2. Then, the stages subsequent to that shown in FIG. 57 of the illustrated process are similar to the stages illustrated in FIG. 52 to FIG. 53. Then, the lower conductive structure 3c and the intermediate layer 12 are cut along the strip areas 3', so as to obtain the wiring structure 1c of FIG. 10.

Figure 58:
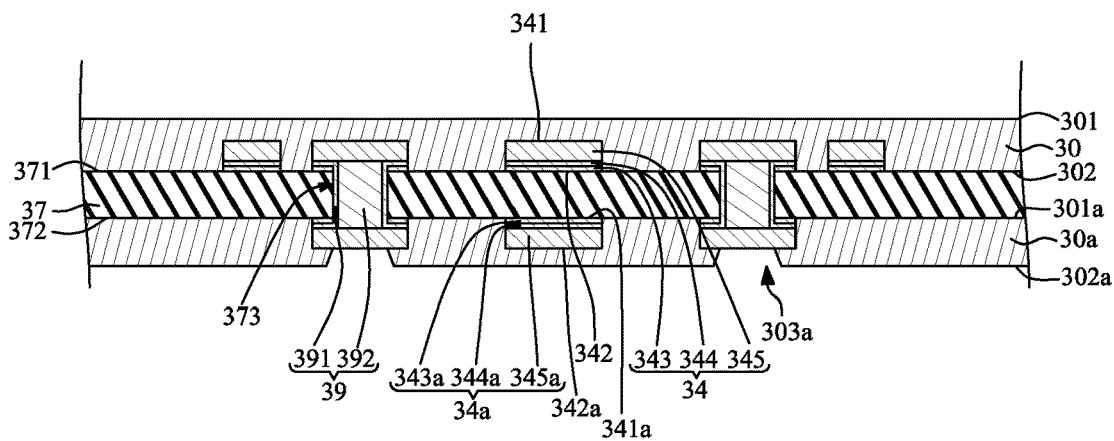
FIG. 58 illustrates one or more stages of an example of a method for manufacturing a wiring structure according to some embodiments of the present disclosure.

FIG. 58 through FIG. 65 illustrate a method for manufacturing a wiring structure according to some embodiments of the present disclosure. In some embodiments, the method is for manufacturing the wiring structure 1e shown in FIG. 12. The initial stages of the illustrated process are the same as, or similar to, the stages illustrated in FIG. 17 to FIG. 25. FIG. 58 depicts a stage subsequent to that depicted in FIG. 25.

Figure 59:
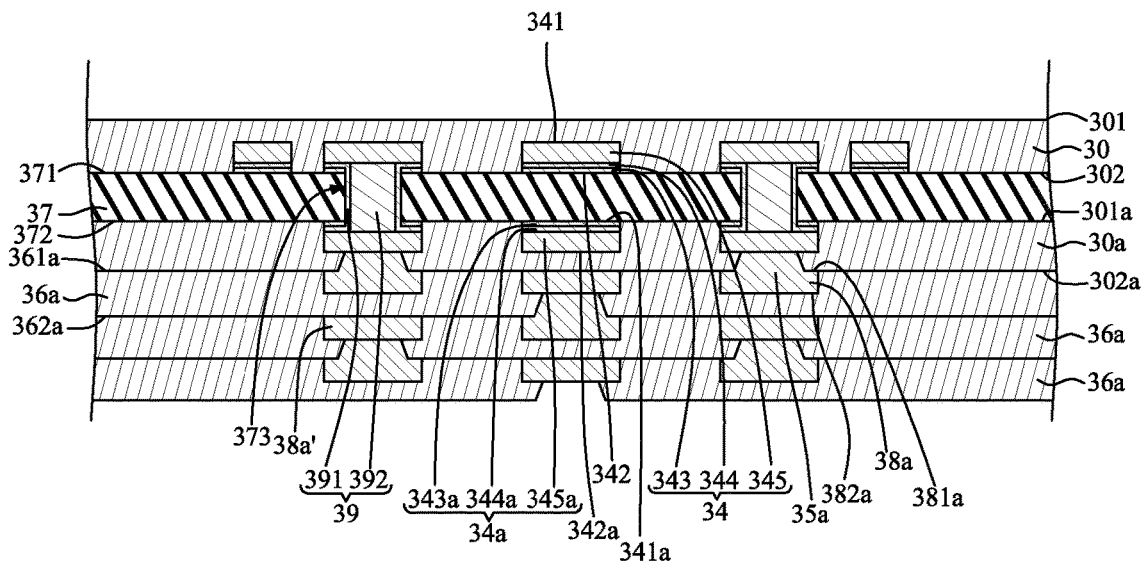
FIG. 59 illustrates one or more stages of an example of a method for manufacturing a wiring structure according to some embodiments of the present disclosure.
Figure 60:
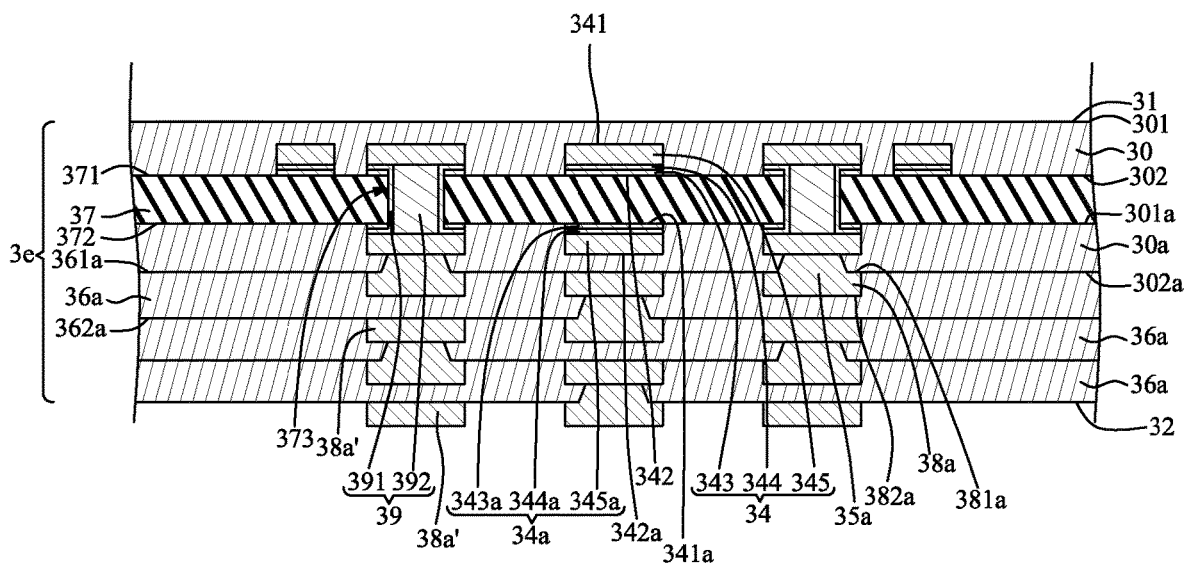
FIG. 60 illustrates one or more stages of an example of a method for manufacturing a wiring structure according to some embodiments of the present disclosure.

Referring to FIG. 58 through FIG. 60, a lower conductive structure 3e is provided. The lower conductive structure 3e is manufactured as follows. Referring to FIG. 58, at least one through hole 303a is formed to extend through the first lower dielectric layer 30a to expose a portion of the first lower circuit layer 34a by a drilling technique or other suitable techniques. It is noted that no through hole is formed in the first upper dielectric layer 30.

Referring to FIG. 59, a second lower circuit layer 38a is formed or disposed on the first lower dielectric layer 30a. Then, three second lower dielectric layers 36a and two second lower circuit layers 38a' are formed or disposed on the first lower dielectric layer 30a.

Referring to FIG. 60, a bottommost lower circuit layer 38a' is formed or disposed on the bottommost second lower dielectric layer 36a, so as to obtain the lower conductive structure 3e. In the lower conductive structure 3e, the top surface 31 of the lower conductive structure 3e is the top surface 301 of first upper dielectric layer 30, which is substantially flat.

Figure 61:
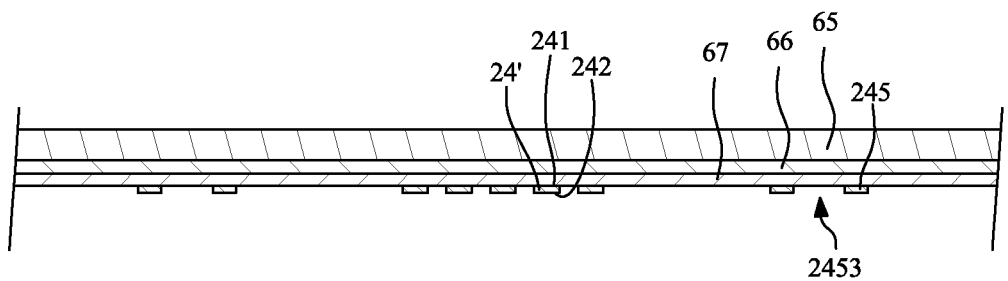
FIG. 61 illustrates one or more stages of an example of a method for manufacturing a wiring structure according to some embodiments of the present disclosure.

Referring to FIG. 61 through FIG. 64, an upper conductive structure 2e is provided. The upper conductive structure 2e is manufactured as follows. Referring to FIG. 61, a carrier 65 is provided. A release layer 66 is coated on the bottom surface of the carrier 65. A conductive layer 67 (e.g., a seed layer) is formed or disposed on the release layer 66 by a PVD technique or other suitable techniques. Then, a topmost circuit layer 24' is formed on the conductive layer 67. The topmost circuit layer 24' includes a pad portion 245 serving as a mask (or a sacrificial layer) during a laser drilling process. The pad portion 245 defines a through hole 2453 that is formed by lithography (e.g., exposure and development) rather than drilling.

Figure 62:
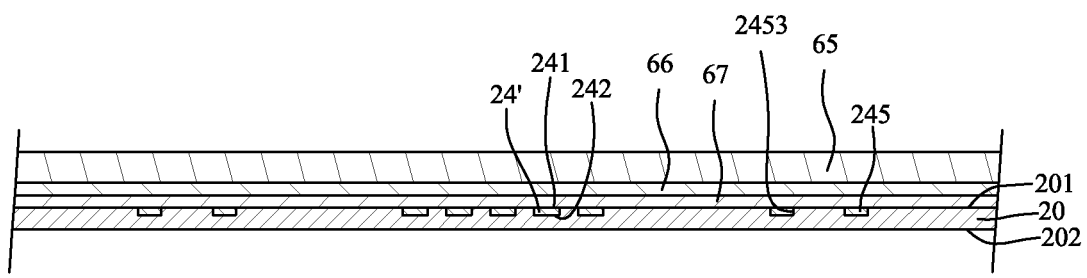
FIG. 62 illustrates one or more stages of an example of a method for manufacturing a wiring structure according to some embodiments of the present disclosure.

Referring to FIG. 62, a topmost first dielectric layer 20 is formed on the conductive layer 67 by a coating technique or other suitable techniques, to cover the topmost circuit layer 24'.

Figure 63:
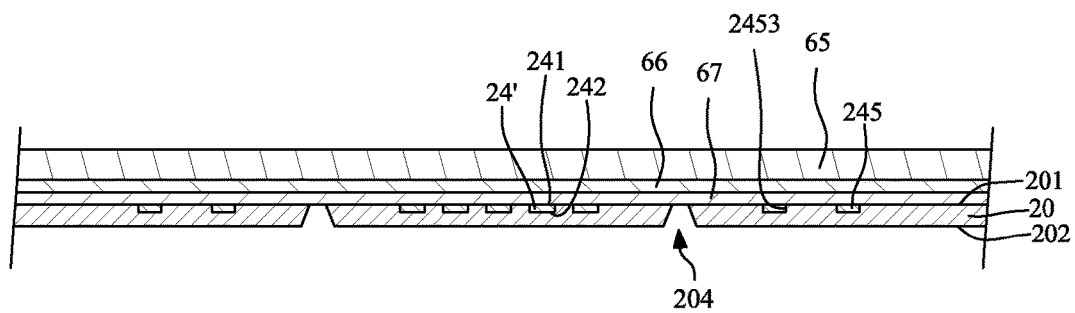
FIG. 63 illustrates one or more stages of an example of a method for manufacturing a wiring structure according to some embodiments of the present disclosure.

Referring to FIG. 63, at least one through hole 204 is formed to extend through the topmost first dielectric layer 20 to expose a portion of the conductive layer 67 by an exposure and development technique or other suitable techniques.

Figure 64:
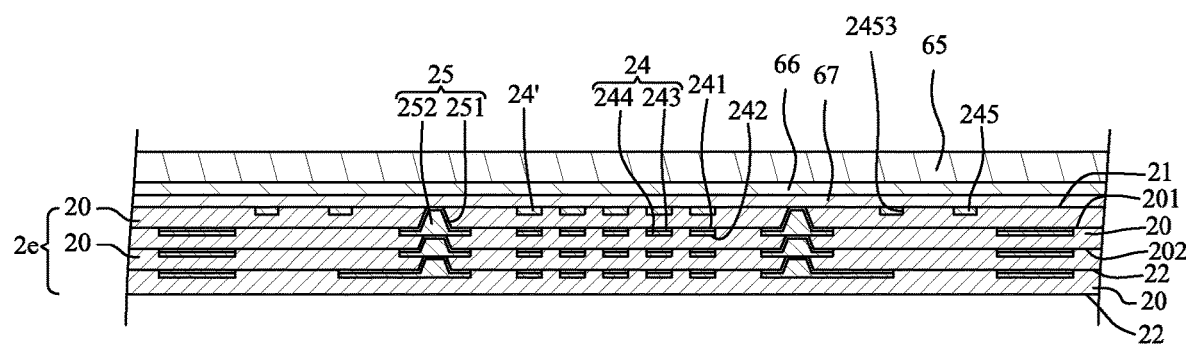
FIG. 64 illustrates one or more stages of an example of a method for manufacturing a wiring structure according to some embodiments of the present disclosure.

Referring to FIG. 64, a plurality of first dielectric layers 20, a plurality of circuit layers 24 and a plurality of inner vias 25 are formed on the topmost first dielectric layer 20, so as to obtain the upper conductive structure 2e. As shown in FIG. 64, the bottommost first dielectric layer 20 may cover the bottommost circuit layer 24. Thus, the entire bottom surface 22 of the upper conductive structure 2e (e.g., the bottom surface 202 of the bottommost first dielectric layer 20) is substantially flat.

Figure 65:
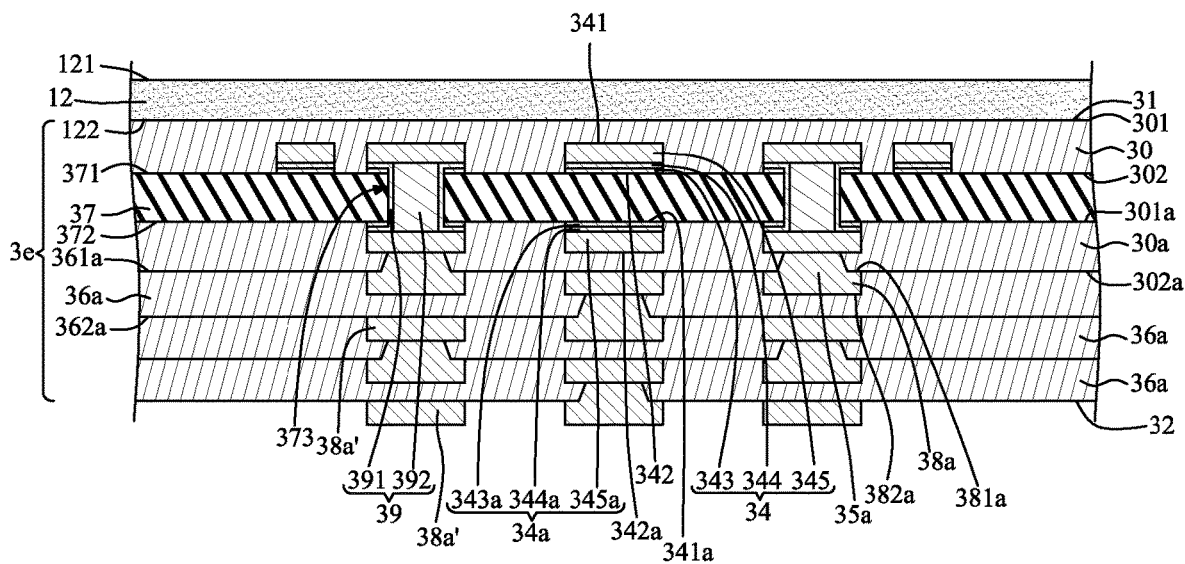
FIG. 65 illustrates one or more stages of an example of a method for manufacturing a wiring structure according to some embodiments of the present disclosure.

Referring to FIG. 65, an adhesive layer 12 is formed or applied on the top surface 31 of the lower conductive structure 3e.

Figure 66:
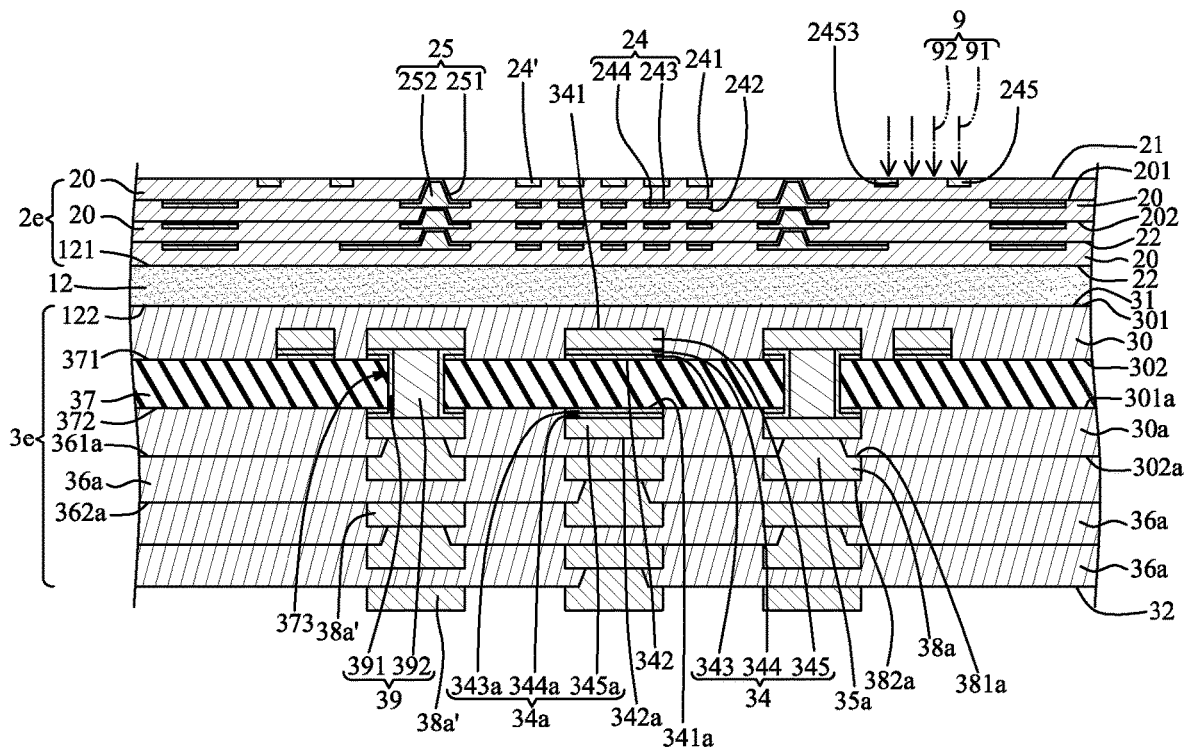
FIG. 66 illustrates one or more stages of an example of a method for manufacturing a wiring structure according to some embodiments of the present disclosure.

Referring to FIG. 66, a laser beam 9 is applied to the pad portion 245 and the top surface 21 of the upper conductive structure 2e. A first portion 91 of the laser beam 9 is blocked by a solid portion of the pad portion 245, and a second portion 92 of the laser beam 9 passes through the through hole 2453 of the pad portion 245 to form a through hole 23 in the upper conductive structure 2e and the intermediate layer 12 to expose the circuit layer (e.g., the first upper circuit layer 34) of the lower conductive structure 3e.

Then, the following stages of the illustrated process are the same as, or similar to, the stage illustrated in FIG. 53, so as to obtain the wiring structure 1e of FIG. 12.

Figure 67:
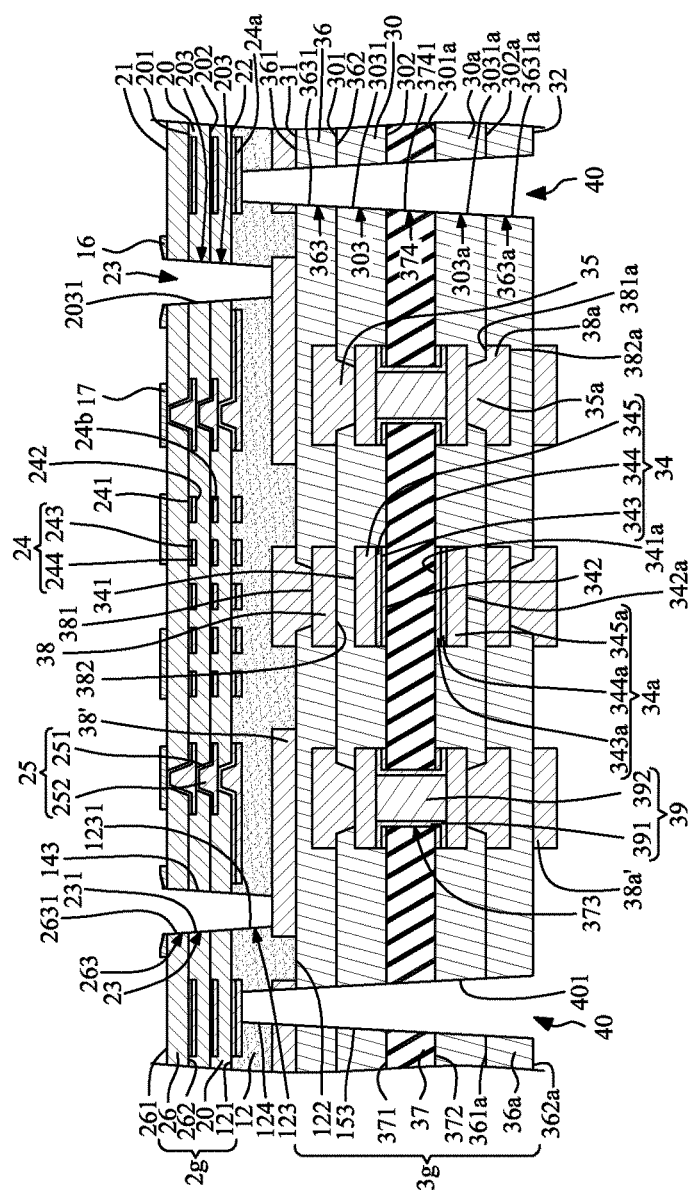
FIG. 67 illustrates one or more stages of an example of a method for manufacturing a wiring structure according to some embodiments of the present disclosure.

FIG. 67 illustrates a method for manufacturing a wiring structure according to some embodiments of the present disclosure. In some embodiments, the method is for manufacturing the wiring structure 1g shown in FIG. 15. The initial stages of the illustrated process are the same as, or similar to, the stages illustrated in FIG. 17 to FIG. 53. FIG. 67 depicts a stage subsequent to that depicted in FIG. 53. Referring to FIG. 67, at least one through hole 40 is further formed to extend through at least a portion of the lower conductive structure 3g and the intermediate layer 12 by drilling (such as laser drilling) to exposes a circuit layer (e.g., the first circuit layer 24a) of the upper conductive structure 2g. In some embodiments, the through hole 40 extends through the topmost circuit layer (e.g., the second upper circuit layer 38') of the lower conductive structure 3g and terminates at or on the bottommost circuit layer 24a (e.g., the first circuit layer 24a) of the upper conductive structure 2g. As shown in FIG. 67, the through hole 40 tapers upwardly; that is, a size of a top portion of the through hole 40 is smaller than a size of a bottom portion of the through hole 40. Then, a metallic layer is formed in the through hole 23 to form at least one upper through via 14 in the through hole 23, and a metallic layer is formed in the through hole 40 to form at least one lower through via 15 in the through hole 40 by a plating technique or other suitable techniques, so as to obtain the wiring structure 1g of FIG. 15.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
    a low-density stacked structure including at least one dielectric layer and at least one low-density circuit layer in contact with the dielectric layer;
    a high-density stacked structure disposed on the low-density stacked structure, wherein the high-density stacked structure includes at least one dielectric layer and at least one high-density circuit layer in contact with the dielectric layer of the high-density stacked structure;
    a surface structure disposed on a top surface of the high-density stacked structure; and
    at least one upper through via extending through the surface structure and the high-density stacked structure, and terminating on the low-density circuit layer of the low-density stacked structure, wherein the high-density stacked structure comprises a first circuit layer and a second circuit layer on the first circuit layer, and wherein a diameter of a through hole defined by the first circuit layer is less than a diameter of a through hole defined by the second circuit layer, and wherein the upper through via includes a plurality of sections, wherein one of the sections is disposed between the first circuit layer and the second circuit layer, and the one of the sections includes a top portion adjacent to the second circuit layer, a bottom portion adjacent to the first circuit layer and a middle portion between the top portion and the bottom portion, wherein a width of the middle portion is greater than a width of the top portion, and a width of the middle portion is greater than a width of the bottom portion.

2. The wiring structure of claim 1, wherein a length of the upper through via is greater than a thickness of the high-density stacked structure.

3. The wiring structure of claim 1, wherein a lateral surface of the low-density stacked structure is displaced from a lateral surface of the high-density stacked structure.

4. The wiring structure of claim 1, further comprising:
    a top low-density circuit layer disposed on the surface structure and the top surface of the high-density stacked structure.

5. The wiring structure of claim 4, wherein a line space of the top low-density circuit layer is substantially equal to a line space of the low-density circuit layer of the low-density stacked structure.

6. The wiring structure of claim 4, wherein the top low-density circuit layer and the upper through via are formed integrally.

7. The wiring structure of claim 1, further comprising:
an intermediate layer disposed between the low-density stacked structure and the high-density stacked structure, wherein the upper through via further extends through the intermediate layer.

8. The wiring structure of claim 7, wherein the low-density circuit layer is a topmost low-density circuit layer of the low-density stacked structure, the high-density circuit layer is a bottommost high-density circuit layer of the high-density stacked structure, and the topmost low-density circuit layer of the low-density stacked structure and the bottommost high-density circuit layer of the high-density stacked structure are embedded in the intermediate layer.

9. The wiring structure of claim 1, further comprising:
at least one lower through via extending through at least a portion of the low-density stacked structure, and terminating on the high-density circuit layer of the high-density stacked structure.

10. The wiring structure of claim 9, wherein a size of an end portion of the upper through via is substantially equal to a size of an end portion of the lower through via.

11. The wiring structure of claim 1, wherein the upper through via is disposed in a low-density region of the high-density stacked structure.

12. The wiring structure of claim 1, wherein the through hole defined by the first circuit layer is substantially aligned to the through hole defined by the second circuit layer.

13. The wiring structure of claim 1, wherein the through hole defined by the first circuit layer is displaced from the through hole defined by the second circuit layer.

14. The wiring structure of claim 1, wherein a portion of the dielectric layer of the high-density stacked structure extends into a space between a peripheral surface of the upper through via and an inner surface of the through hole defined by the second circuit layer.

15. The wiring structure of claim 1, wherein the high-density circuit layer of the high-density stacked structure includes one or more high-density traces and a ground plane.

16. The wiring structure of claim 1, wherein the low-density stacked structure includes a plurality of low-density circuit layers including the low-density circuit layer, and at least one of the low-density circuit layers of the low-density stacked structure includes one or more low-density traces and a ground plane.

17. The wiring structure of claim 1, wherein the high-density stacked structure includes a fiducial mark, the low-density stacked structure includes a fiducial mark, and the fiducial mark of the high-density stacked structure is aligned with the fiducial mark of the low-density stacked structure.

* * * * *